(12) United States Patent  
Elam et al.

(10) Patent No.: US 9,105,379 B2  
(45) Date of Patent: Aug. 11, 2015

(54) TUNABLE RESISTANCE COATINGS

(71) Applicant: UChicago Argonne LLC, Argonne, IL (US)

(72) Inventors: Jeffrey W. Elam, Elmhurst, IL (US); Anil U. Mane, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 147 days.

(21) Appl. No.: 13/804,660

(22) Filed: Mar. 14, 2013

(65) Prior Publication Data

US 2013/0280546 A1 Oct. 24, 2013

Related U.S. Application Data

(63) Continuation-in-part of application No. 13/525,067, filed on Jun. 15, 2012, which is a continuation-in-part of application No. 13/011,645, filed on Jan. 21, 2011.

(51) Int. Cl.
| | |
|---|---|
| *G01T 3/00* | (2006.01) |
| *H01C 17/06* | (2006.01) |
| *C23C 16/30* | (2006.01) |
| *C23C 16/455* | (2006.01) |
| *H01C 17/08* | (2006.01) |
| *H01C 17/12* | (2006.01) |

(52) U.S. Cl.
CPC ................ *H01C 17/06* (2013.01); *C23C 16/30* (2013.01); *C23C 16/45529* (2013.01); *C23C 16/45531* (2013.01); *H01C 17/08* (2013.01); *H01C 17/12* (2013.01)

(58) Field of Classification Search
CPC .................................. H01B 1/14; H01C 17/06
USPC ....................................................... 250/390.01
See application file for complete search history.

(56) References Cited

U.S. PATENT DOCUMENTS

| | | | |
|---|---|---|---|
| 3,673,457 | A | 6/1972 | Sackinger et al. |
| 3,739,216 | A | 6/1973 | Pakswer |
| 4,051,403 | A | 9/1977 | Feingold et al. |
| 4,625,106 | A | 11/1986 | Bender et al. |
| 4,757,229 | A | 7/1988 | Schmidt et al. |
| 5,068,634 | A | 11/1991 | Shrier |

(Continued)

FOREIGN PATENT DOCUMENTS

| | | |
|---|---|---|
| JP | 2007-277105 A | 10/2007 |
| WO | WO-2012/099658 A2 | 7/2012 |

OTHER PUBLICATIONS

Non-Final Office action dated Oct. 10, 2014 for U.S. Appl. No. 13/525,067, 9 pages.

(Continued)

*Primary Examiner* — David Porta  
*Assistant Examiner* — Edwin Gunberg  
(74) *Attorney, Agent, or Firm* — Foley & Lardner LLP

(57) ABSTRACT

A method and article of manufacture of intermixed tunable resistance composite materials containing at least one of $W:Al_2O_3$, $Mo:Al_2O_3$ or $M:Al_2O_3$ where M is a conducting compound containing either W or Mo. A conducting material and an insulating material are deposited by such methods as ALD or CVD to construct composites with intermixed materials which do not have structure or properties like their bulk counterparts.

21 Claims, 68 Drawing Sheets

(56) References Cited

U.S. PATENT DOCUMENTS

| | | | |
|---|---|---|---|
| 5,086,248 | A | 2/1992 | Horton et al. |
| 5,216,249 | A | 6/1993 | Jones et al. |
| 5,334,840 | A | 8/1994 | Newacheck et al. |
| 5,402,034 | A | 3/1995 | Blouch et al. |
| 5,726,076 | A | 3/1998 | Tasker et al. |
| 6,200,893 | B1 | 3/2001 | Sneh |
| 6,420,279 | B1 | 7/2002 | Ono et al. |
| 6,479,826 | B1 | 11/2002 | Klann et al. |
| 6,495,837 | B2 | 12/2002 | Odom et al. |
| 6,503,330 | B1 | 1/2003 | Sneh et al. |
| 6,545,281 | B1 | 4/2003 | McGregor et al. |
| 6,585,823 | B1 | 7/2003 | Van Wijck |
| 6,876,711 | B2 | 4/2005 | Wallace et al. |
| 7,164,138 | B2 | 1/2007 | McGregor et al. |
| 7,233,007 | B2 | 6/2007 | Downing et al. |
| 7,335,594 | B1 | 2/2008 | Wang et al. |
| 7,595,270 | B2 | 9/2009 | Elers et al. |
| 7,759,138 | B2 | 7/2010 | Beaulieu et al. |
| 8,101,480 | B1 | 1/2012 | Kim et al. |
| 2007/0131849 | A1 | 6/2007 | Beaulieu et al. |
| 2009/0212680 | A1 | 8/2009 | Tremsin et al. |
| 2009/0215211 | A1 | 8/2009 | Tremsin et al. |
| 2009/0315443 | A1 | 12/2009 | Sullivan et al. |
| 2010/0044577 | A1 | 2/2010 | Sullivan et al. |
| 2011/0135842 | A1* | 6/2011 | Faguet et al. ............ 427/569 |
| 2012/0187305 | A1 | 7/2012 | Elam et al. |

OTHER PUBLICATIONS

George, S., "Fabrication and Priorities of Nanolaminates Using Self-Limiting Surface Chemistry Techniques", Dept. of Chemistry and Biochemistry, Dept. of Chemical Engineering, Nov. 2002, 20 pages.

Elam et al., "Properties of ZnO/Al2O3 Allow Films Grown Using Atomic Layer Deposition Techniques", *Journal of the Electrochemical Society*, (2003), pp. G339-G347, 150 (6), The Electrochemical Society, Inc., USA.

PCT/US2011/064593, International Search Report, Jul. 11, 2012.

Faubert, G. et al., "Activation and charactterization of Fe-based catalysts for the reduction of oxygen in polymer electrolyte fuel cells", Electrochimica Acta, vol. 43, Nos. 14-15, 1998, pp. 1969-1984.

Jaouen, F. et al., "Cross-Laboratory Experimental Study of Non-Noble-Metal Electrocatalysts for the Oxygen Reduction Reaction", Applied Materials and Interfaces, vol. 1, No. 8, 2009, pp. 1623-1639.

Lefevre, M. & Dodelet, J., "Fe-based catyalysts for the reduction of oxygen in polymer electrolyte membrane fuel cell conditions: determination of the amount of peroxide released during electroreduction and its influence on the stablity of the catalysts", Electrochimica Acta, vol. 48, 2003, pp. 2749-2760.

Lefevre, M. et al., "Iron-Based Catalysts with Imporved Oxygen Reduction Activity in Polymer Electrolyte Fuel Cells", Science, vol. 324, 2009, pp. 71-74.

Ma, S. et al., "Cobal Imidazolate Framework as Precursor for Oxygen Reduction Reaction Electroatalysts", Chem. Eur. J., vol. 17, 2011, pp. 2063-2067.

Wu, G. et al., "High-Performance Electrocatalysts for Oxygen Reduction Derived from Polyaniline, Iron, and Cobalt", Science, vol. 332, 2011, pp. 443-447.

Non-Final Office Action on U.S. Appl. No. 13/011,645 dated Nov. 19, 2012, 19 pages.

Final Office Action on U.S. Appl. No. 13/011,645 dated Jun. 10, 2013, 18 pages.

Non-Final Office Action on U.S. Appl. No. 13/011,645 dated Dec. 24, 2013, 19 pages.

Final Office Action on U.S. Appl. No. 13/011,645 dated Jul. 24, 2014, 14 pages.

U.S. Notice of Allowance for U.S. Appl. No. 13/525,067 dated Jun. 6, 2014, 10 pages.

Notice of Allowance for U.S. Appl. No. 13/011,645 dated Oct. 1, 2014, 7 pages.

* cited by examiner

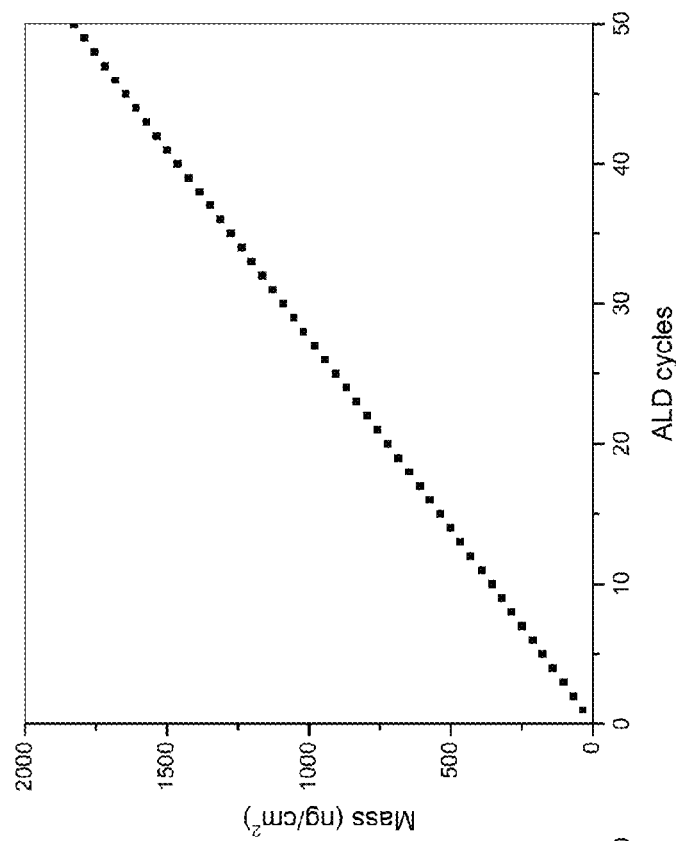
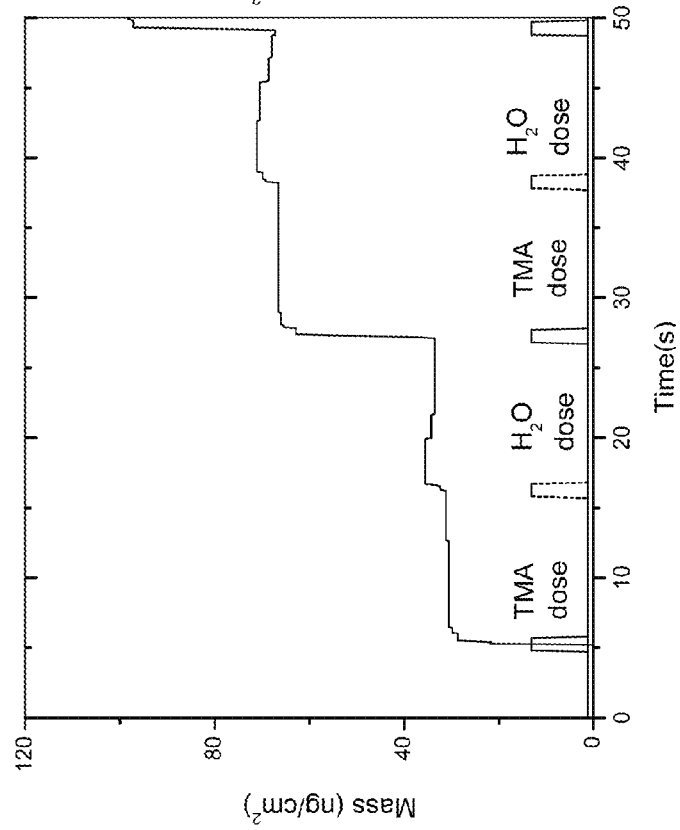
FIGS. 2(b)
FIGS. 2(a)

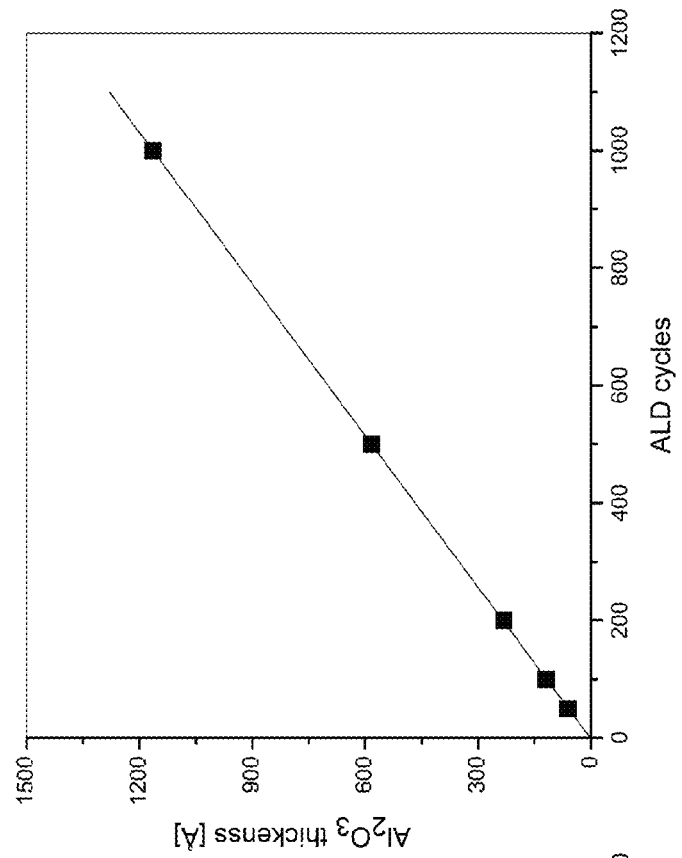
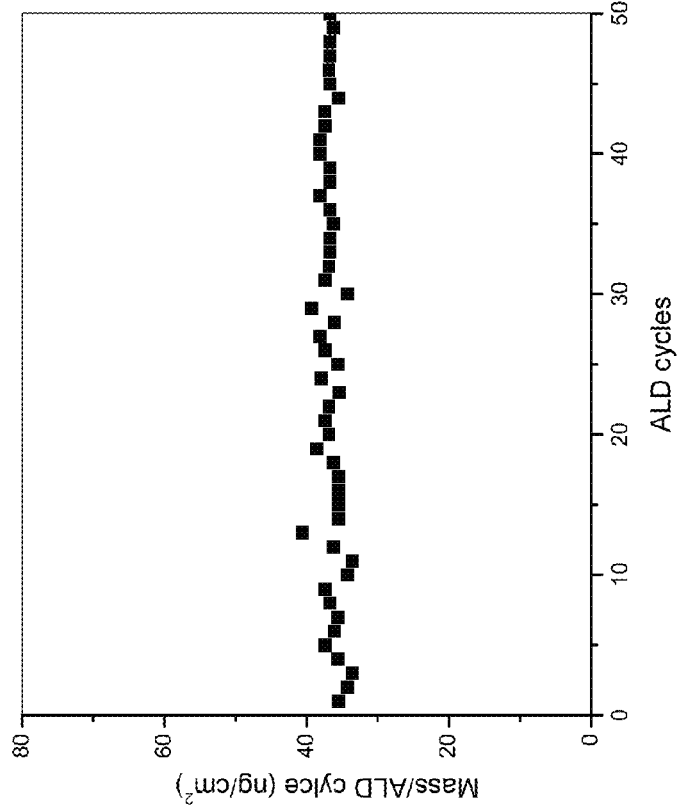
FIGS. 2(d)
FIGS. 2(c)

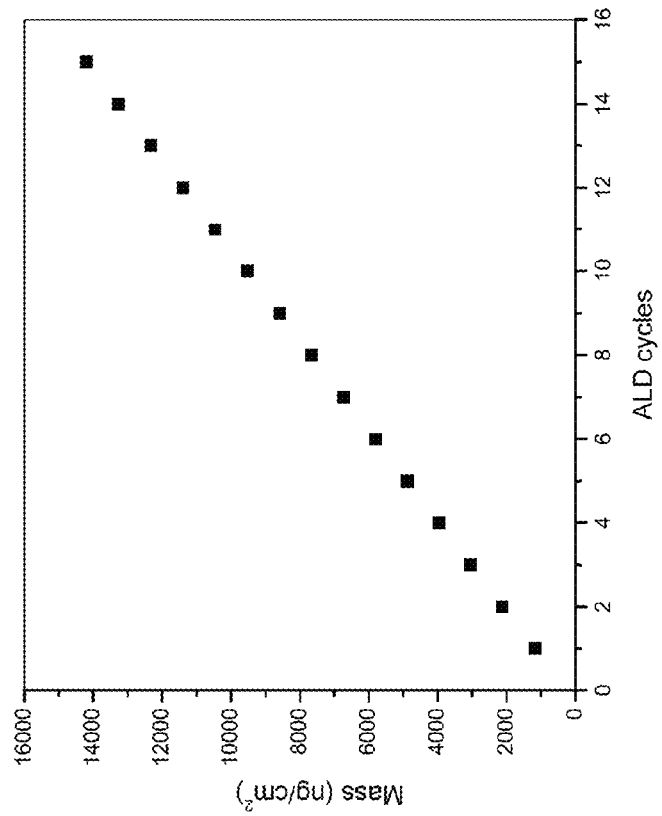
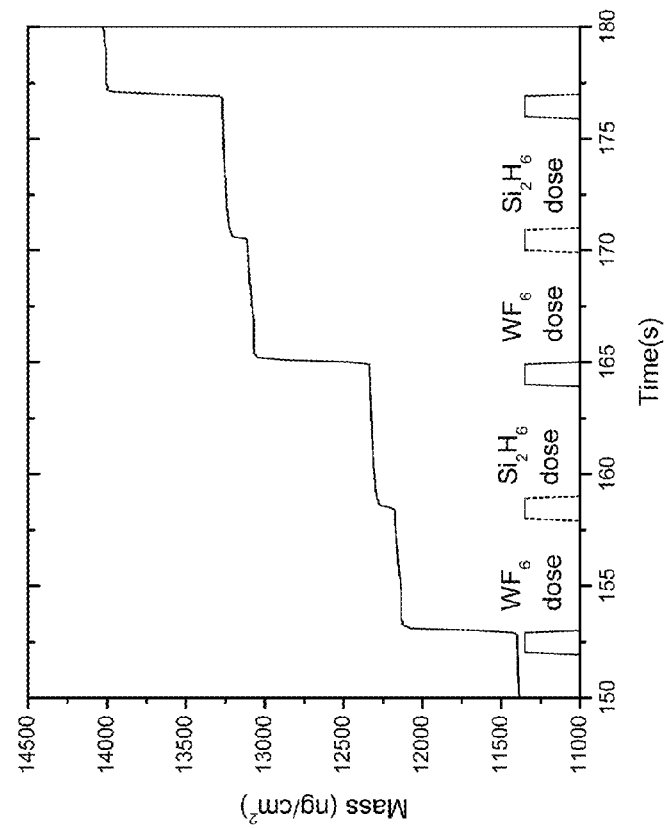
FIGS 3(b)
FIGS. 3(a)

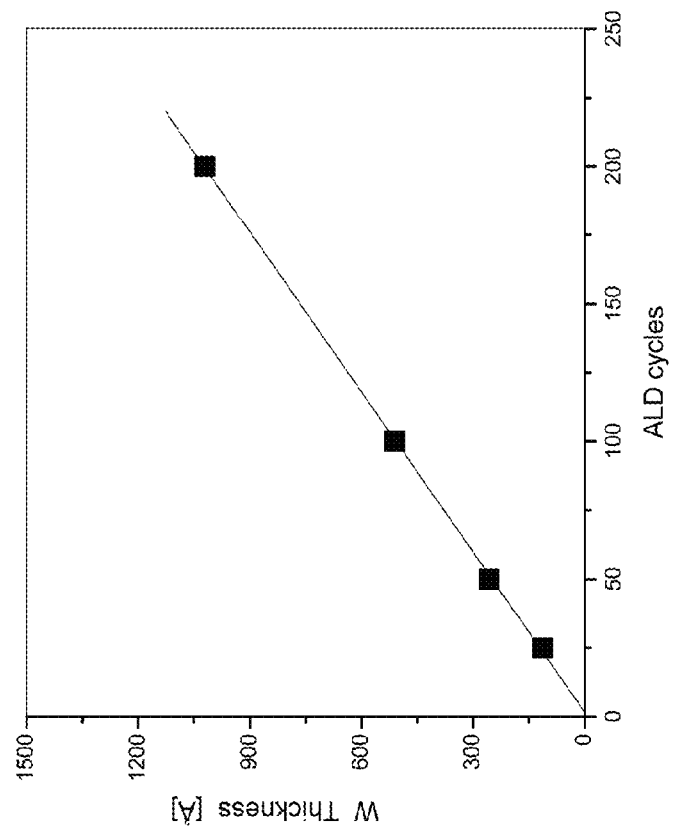
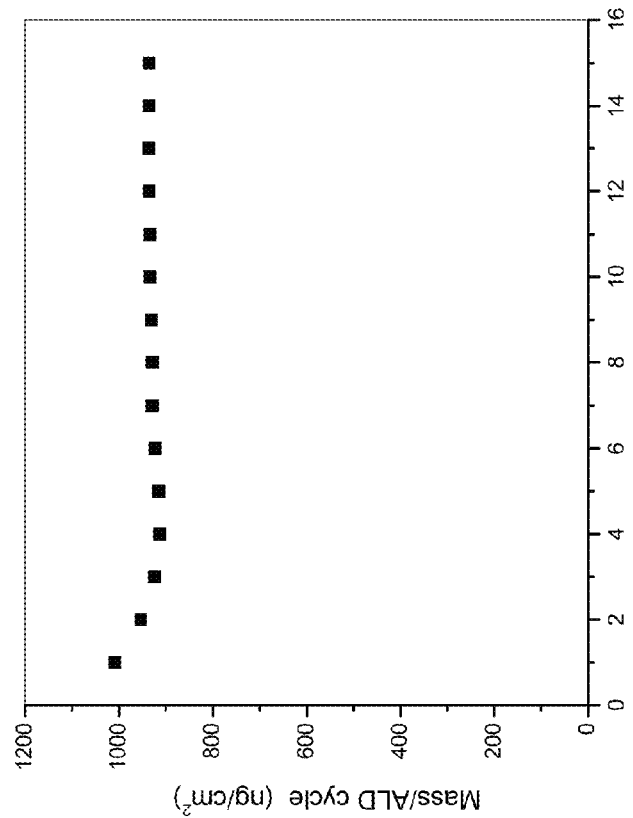
FIGS 3(d)
FIGS. 3(c)

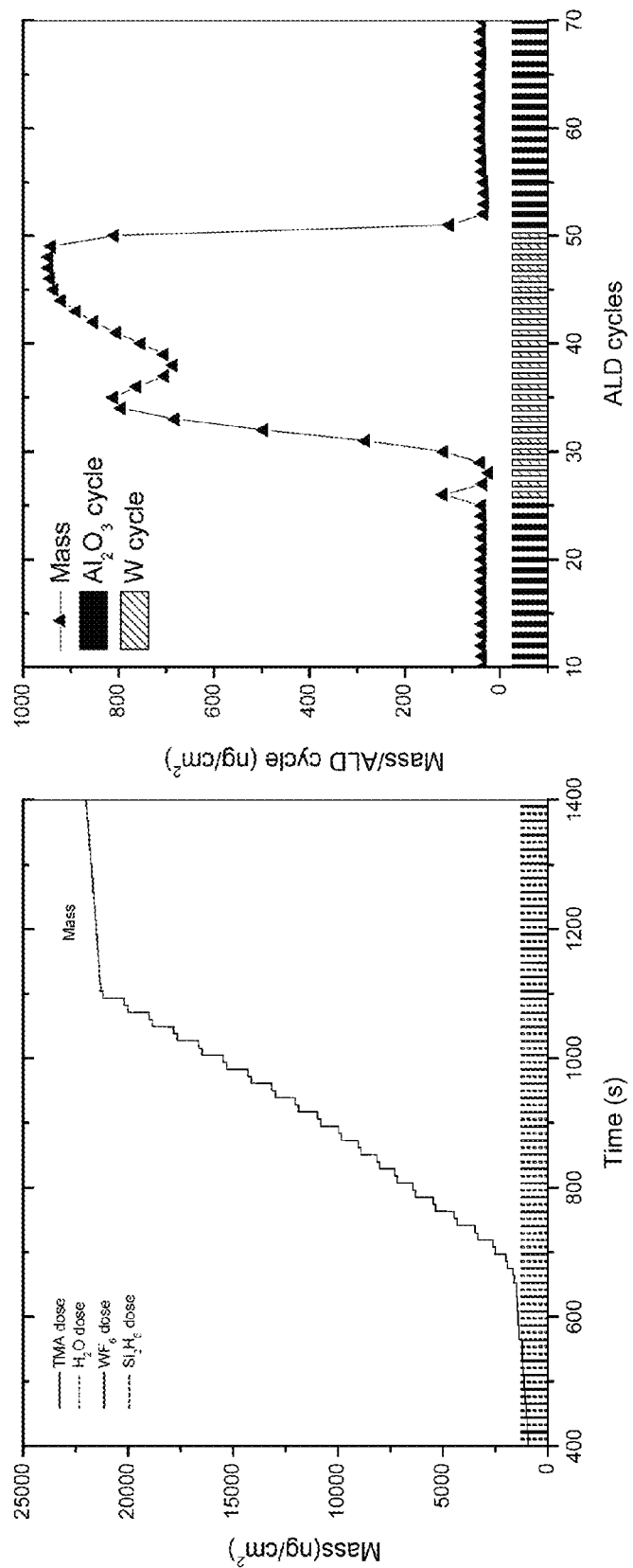

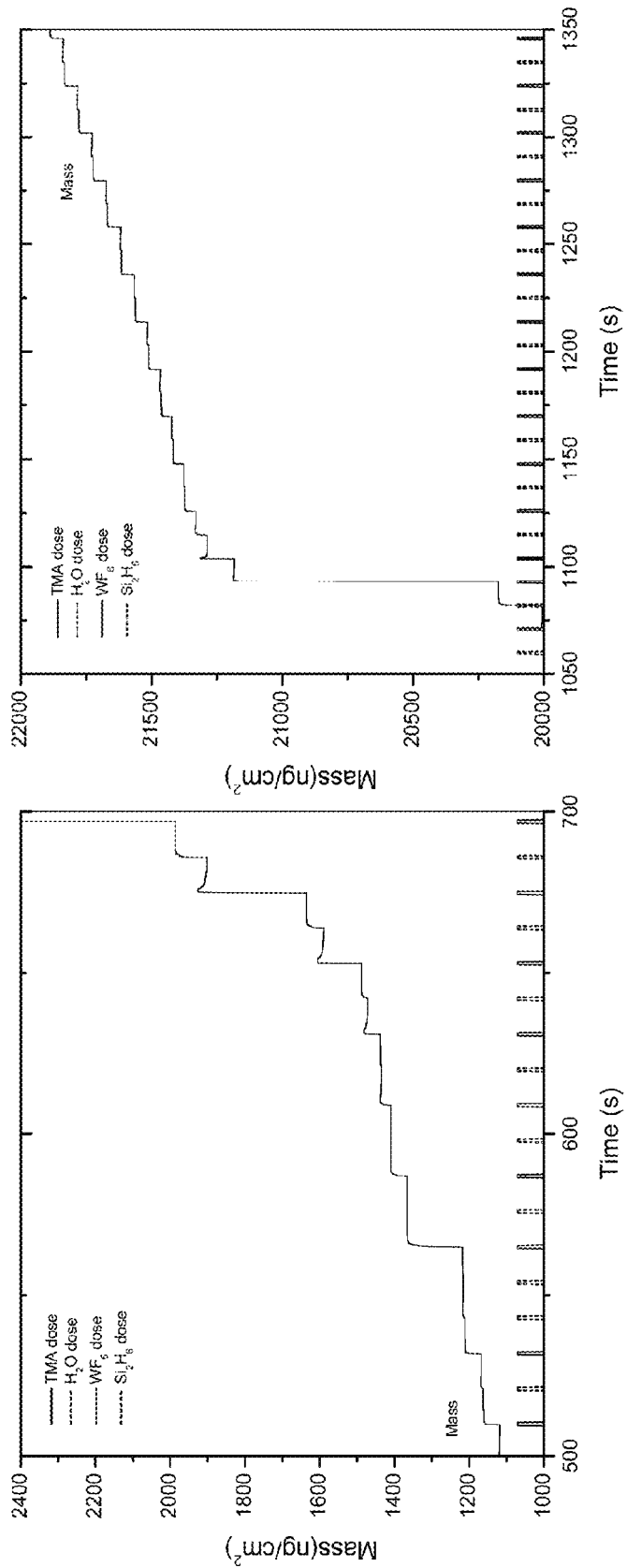

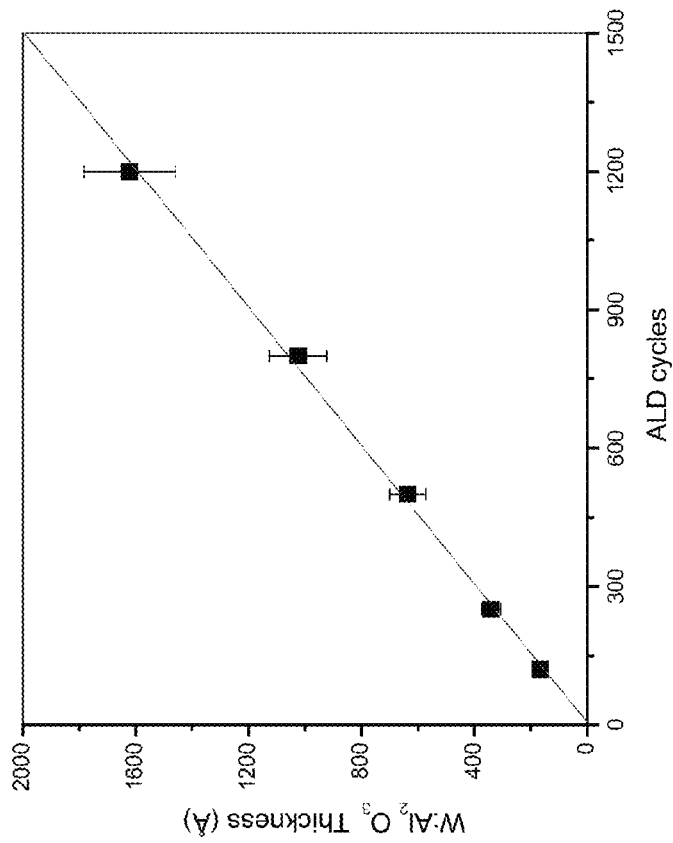
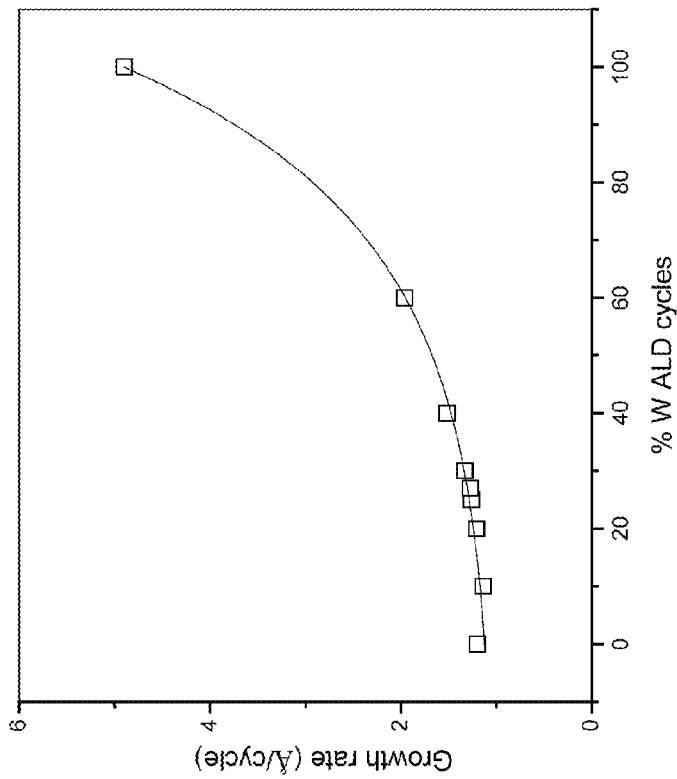
FIG. 8(b)
FIG. 8(a)

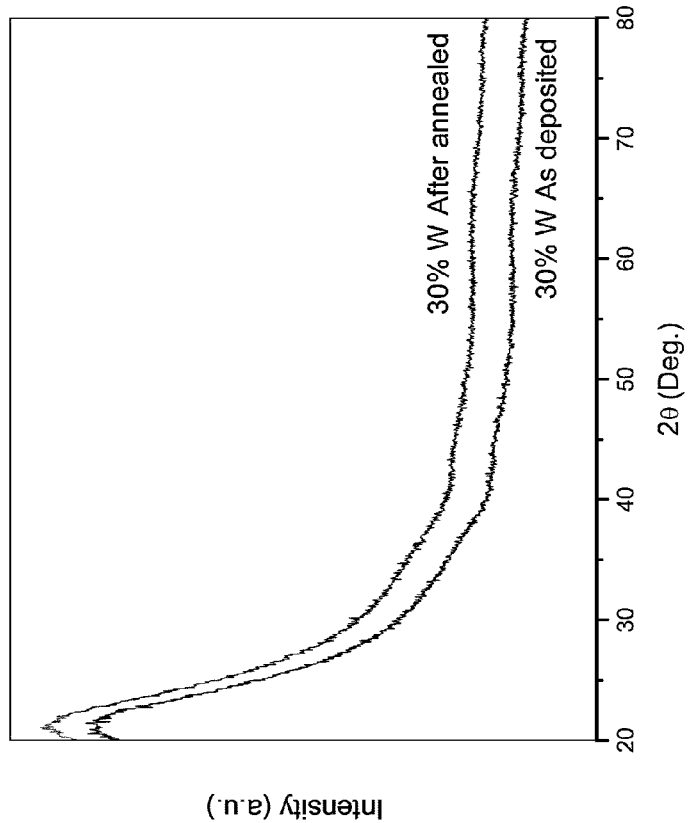
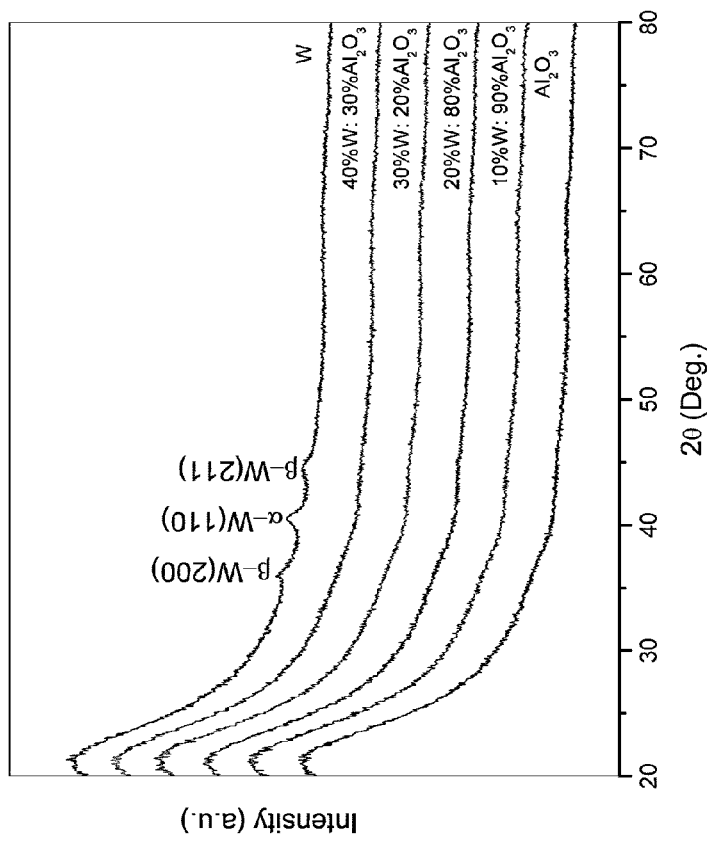
FIG. 9(b)
FIG. 9(a)

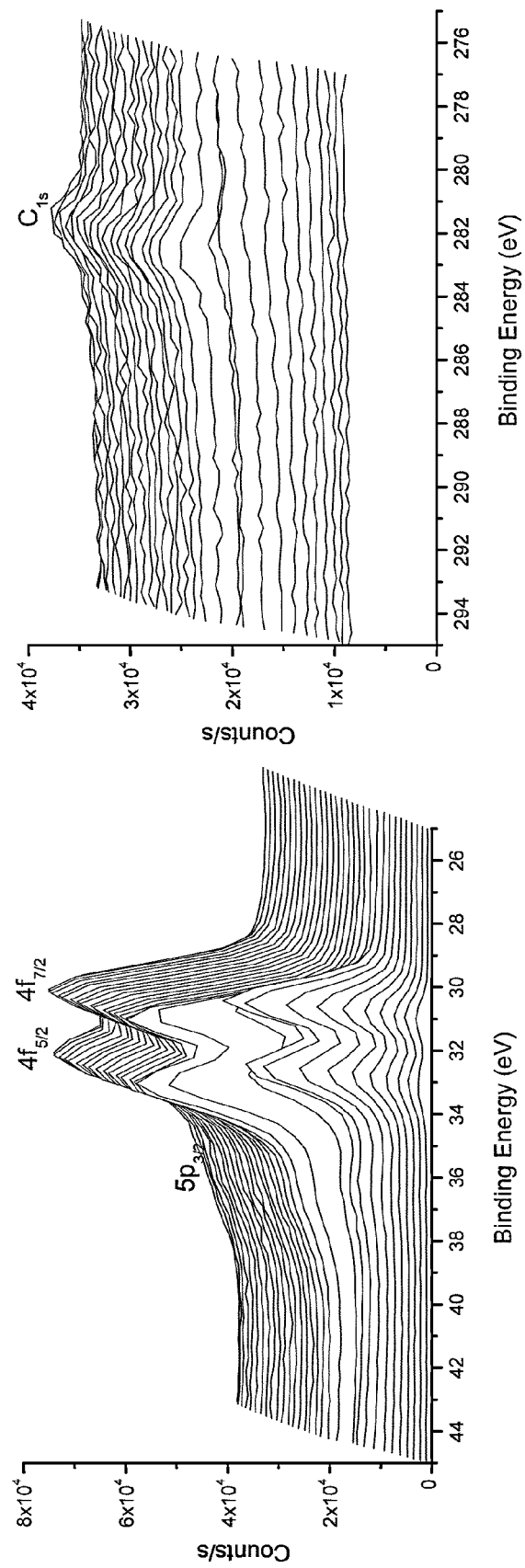

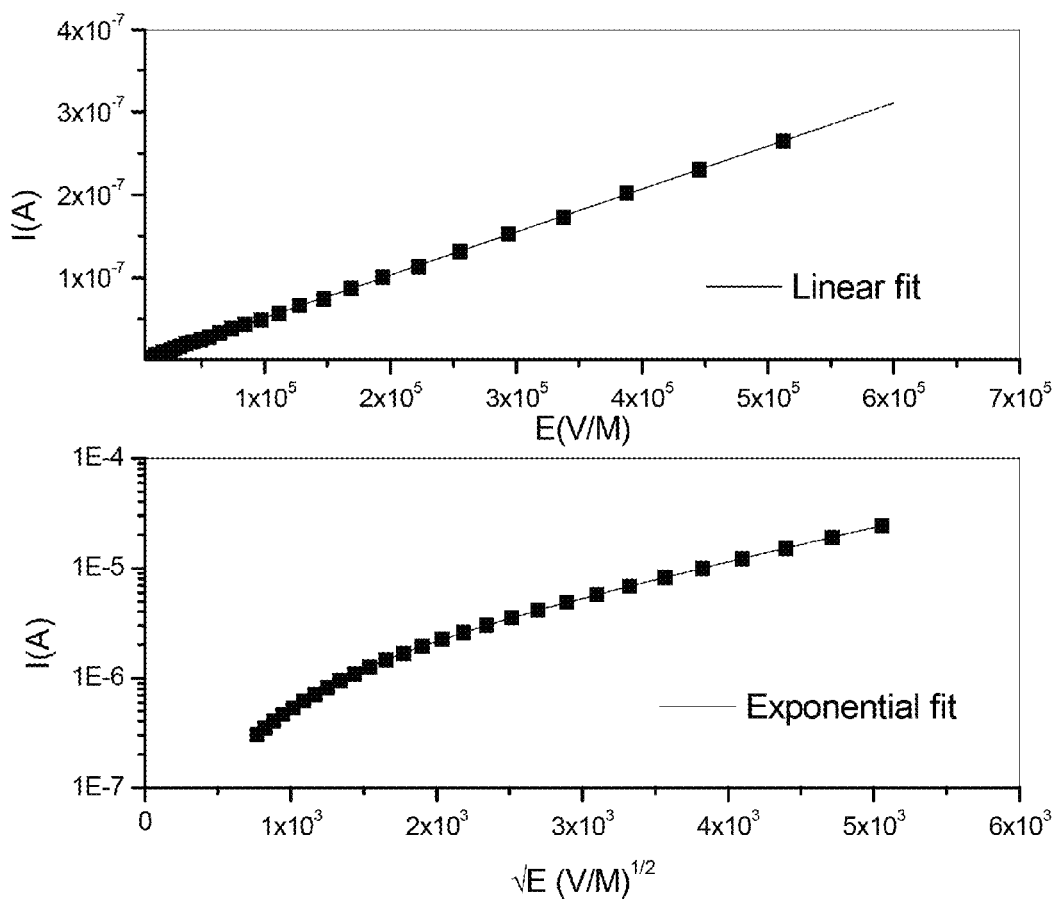
FIG. 20(d)(1)
FIG. 20(d)(2)

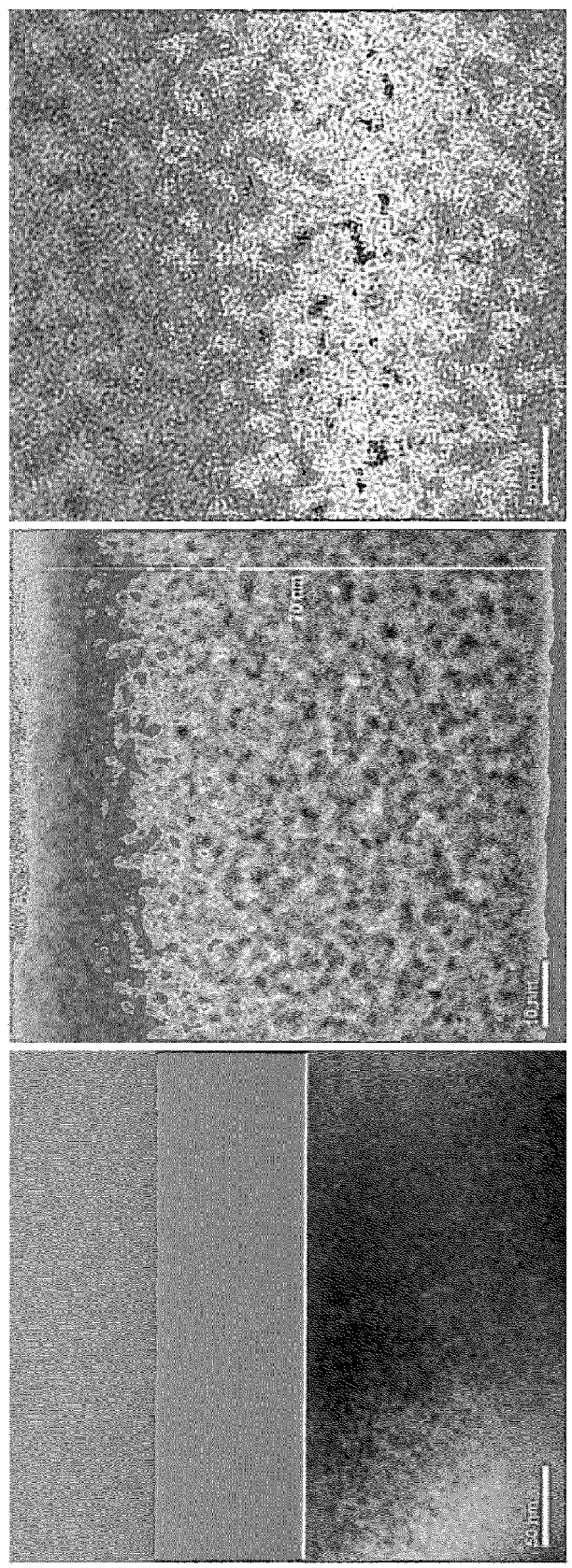

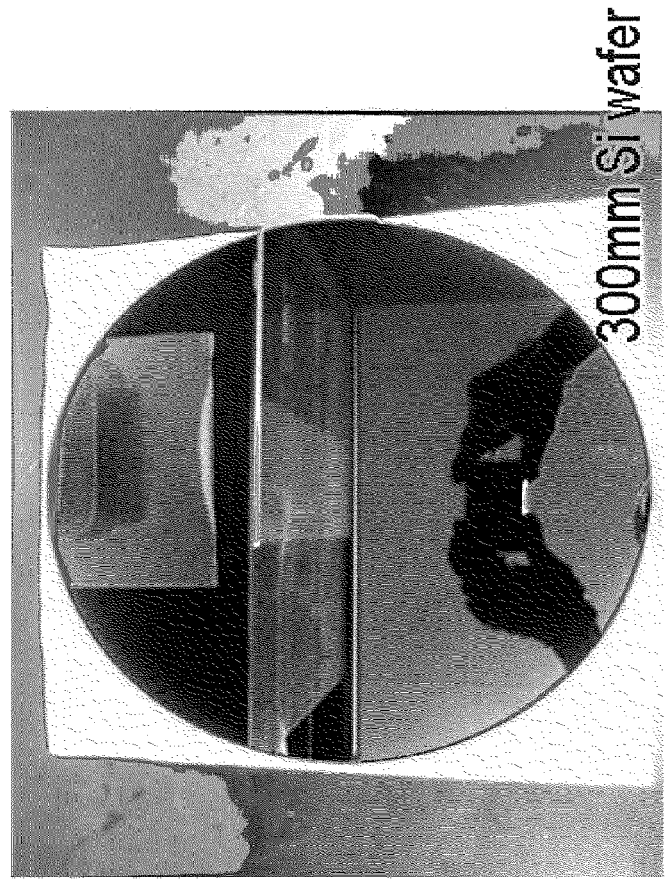
FIG. 26(b) 300mm Si wafer
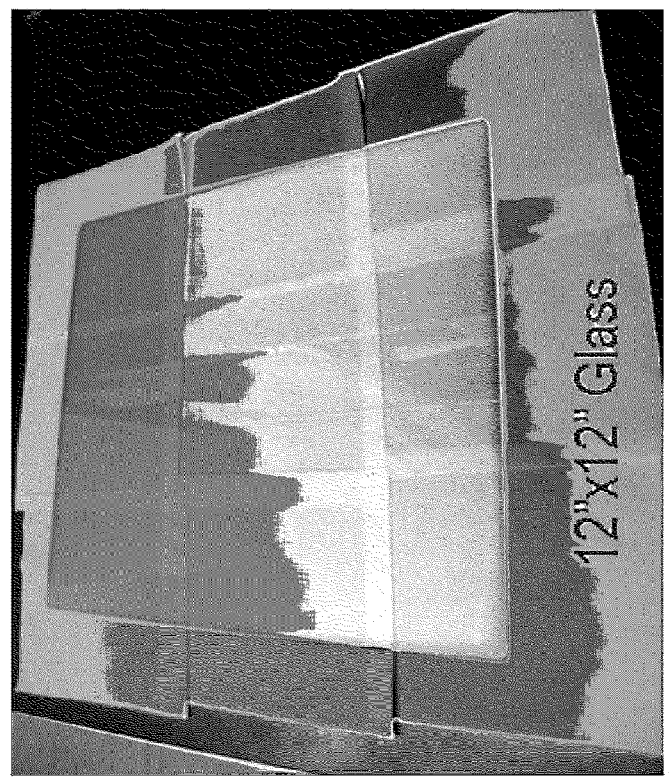
FIG. 26(a) 12"x12" Glass

FIG. 34(a)
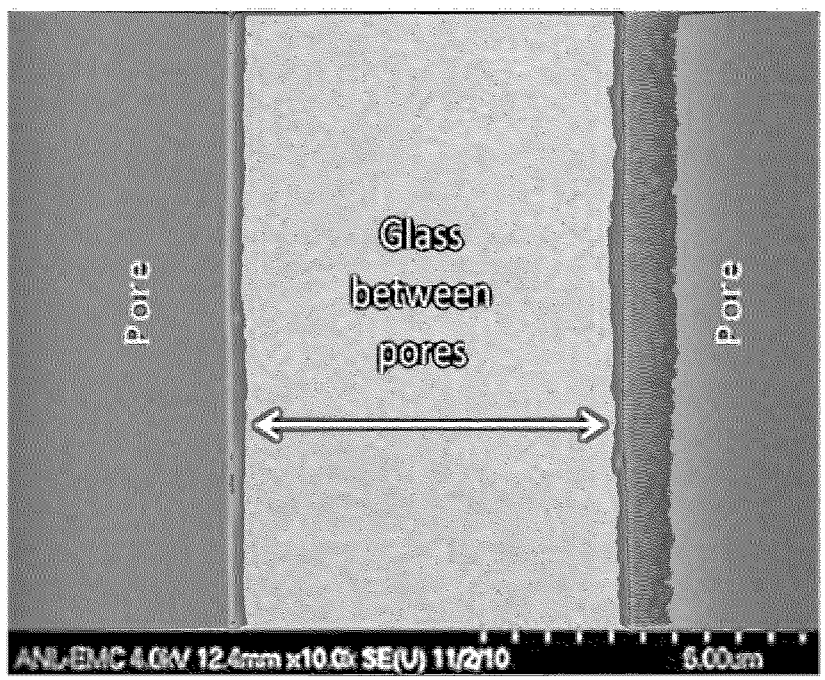
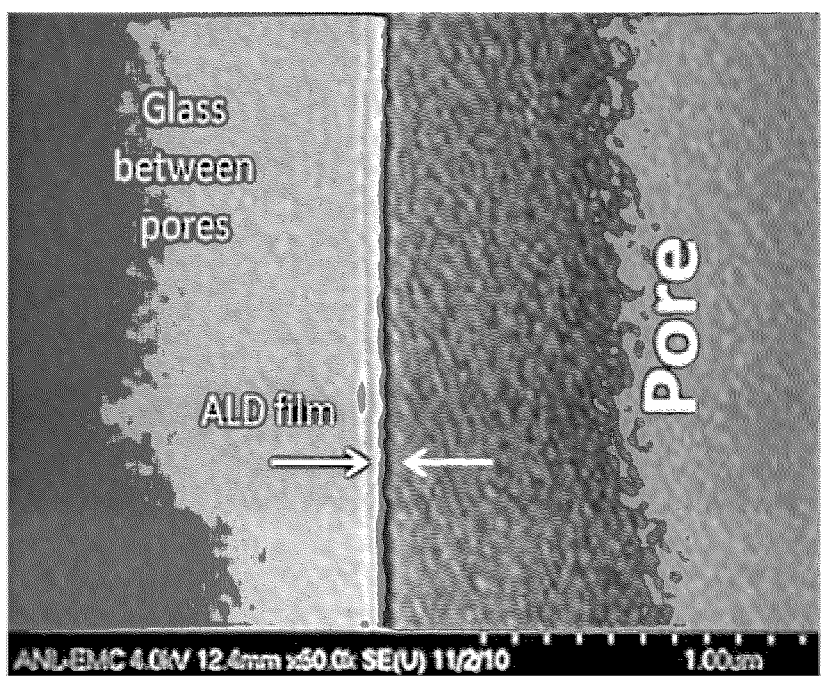
FIG. 34(b)

TUNABLE RESISTANCE COATINGS

CROSS-REFERENCE TO RELATED PATENT APPLICATIONS

This application is a Continuation-In-Part of U.S. application Ser. No. 13/525,067, filed Jun. 15, 2012, incorporated herein by reference in its entirety, which is a Continuation-In-Part of U.S. application Ser. No. 13/011,645, filed Jan. 21, 2011, incorporated herein by reference in its entirety.

GOVERNMENT RIGHTS

The United States Government has certain rights in this invention pursuant to Contract No. DE-AC02-06CH11357 between the United States Government and UChicago Argonne, LLC, representing Argonne National Laboratory.

FIELD

The present invention relates to tunable resistance coatings. More particularly, the invention relates to compositions of matter and methods of manufacture of $M:AlO_x$ thin films having tunable resistance where M=W, Mo, or conducting compounds containing these metals.

BACKGROUND

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section. Thin film materials of metal-metal oxides of nanocomposites can have many applications, including resistive layers for electronic applications, such as, for example, electron multipliers like microchannel plates, resistive memories, electro-chromic devices, biomedical devices and charge dissipating coatings on microelectromechanical systems. A related application, U.S. Ser. No. 13/011,645, which is incorporated by reference herein, describes microchannel plate fabrication by atomic layer deposition ("ALD" hereinafter), which provide an example of how one can benefit from the tunable resistance coatings and methods of preparation described herein.

SUMMARY

In one embodiment, thin layers of nanocomposite tungsten-aluminum oxide ($W:Al_2O_3$) with tunable resistivity can be prepared for various commercial purposes. In another embodiment, thin layers of nanocomposite molybdenum-aluminum oxide ($Mo:Al_2O_3$) with tunable resistivity can be prepared for various commercial purposes. In yet other embodiments the W in the $W:Al_2O_3$ can be replaced by WN or WCx where WCx represents a conducting material containing W and C. Similarly, the Mo in the $Mo:Al_2O_3$ can be replaced by MoN or MoCx where MoCx represents a conducting material containing Mo and C. These thin layers preferably were deposited using ALD by combining alternating exposures to disilane and tungsten hexafluoride for W deposited by ALD, or alternating exposures to disilane and molybdenum hexafluoride for Mo deposited by ALD, with alternating exposures of trimethyl aluminum and water for $Al_2O_3$ deposition by ALD. The film thicknesses were measured by using ex-situ ellipsometry, cross-sectional scanning electron microscopy, and transmission electron microscopy. The crystallinity and topography were examined using X-ray diffraction and atomic force microscopy, respectively. The composition of the composite layers was investigated by X-ray photoelectron spectroscopy, X-ray fluorescence, and Rutherford backscattering, and the electrical conductivity was evaluated using current-voltage measurements. The microstructure of the films was evaluated using transmission electron microscopy. The $W:Al_2O_3$ and $Mo:Al_2O_3$ nanocomposite layers were smooth as revealed by atomic force microscopy, uniform in thickness according to ellipsometry, and showed an amorphous nature via X-ray diffraction scans. Transmission electron microscopy revealed the microstructure to consist of metal nanoparticles embedded in an amorphous matrix. Elemental analysis confirmed the presence of W, Al, O, F, and C in the $W:Al_2O_3$, and Mo, Al, O, F, and C in the $Mo:Al_2O_3$ and in both cases these elements were distributed homogenously throughout the films as determined by X-ray photoelectron spectroscopy depth profiling. The growth rate varied between 1.1-5 Å/cycle depending on the precursor ratio, the metal precursor, as well as sequence ALD precursors. The nature of ALD precursor dose pulses sequencing demonstrated a significant influence on the electrical properties of the desired $W:Al_2O_3$ or $Mo:Al_2O_3$ composite materials. To understand the film growth and electrical properties of $W:Al_2O_3$ and $Mo:Al_2O_3$ layers, in-situ quartz crystal microbalance (QCM) measurements were performed during the W (Mo),$Al_2O_3$ and W (Mo):$Al_2O_3$ ALD. The electrical properties for various compositions of W (Mo):$Al_2O_3$ nanocomposite layer were studied and advantageous attributes identified for a variety of commercial applications.

BRIEF DESCRIPTION OF THE DRAWINGS

FIG. 2(a) shows quartz crystal microbalance (QCM) measurements performed during $Al_2O_3$ ALD various precursors exposure steps; FIG. 2(b) shows the accumulated mass recorded by QCM for the several $Al_2O_3$ ALD cycles; FIG. 2(c) shows calculated mass/ALD cycle of $Al_2O_3$; and FIG. 2(d) shows thickness of $Al_2O_3$ on Si(100) vs. ALD cycles;

FIG. 3(a) shows mass add-on on QCM during ALD W deposition in various precursor exposure steps; FIG. 3(b) shows accumulated mass recorded by QCM for the several ALD W cycles; FIG. 3(c) shows calculated mass per ALD cycle of W; and FIG. 3(d) shows thickness of W on (10 nm) $Al_2O_3$ passivated Si(100) vs. ALD cycles;

FIG. 5(a) shows QCM measurements recorded during the successive ALD of $Al_2O_3$, W, and then $Al_2O_3$ thin films along with indications of when the ALD precursors were introduced; FIG. 5(b) shows calculated mass per ALD cycles from FIG. 5(a); FIG. 5(c) shows zoom-in of the transition between the $Al_2O_3$ ALD and the W ALD for the first W cycle of mass onto the $Al_2O_3$ layer; and FIG. 5(d) shows zoom-in of the transitions between the W ALD and the $Al_2O_3$ ALD for the first $Al_2O_3$ cycles onto a W layer;

FIG. 8(a) shows growth rate of W:$Al_2O_3$ deposited on Si(100) vs. W % ALD cycles and FIG. 8(b) shows thickness of (30% W:70% $Al_2O_3$) ALD cycle composition case vs. the number of ALD cycles and all these layers were deposited with an ALD precursor sequence of [x(TMA-$H_2O$)-y($Si_2H_6$—$WF_6$)] where % WALD cycles=(y/(x+y)*100);

FIG. 9(a) shows an X-ray diffraction scan of the W:$Al_2O_3$ system vs. W % ALD cycles for W:$Al_2O_3$ layers which were deposited on fused quartz substrates and FIG. 9(b) shows an X-ray diffraction scan of (30% W:70% $Al_2O_3$) ALD cycle condition sample as deposited (lower trace) and after annealing at 400° C. in Ar (upper trace);

FIG. 12(c) shows W 4f; FIG. 12(d) shows C 1s.

FIG. 20(d) shows data fitting to FIG. 20(b) at high field (top graph FIG. 20(d)(1) with linear fit), data fitting to FIG. 20(c) at low field (bottom graph FIG. 20(d)(2) with exponential fit);

FIG. 25(a) shows a cross sectional TEM (XTEM) image of an ALD Mo:$Al_2O_3$ tunable resistance composite layer deposited with (8% ALD Mo:92% ALD $Al_2O_3$) with a thickness of 760 Angstrom thickness on a Si substrate; FIGS. 25(b) and 25(c) show higher magnification views of FIG. 25(a);

FIG. 26(a) shows a photograph of an ALD Mo:$Al_2O_3$ tunable resistance composite layer deposited with (8% ALD Mo:92% ALD $Al_2O_3$) with a thickness of 760 Angstrom deposited on a 12"×12" glass substrate; FIG. 26(b) shows the film deposited on a 300 mm Si wafer;

FIG. 34(a) shows an SEM image of an ALD Mo:$Al_2O_3$ tunable resistance composite layer deposited with (8% ALD Mo:92% ALD $Al_2O_3$) on an inside surface of a form borosilicate glass array and FIG. 34(b) shows a higher magnification image of a portion of FIG. 34(a);

FIG. 35b shows refractive index versus Mo atomic % for the resulting films of FIG. 35a;

DETAILED DESCRIPTION OF PREFERRED EMBODIMENTS

Figure 1:
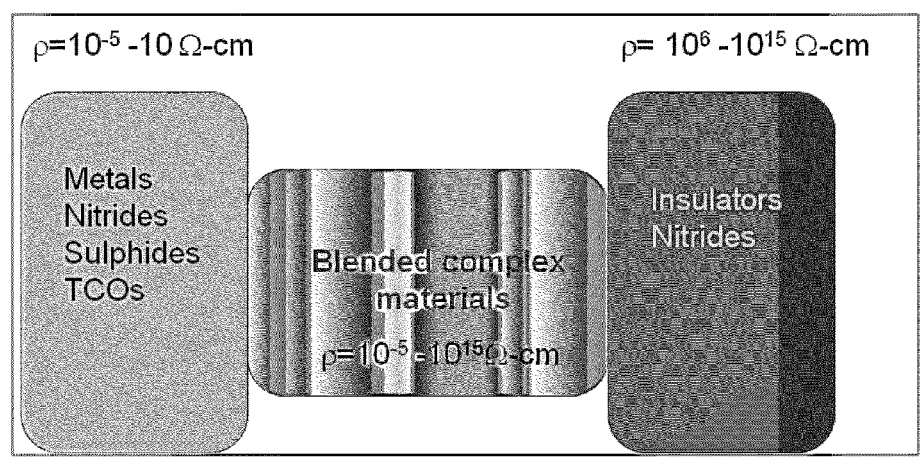
FIG. 1 shows a schematic of resistivity ranges which can be achieved for materials by selected mixing of metal and insulating components by deposition methods.

The tuning of thin film electrical resistance can be done by mixing the conducting and insulating components in a precise controlled manner in composite materials. Schematic of such mixing and the resistivity ($\rho$) range of thin film composite materials is shown in FIG. 1. In the preferred embodiments the metal (Mo, W or conducting compounds containing these elements) and oxide ($Al_2O_3$) are combined by a ALD process under various deposition conditions. The materials can also be deposited by chemical vapor deposition type methods (CVD, MOCVD, OMCVD, PECVD) or PVD type methods such as molecular beam epitaxy (MBE), reactive sputtering, pulsed laser deposition (PLD), evaporation, etc.

The physical, electrical and chemical properties of nanocomposite thin films can be tuned by adjusting the relative proportions of the constituent materials. Amongst various thin film processes, atomic layer deposition (ALD) is a preferred technique for growing complex layers in a precisely controlled manner with many unique advantages. ALD is based on a binary sequence of self-limiting chemical reactions between precursor vapors and a solid surface. Because the two reactions in the binary sequence are performed separately, the gas phase precursors are never mixed; and this eliminates the possibility of gas phase reactions that can form particulate contaminants that might produce granular films. This strategy yields monolayer-level thickness and composition control. The self-limiting aspect of ALD leads to continuous pinhole-free films, excellent step coverage, and conformal deposition on very high aspect ratio structures. ALD processing is also extendible to very large substrates and batch processing of multiple substrates.

In one embodiment, thin films of W:$Al_2O_3$ nanocomposites were synthesized by combining tungsten (W) and aluminum oxide ($Al_2O_3$) using ALD processes. The ALD processes for both W and $Al_2O_3$ are known (also for Mo:$Al_2O_3$ to be discussed hereinafter. In addition, the ALD of W:$Al_2O_3$ nanolaminates comprised of alternating, distinct layers of these two materials has been explored, and these nanolaminates have been utilized as thermal barrier coatings and X-ray reflection coatings. In contrast to this previous work on nanolaminates, the instant invention in general focuses on synthesizing, characterizing, and testing nanocomposites where the W or Mo and the $Al_2O_3$ components do not exist in distinct layers but are more intimately mixed such that the domains of these materials do not exhibit bulk-like properties or structures (examples will be provided hereinafter). Furthermore, the W or Mo domains are comprised of discrete nanoparticles which are not in direct contact with one another. This offers the opportunity to develop very different materials with unique properties that are unlike any other constituents known in the art.

One exemplary use of these methods is to develop tunable resistive coatings using ALD for application in microchannel plate (MCP) electron multipliers. In this application, the ALD resistive layer serves to generate a uniform electrostatic potential along the MCP pores. The W:$Al_2O_3$ system was selected as a preferred article for a number of reasons. ALD W has a very low electrical resistivity of $\rho$=~$10^{-5}$ $\Omega$-cm while ALD $Al_2O_3$ is an excellent insulator with a resistivity of $\rho$=$10^{14}$ $\Omega$-cm, and this contrast offers the potential for an extremely wide range of tunable resistance. In addition, ALD $Al_2O_3$ has a high breakdown electric field and this attribute is beneficial in high voltage devices such as MCPs. Both the W and $Al_2O_3$ ALD processes can be performed under similar conditions, and this simplifies the process of synthesizing composite layers. In addition to the wide variance in electrical properties, W and $Al_2O_3$ have very different physical and chemical properties. As a result, by adjusting the proportion of W in the Al₂O₃ matrix, we expect that the optical, mechanical, and physical properties of the W:Al₂O₃ composite layers can be broadly tuned.

Al₂O₃ ALD can be accomplished using alternating exposures to trimethyl aluminum (TMA) and H₂O according to the following simplified binary reaction sequence:

$$Al\text{—}OH^* + Al(CH_3)_3 \rightarrow Al\text{—}O\text{—}Al(CH_3)_2^* + CH_4 \quad (a)$$

$$Al\text{—}CH_3^* + H_2O \rightarrow Al\text{—}OH^* + CH_4 \quad (b)$$

where the asterisks denote the surface species. Both (a) and (b) reactions are self-limiting and terminate after the consumption of all the reactive surface species. During reaction (a), TMA reacts with surface hydroxyl species, AlOH*, and deposits surface AlCH₃* species liberating methane. In reaction (b), H₂O reacts with the surface methyl species to form new Al—O bonds and rehydroxylate the surface while again liberating methane. Repeating the (a)-(b) reactions results in the linear ALD of Al₂O₃ films at a rate of ~1.3 Å/cycle.

The ALD of single-element films requires a different surface chemistry than the surface chemistry employed for binary compounds like Al₂O₃. For W ALD, one of the reactants is a sacrificial species that serves as a temporary place holder in the AB-AB-AB . . . binary reaction sequence. This sacrificial species is removed during the subsequent surface reaction. The W ALD film growth using Si₂H₆ and WF₆ is accomplished by two self-limiting surface reactions described by the following simplified equations:

$$WSiH_yF_z^* + WF_6 \rightarrow W\text{—}WF_x^* + SiHF_3 \quad (c)$$

$$WF_x^* + Si_2H_6 \rightarrow W\text{—}WSiH_yF_z^* + SiHF_3 + H_2 \quad (d)$$

where the asterisks denote the surface species.

During reaction (c), WF₆ reacts with the sacrificial silicon surface species, WSiHyFz*, and deposits WFx species. In reaction (d), Si₂H₆ strips fluorine from the tungsten surface species, WFx*, and reforms the sacrificial silicon surface species. The reaction stoichiometry is kept undefined because the exact identity of the surface species is not known. Furthermore, the reactions are unbalanced for simplicity. Repeating these surface reactions (c) and (d), the W ALD grows linearly.

However, the initial nucleation of ALD Al₂O₃ on the ALD W surface, or the ALD W on the ALD Al₂O₃ surface may not have the same growth behavior as for the pure materials on themselves. The self-limiting surface reaction discussed above change as compared to the pure Al₂O₃ and W due to mixing of the four precursors TMA, H₂O, WF₆, and Si₂H₆ during the growth of W:Al₂O₃ composite layers. This is due in part to the fact that the ALD Al₂O₃ surface is hydroxyl-terminated, and does not have the appropriate fluorine species required for the W ALD. Similarly, the ALD W surface is fluorine terminated and does not bear the hydroxyl species needed for the Al₂O₃ ALD. These four precursors can be introduced on the substrate by in different orders resulting in the formation of various functional groups such as —OH, —WF₃, —SiH$_x$, —Al(CH₃), —AlF$_x$ on the already partially or fully deposited layer and can result in a complex ALD chemistry. Furthermore, it is possible that atoms present in the precursor ligands, such as C, H, or F, as well as Si from the sacrificial disilane, may be incorporated into the ALD composite film as a result of the unique surface chemistry that occurs upon transitioning between the W and Al₂O₃ ALD. In addition, the nucleation delay for Al₂O₃ and W ALD film growth may affect the resulting film growth and the roughness. The roughness (surface area) of each individual layer can affect the nucleation of the W or Al₂O₃ processes. This nucleation process will affect the composition and growth-per-cycle of the tunable resistance coatings, and therefore will influence the electrical properties. Various aspects of the ALD synthesis of W:Al₂O₃ composite layers were examined with variation of composition of the W:Al₂O₃ layers. The physical and electrical properties of W:Al₂O₃ composite layers are discussed hereinafter.

In a preferred method the W:Al₂O₃ composite layer depositions were carried out in a hot wall viscous flow reactor ALD reactor. The W:Al₂O₃ composite films were deposited on n-type Si(100), fused quartz, glass substrates and high aspect ratio (60:1) borosilicate glass micro-capillary plates. Prior to ALD process all the substrates degreasing was performed using a 10 min dip ultrasonic acetone cleaning. For Al₂O₃ growth, Al(CH₃)₃ [TMA] was obtained from Sigma-Aldrich with a 97% purity and deionized (DI) H₂O vapor were used as the precursors. For W ALD, tungsten hexafluoride (WF₆, Sigma Aldrich, 99.9%) and disilane (Si₂H₆, Sigma-Aldrich, electronic grade 99.995%) were used as precursors. All precursors were maintained at room temperature at ~20° C. The background N₂ flow was set to 300 sccm which gives a base pressure of 1.0 Torr in the ALD reaction chamber and was measured by a heated MKS Baratron 6298 model. The precursors TMA and H₂O were alternately pulsed in the continuously flowing N₂ carrier flow using high speed computer controlled pneumatic valves in the desired ALD sequence. During the TMA and H₂O dosing, pressure transient increases of ~0.2 Torr for TMA and ~0.3 Torr for H₂O were observed when the reactants were introduced into N₂ carrier flow. Similarly, during the Si₂H₆ and WF₆ dosing into the N₂ carrier gas flow, pressure transient increases of 0.25 Torr for Si₂H₆ and 50 mTorr for WF₆ were seen. The results below utilized the optimized process conditions and precursor dose timing sequences for the pure W and Al₂O₃ ALD processes. The main experimental conditions for ALD are summarized in Table 1.

TABLE 1

ALD experimental parameters and physical properties of various layers

| Parameter | Al₂O₃ | W | W:Al₂O₃ |
|---|---|---|---|
| Deposition temperature (° C.) | 150-300 | 100-300 | 200-300 |
| ALD Precursors | TMA, H₂O | Si₂H₆, WF₆ | TMA, H₂O, Si₂H₆, WF₆ |
| Growth rate (Å/cycle) | 1.1-1.3 | 4.5-5.5 | 1.2-1.5 |
| Substrates | Si(100), fused quartz | Si(100), fused quartz | Si(100), fused quartz, glass micro-capillary plate |
| XRD analysis | Amorphous | Nano-crystalline | Amorphous |
| ALD cycle timing (s) | 1-5-1-5 | 1-5-1-5 | W(1-5-1-5): Al₂O₃(1-5-1-5) |
| Resistivity (Ω-cm) | ~10¹⁴ | ~10⁻⁴ | 10⁻⁴-10¹⁴ |

An in-situ quartz crystal microbalance (QCM) study was performed for the various ALD processes Al₂O₃, W and W:Al₂O₃ with a different mixture of ALD cycle ratios. QCM mass gains were recorded for each case. Front sided polished QCM sensors were obtained from Colorado Crystal Corporation. The QCM housing is located inside the uniformly heated reaction zone of the ALD flow tube reaction chamber. The Maxtek BSH-150 sensor housing was modified to provide a slow nitrogen purge of 10-20 sccm over the back of the quartz crystal sensor. This nitrogen purge prevents reactant gases from entering the QCM housing and depositing material on the back surface of the QCM sensor. By preventing this deposition, the QCM yields absolute mass measurements. In addition, the nitrogen purge allows QCM measurements during the ALD of conducting materials such as W. These conducting materials would otherwise electrically short the QCM sensor and prevent oscillation. Mass uptake data was recorded every 0.1 s, and this data was processed to obtain the net mass change from each ALD cycle in the cases of $Al_2O_3$, W and W:$Al_2O_3$ composites with various ALD cycles ratio.

The thicknesses of W:$Al_2O_3$ layers were determined using spectroscopic ellipsometry measurements on the Si monitor coupons. The ellipsometry film thicknesses were supported by cross-section scanning electron microscopy (SEM) analysis and transmission electron microscopy (TEM). Annealing of W:$Al_2O_3$ composite layers were performed at 400° C. in 500 sccm flowing Ar condition for 4 hrs. at a pressure of 1 Torr. The microstructure and conformality of W:$Al_2O_3$ layer coatings on Si substrates and high aspect ratio glass microcapillary plates were examined by cross-sectional scanning electron microscopy (SEM) using a Hitachi model 4700. The electrical I-V characteristics and thermal coefficient of resistance (TCR) of W:$Al_2O_3$ layers were measured using a Keithley Model 6487 pA/V source. Electrical measurements were done using either micro probes or Hg-probe contact method. The resistance stability test was performed for several days under constant applied potential in vacuum.

Prior to ALD growth W:$Al_2O_3$ composite layers, pure $Al_2O_3$ and W layers growth was studied by ALD. Thickness series samples were prepared and characterized. The in-situ quartz crystal microbalance (QCM) was performed during the pure $Al_2O_3$ and W ALD films growth.

Figure 4:
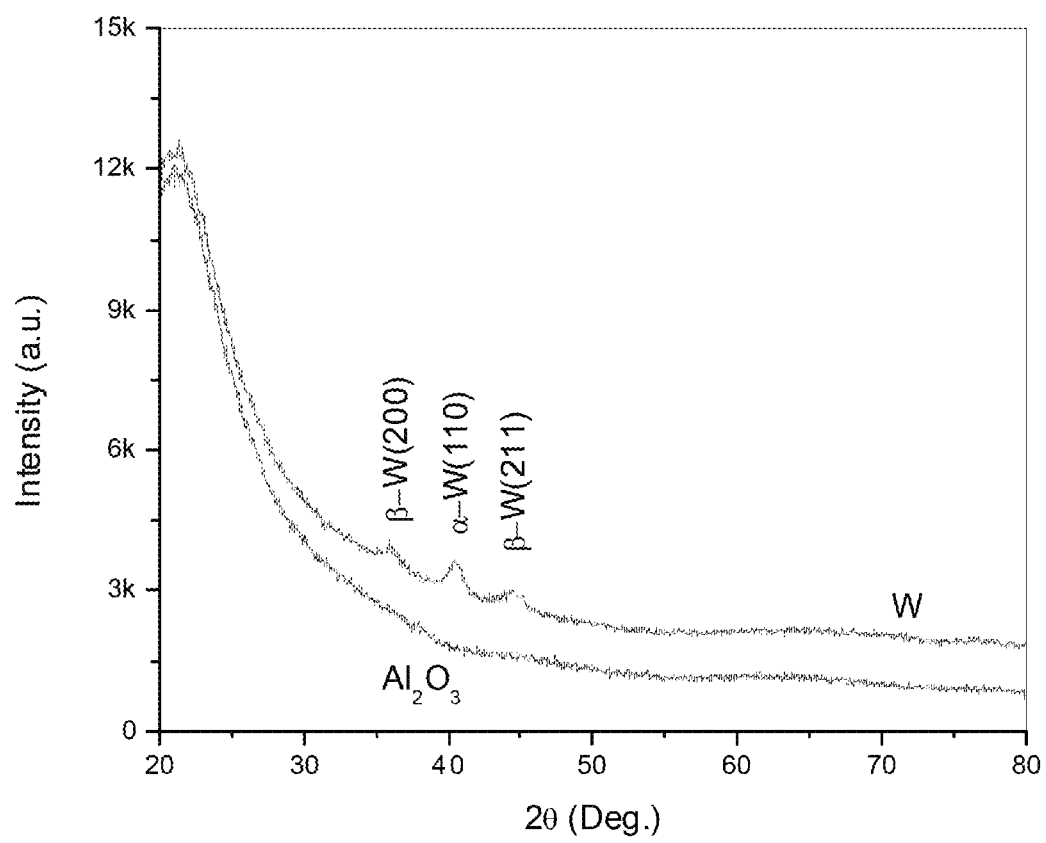
FIG. 4 shows an X-ray diffraction pattern of a 600 Å layer of ALD $Al_2O_3$ (bottom scan) and 500 Å layer of ALD W (top scan)

QCM measurements were performed during $Al_2O_3$ ALD at 200° C. using TMA and $H_2O$ with the timing sequence: (1-10-1-10). These conditions were chosen from the ALD growth saturation studies. Under these conditions FIGS. 2(a)-2(d) explain data acquired from $Al_2O_3$ QCM study and thicknesses of actual $Al_2O_3$ samples grown Si(100) with ALD growth experimental conditions described in Table 1. FIG. 2(a) shows a mass add-on a QCM at various precursor steps in one $Al_2O_3$ ALD cycle. Calculated mass add-on the QCM for the several $Al_2O_3$ ALD cycles are plotted in FIG. 2(b) which illustrates a very linear increase mass as increasing number of ALD cycles. A linear least-square fit to the $Al_2O_3$ QCM mass data indicates an average $Al_2O_3$ growth rate of 37 ng/cm$^2$/cycle. The calculated mass/ALD cycle from FIG. 2(b) are shown in FIG. 2(c). This data confirms the every $Al_2O_3$ ALD cycles deposited under these set of conditions are deposited approximately at the same mass/ALD cycle. A thickness series of samples of $Al_2O_3$ were deposited on Si(100). The ellipsometry measured thicknesses of $Al_2O_3$ layers on Si(100) vs. number of ALD cycles are shown in FIG. 2(d). A linear least-square fit to $Al_2O_3$ thickness data yields to a growth rate of 1.21 Å/cycle. From the $Al_2O_3$ mass/ALD cycle and growth rate on monitor Si(100) data, the calculated $Al_2O_3$ density=3.1 g/cm$^3$ which is lower than the bulk density of crystalline $Al_2O_3$=3.6 g/cm$^3$. This density variation can correlate to the X-ray amorphous nature of the 600 Å $Al_2O_3$ layer shown in FIG. 4. Both the mass uptake and the growth rate data for $Al_2O_3$ per ALD cycle are in good agreement with prior work.

ALD of W performed on QCM at 200° C. with the repetition of a ALD precursors cycle $Si_2H_6$ (dose)-$N_2$(purge)-$WF_6$ (Dose)-$N_2$(purge) with precursor timings of (1-10-1-10)s. These conditions were chosen from the ALD growth saturation studies. W growth directly on Si(100) substrate has shown poor adhesion whereas $Al_2O_3$ passivated Si(100) substrate shows good adhesion with W layer. FIGS. 3(a)-3(d) describe the QCM and actual thickness data of W samples grown on 10 nm $Al_2O_3$ passivated Si(100) substrates. Mass up-take on QCM during various steps in one W ALD cycles is shown in FIG. 3(a). Calculated mass add-on the QCM for the 15 steady state W ALD cycles are plotted in FIG. 3(b). This data confirms a very linear increase mass growth with increasing number of ALD cycles. A linear least-square fit to the W QCM mass data indicates an average W mass rate of 930 ng/cm$^2$/cycle. The calculated mass/ALD cycle is shown in FIG. 3(c) which confirms that W deposited under this set of experimental conditions are depositing nearly equivalent mass for every ALD cycles is same. Thickness vs. number of ALD cycles for W layer is shown in FIG. 3(d). A linear least-square fit to W thickness data yields to a growth rate of ~5 Å/cycle. From the mass/ALD cycle and the W growth rate data on Si(100) data, the calculated W density=18.6 g/cm$^3$ which is slightly lower than the bulk density of crystalline W=19.3 g/cm$^3$. This variation density can linked to the nanocrystalline nature of ALD grown W layer analyzed by XRD shown in FIG. 4. XRD pattern of the ~500 Å W shows three broad little peaks appearance due to nano-size crystallinity in the range of 2θ=35°–45° and are associated with the presence of α-W and β-W phases in the ALD grown W layer. The both mass/ALD cycle and growth rate/ALD cycles data for W are in-line with prior work.

Prior to W:$Al_2O_3$ composite layers growth, the QCM data were collected for the steady state ALD growth of $Al_2O_3$—W:$Al_2O_3$ with the precursor sequence of n(TMA-$H_2O$)-m ($Si_2H_6$—$WF_6$)-n(TMA-$H_2O$) where n and m are the desire number of cycles and shown in FIGS. 5(a)-5(d). Repeatability of these data sets was collected for few times and confirmed repeatable behavior. FIG. 5(a) represents the mass deposited during ALD $Al_2O_3$—W:$Al_2O_3$ at various precursor steps for precursor n(TMA-$H_2O$)-m($Si_2H_6$—$WF_6$)-n(TMA-$H_2O$). As expected a rapid increased in mass add-on was noticed during W ALD cycle. This is related to the high growth rate and for high density of the W. The calculated mass add-on for $Al_2O_3$ and W calculated for every ALD cycles in $Al_2O_3$—W:$Al_2O_3$ system and is shown in FIG. 5(b).

In FIG. 5(b) the initial $Al_2O_3$ ALD cycles stopped after reaching a steady state mass add-on of 37 ng/cm$^2$/ALD cycle. However, a noticeable change was observed on the mass uptake at the very first W cycle on $Al_2O_3$ surface. This mass add-on is ~130 ng/cm$^2$ which is ~7 times lower compared to the W mass uptakes ~930 ng/cm$^2$/ALD cycle under steady-state ALD growth condition which was discussed in the previous section. There was no significant mass add-on for the next 3 W cycles. This behavior relates to the change in functional groups and the reactive sites for the very first W ALD cycle and subsequent W ALD cycles. After this a rapid mass add-on was noticed up to next 8$^{th}$ W ALD cycles and mass add-on reaches ~800 ng/cm$^2$/ALD cycle for few cycles followed by gradual mass drop to ~700 ng/cm$^2$/ALD cycle followed by gradual increases in the mass add-on up to ~930 ng/cm$^2$/ALD cycle, then mass add-on reached a steady-state mass/W ALD cycle. An initial 8 ALD W cycle and very rapid increase in the mass can correlate to island-type growth. These islands can form discontinuous W layers. After the critical island size, the collapse of island might have occurred and the formation of the continuous layer begins where the change in surface area as well as number of reactive sites may have a contribution to the mass-add on rate. The crucial point is the first W ALD cycle mass-uptake can be especially useful in a controlling lower % W in W:$Al_2O_3$ composite system. The first total 8-9 W ALD cycles express the amount of higher % W deposits into the W:$Al_2O_3$ composite system.

The first cycles of Al$_2$O$_3$ mass uptake on the W surface was noted to be high ~68 ng/cm$^2$, which is ~1.8 times more than the steady state growth condition 37 nm/cm$^2$/ALD cycle (FIGS. 2(a)-2(d)). In contrast, Al$_2$O$_3$ steady-state mass/ALD cycle on W surface was achieved within the next 4-5 ALD Al$_2$O$_3$ cycles. These mass uptake numbers change drastically as the relative percentage ratio of the W to Al$_2$O$_3$ ALD cycles was altered and also as the precursor sequence was adjusted. These findings will be discussed in the next section. This lower amount of mass add-on for the initial W ALD cycles was associated with nucleation delay which is dependent on the available functional groups to complete the surface reactions. The precise mass uptake of W and Al$_2$O$_3$ not only defines the growth and physical properties but also strongly affects the electrical properties of the W:Al$_2$O$_3$ composite layers.

Figure 6:
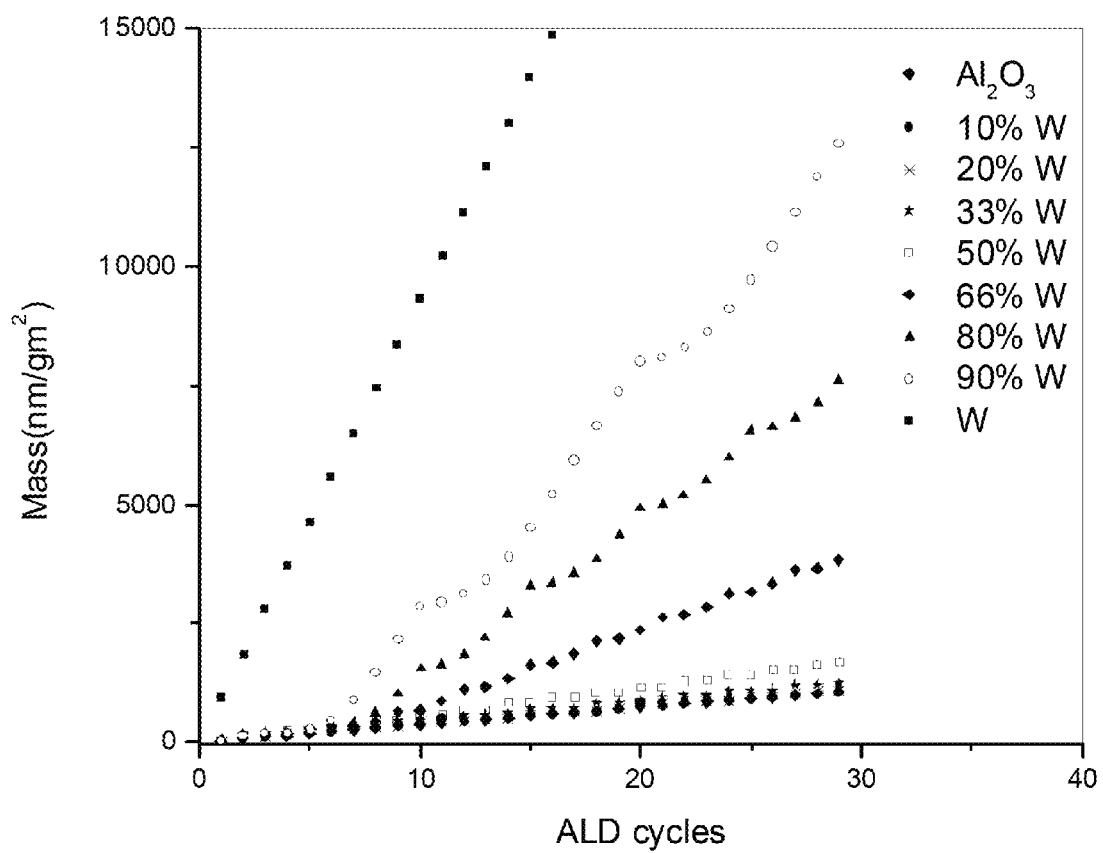
FIG. 6 shows mass add-on as recorded by QCM for $W:Al_2O_3$ composites grown with different % W ALD cycles.
Figure 7B:
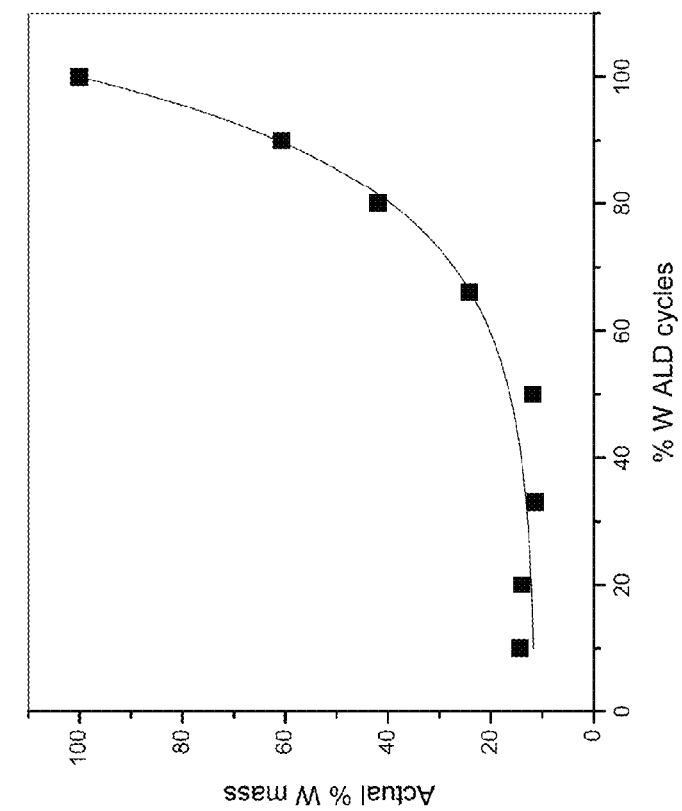
FIG. 7(b) shows the actual % W mass into the W:$Al_2O_3$ system vs. % W ALD cycles as determined from the QCM data in FIG. 6.
Figure 7A:
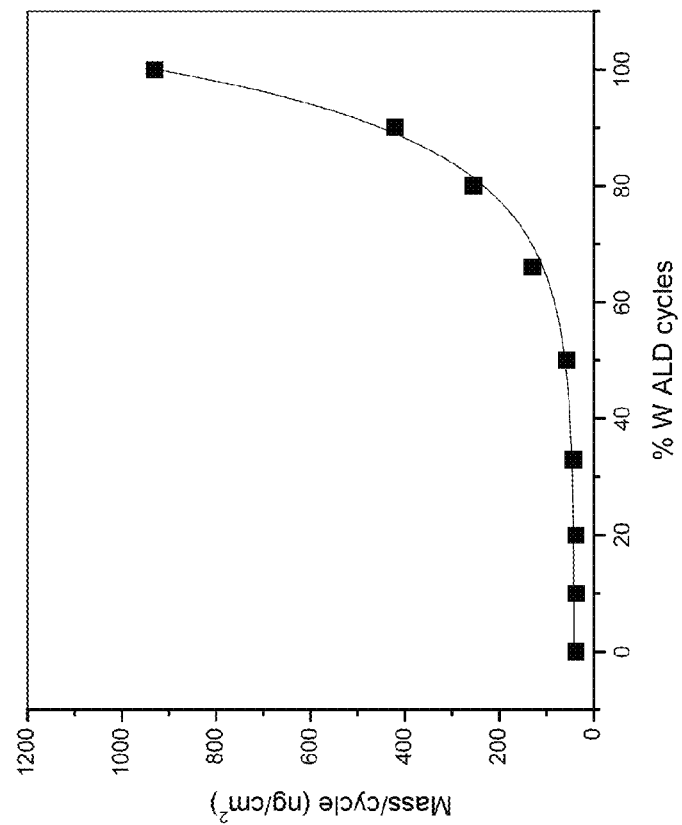
FIG. 7(a) shows the average mass/ALD cycle for the traces in FIG. 6.

Control over the electrical properties of W:Al$_2$O$_3$ composite layers is preferably accomplished by adjusting relative ratio of the W to Al$_2$O$_3$ ALD cycles. The QCM study was performed at 200° C. for various compositions of the W:Al$_2$O$_3$ ALD cycles using the precursor sequence n[x (TMA-N$_2$—H$_2$O—N$_2$)+y(Si$_2$H$_6$—N$_2$—WF$_6$—N$_2$)] where the % W cycles, y/(x+y)*100, can vary between 0-100; and n is adjusted to control the film thickness. The precursors were dosed for 1 s followed by a 10 s N$_2$ purge. FIG. 6 describes the QCM mass add-on data for various compositions of W:Al$_2$O$_3$ system. Three trends were observed: i) within each composition a linear increase of cyclic mass add-on as per increase in ALD cycles, ii) gradual increase of mass add-on up to 50%-50% W to Al$_2$O$_3$ ALD cycles which is associated with the disorder in ALD growth due to mixing of more or less W or Al$_2$O$_3$ and iii) >50% W ALD cycles conditions provide an exponential increase in mass uptake which can be associated with the increased number of W cycles that can lead to the rapid increase in the W mass portion in the composite layer as shown in FIG. 5(b). A calculation of the mass/ALD for each % W ALD cycle condition from FIG. 6 is expressed in FIG. 7(a). The exponential function fits well to this data set which confirms the mass/per ALD cycles increased exponentially with increasing % W ALD cycles. The actual W mass added per composition of W:Al$_2$O$_3$ is calculated by taking an average by adding actual W mass add-on from 30 ALD cycles for each of the W:Al$_2$O$_3$ compositions and dividing by the number of only W ALD cycles and normalized with 100% W mass/ALD cycles (930 ng/cm$^2$/ALD cycle). It is noteworthy that this estimate for the amount of W in the W:Al$_2$O$_3$ changed very little in the range of 10-50% W ALD cycles (in Al$_2$O$_3$ dominated region). Whereas in ≥50% W ALD cycles conditions (in W dominated region), the W mass rapidly increased and resembled the exponential increasing trend for mass/per ALD cycle.

Thickness series samples of W:Al$_2$O$_3$ system with % W ALD cycles variations were deposited under similar conditions on Si(100) and thicknesses measured spectroscopic ellipsometry. FIG. 8(a) represents a growth rate vs. % of W ALD and shows an exponential increasing behavior. Data from both FIG. 7(a) and FIG. 8(a) support each other. Besides of this, the thickness series samples were deposited for the (30% W:70% Al$_2$O$_3$) ALD cycle composition by adjusting simply the number of ALD cycles and are plotted in FIG. 8(b). A linear least-square fit to thickness data yields a growth rate of 1.33 Å/cycle for W:Al$_2$O$_3$.

As deposited pure Al$_2$O$_3$, pure W as well as composite W:Al$_2$O$_3$ layers were uniform and smooth over the 300 mm Si substrate area. These layers were analyzed by X-ray diffraction analysis shown in FIG. 9 (a). All the W:Al$_2$O$_3$ composite layers were shown to have an X-ray amorphous diffraction pattern. A further (30% W:70% Al$_2$O$_3$) ALD cycle condition sample was annealed at 400° C. in 300 sccm Ar at 1 Torr for 4 hours which also shows an X-ray amorphous behavior as illustrated in FIG. 9(b). For this growth condition the microstructure and thickness were also verified with cross-section TEM analysis for an as deposited sample capped intentionally with the 60 Å Al$_2$O$_3$ as shown in FIGS. 10(a)-10(d).

Cross-section TEM samples were analyzed at Evans Analytical Group (EAG). TEM ready samples were prepared using the in-situ FIB lift out technique on an FEI Strata Dual Beam FIB/SEM. The samples were capped with a protective layer of carbon prior to FIB milling. The samples were imaged with a FEI Tecnai TF-20 FEG/TEM operated at 200 kV in bright-field (BF) TEM mode, high-resolution (HR) TEM mode, high-angle annular dark-field (HAADF) STEM mode and nano-beam diffraction (NBD) mode.

Figure 10B:
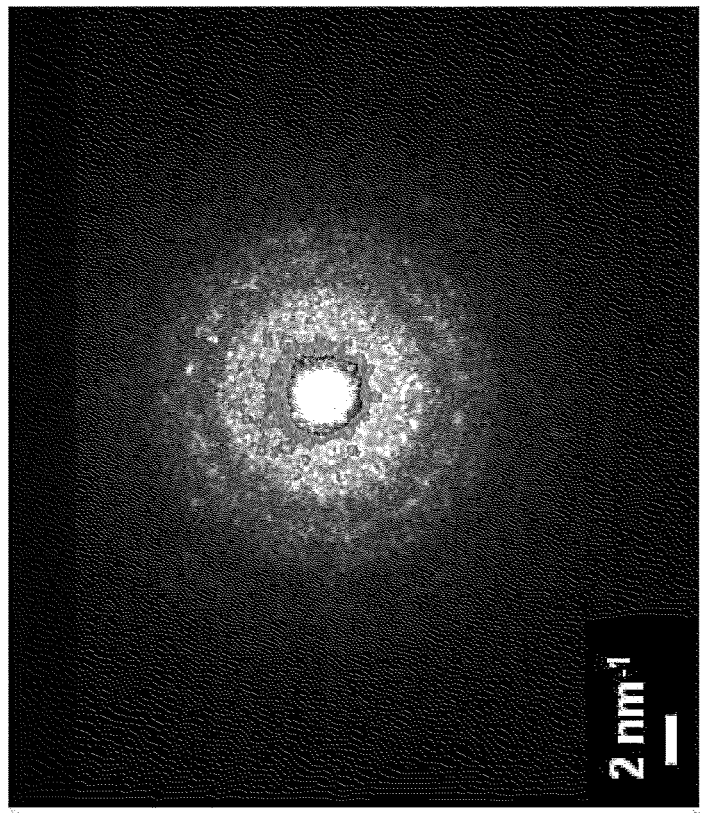
FIG. 10(b) shows a nano beam diffraction (NBD) image from a composite layer film area.
Figure 10A:
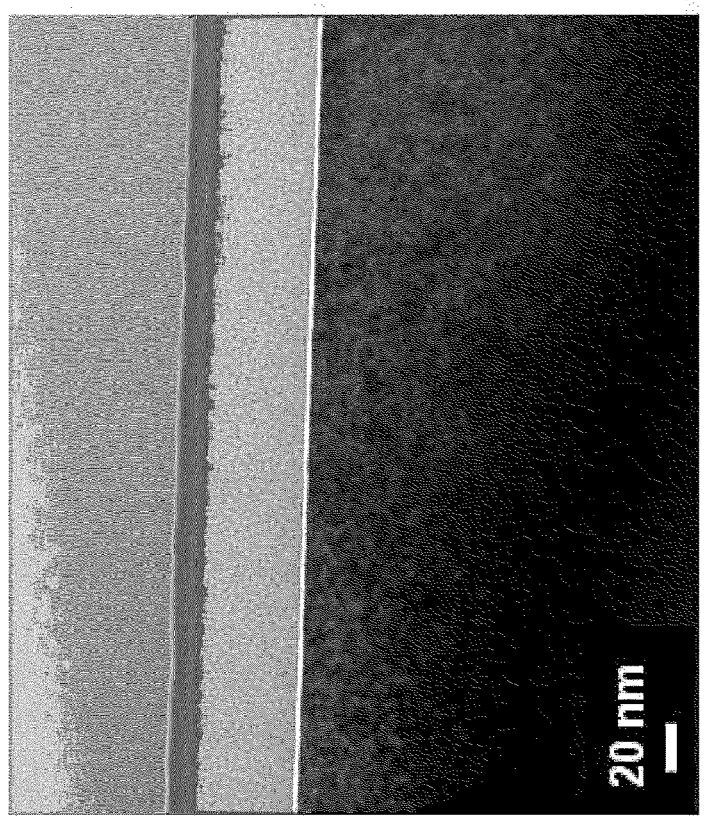
FIG. 10(a) shows cross-sectional high-resolution (HR) transmission electron microscopy (TEM) analysis of (30% W:70% $Al_2O_3$) ALD cycle composite layer capped with 6 nm $Al_2O_3$: Cross section HRTEM micrograph.
Figure 10D:
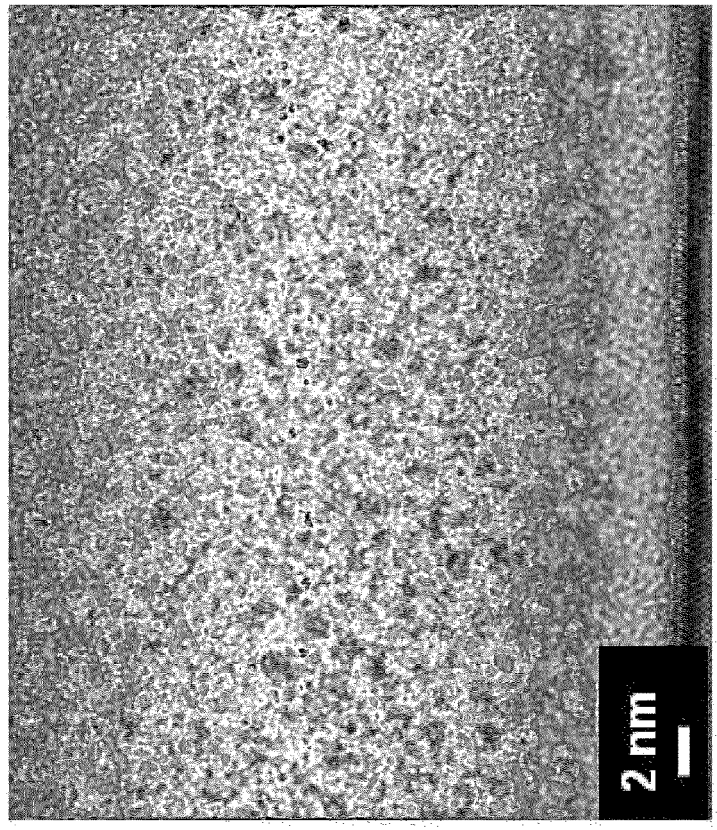
FIG. 10(d) shows a high resolution and high magnification cross-section TEM image.
Figure 10C:
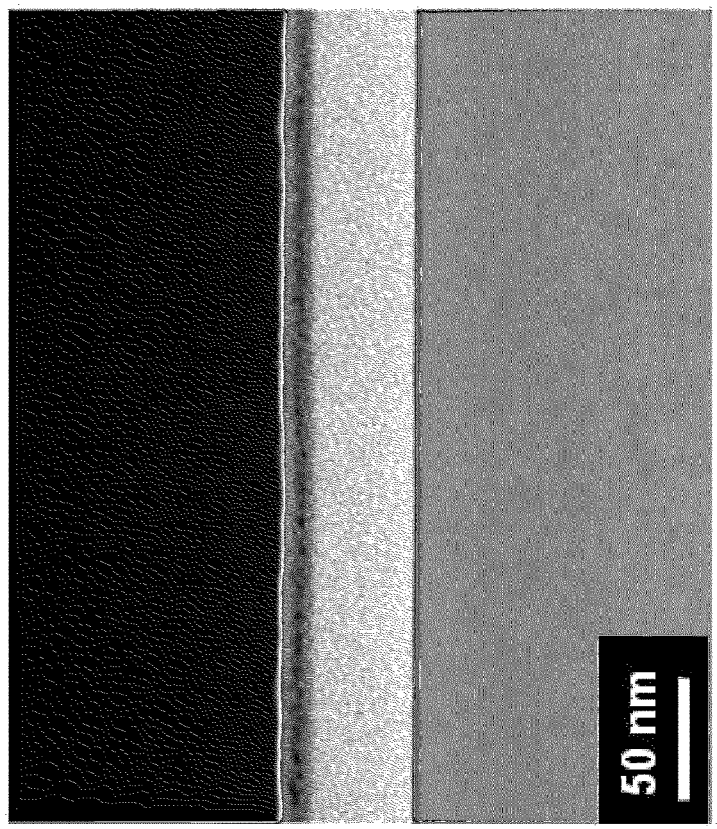
FIG. 10(c) shows a High Angle Annular Dark Field (HAADF) scanning-TEM (STEM) tomography image of composite layer.

It is clear from the FIG. 10(a) cross-section TEM image that the surface of the sample is very smooth; and TEM thickness data are in good agreement with spectroscopic ellipsometry data. The film substrate interface has a very clean amorphous layer due to native Si(100)+few ALD cycles of Al$_2$O$_3$. Cross-section TEM data also confirms the thickness of an amorphous Al$_2$O$_3$ capping layer. TEM nano-beam diffraction (NBD) data was captured from the film region and shown in FIG. 10(b). The NBD image did not illustrate either a clear diffuse pattern that one can expect from amorphous Al$_2$O$_3$ or a pattern of concentric rings consistent with a crystalline film. However, the discrete spots in FIG. 10b suggest nanocrystals in the film. A possible explanation for the XRD and TEM data is that the W:Al$_2$O$_3$ layer can contain a mixture of amorphous and nano-crystalline domains. FIG. 10(c) represents a high-angle annular dark-field (HAADF) STEM image which shows a very uniform distribution of nano-size particles (bright white) homogeneously embedded in a continuous amorphous matrix. A very high resolution cross-section TEM image shown in FIG. 10(d) confirms the presence of 1-2 nm size particles (e.g. W) embedded in an amorphous matrix (e.g. Al$_2$O$_3$). Magnification of this image clearly shows lattice fringes in the nano-crystallites. The XPS analysis of this layer confirms the W is in metallic state and is discussed in the next section. Further, the thickness measured by spectroscopic ellipsometry [see FIG. 8(b)] and cross-section TEM [see FIG. 10(a)] results are in agreement.

Figure 11:
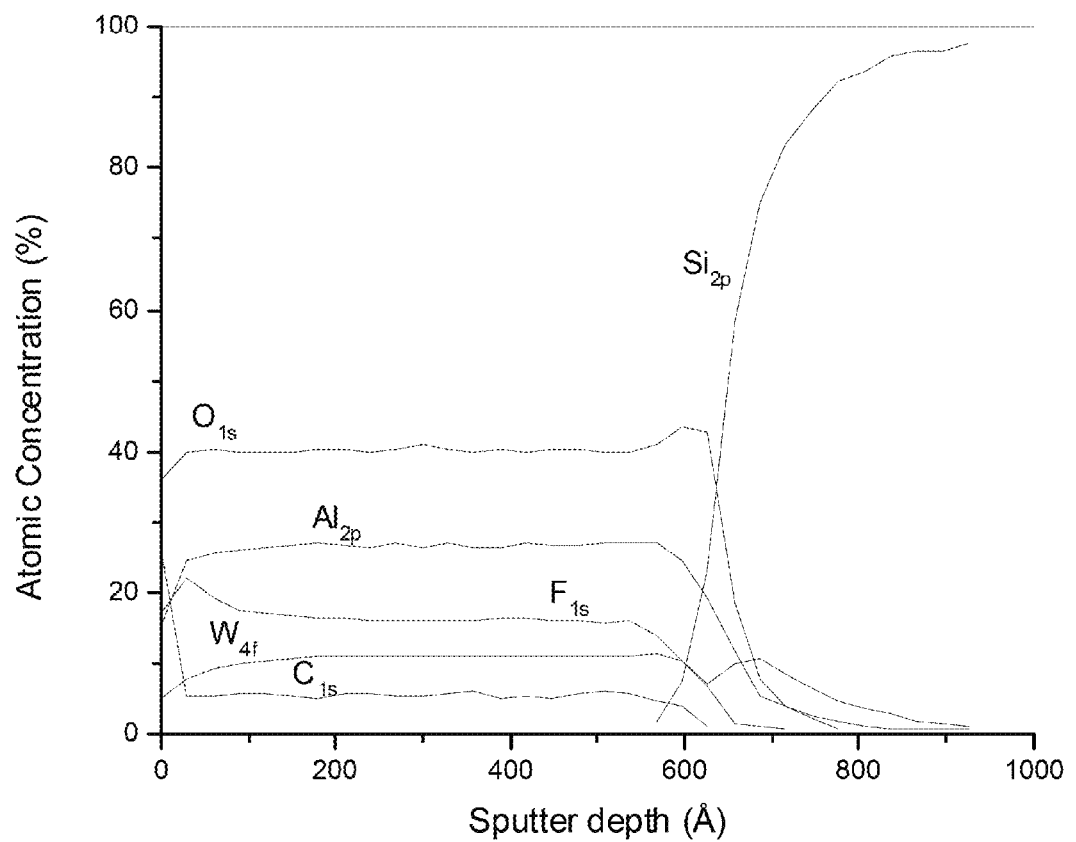
FIG. 11 shows a sputter X-ray photoelectron spectroscopy (XPS) depth profile of W:$Al_2O_3$ composite layer capped with 6 nm $Al_2O_3$; this layer was deposited with (30% W:70% $Al_2O_3$) ALD cycle composition grown at 200° C.

The elemental composition across the layer of the (30% W:70% Al$_2$O$_3$) ALD cycle condition case for an as deposited sample capped intentionally with the 60 Å Al$_2$O$_3$ is shown in FIG. 11. Composite analysis of this layer was investigated by X-ray photo electron spectroscopy (XPS). XPS depth profiles were obtained by alternating an acquisition cycle with a sputter cycle during which material was removed from the sample using a 4 keV Ar$^+$ source. In order to eliminate crater wall effects, the data were acquired from a smaller region in the center of the sputter area. In addition, Zalar rotation was used to help minimize sample roughening during the sputtering process. The sputter rate is calibrated using SiO$_2$. Note that the sputter rate of this material is likely different than that of SiO$_2$. XPS measurements performed on PHI Quantum 2000 with X-ray source monochromated Alk$_\alpha$ 1486.6 eV. The acceptance angle was ±23° and takeoff angle 45°. The analysis area was 1400 μm×300 μm and the sputter rate 39.8 Å/min (SiO$_2$ Equivalent). XPS data is quantified using relative sensitivity factors and a model that assumes a homogeneous layer. The analysis volume is the product of the analysis area (spot size or aperture size) and the depth of information.

FIG. 11 shows the sputter-XPS depth profile, and after removal of an Al$_2$O$_3$ cap or top layer, the overall elemental composition of the W:Al$_2$O$_3$ composite layer is very uniform across the layer thickness within the resolution of the measurement. This sputter data also confirms the thickness of the sample (~570 Å) and is good agreements with thickness measured by spectroscopic ellipsometry (~570 Å) and cross-section TEM (550 Å). The coating is composed primarily of Al, W, O and F with lower but significant levels of C. A thin oxidized Si layer and a thin W/WSi$_x$ layer were present between the coating and Si substrate. Calculated average atomic concentration from a uniform region is in the inserted table in the FIG. 11. Note that the ratio of Al (26.6%) to 0 (40.1%) concentration is 2:3 which is consistent with the formation of the Al$_2$O$_3$. Secondly, impurities such as F and C are also present uniformly across the film thickness. The percentage of F concentration in an as deposited film is as high as 16.5% and 5.6% for C. It is noteworthy that the W atomic percentage from XPS is about 10.8% which is also consistent across the film thickness. This W atomic percentage for (30% W:70% Al$_2$O$_3$) ALD cycle condition sample is in good agreement with the calculated actual % W mass for (11.3%) by QCM mass add-on study for (33% W:66% Al$_2$O$_3$) ALD cycle condition sample.

Figure 12A:
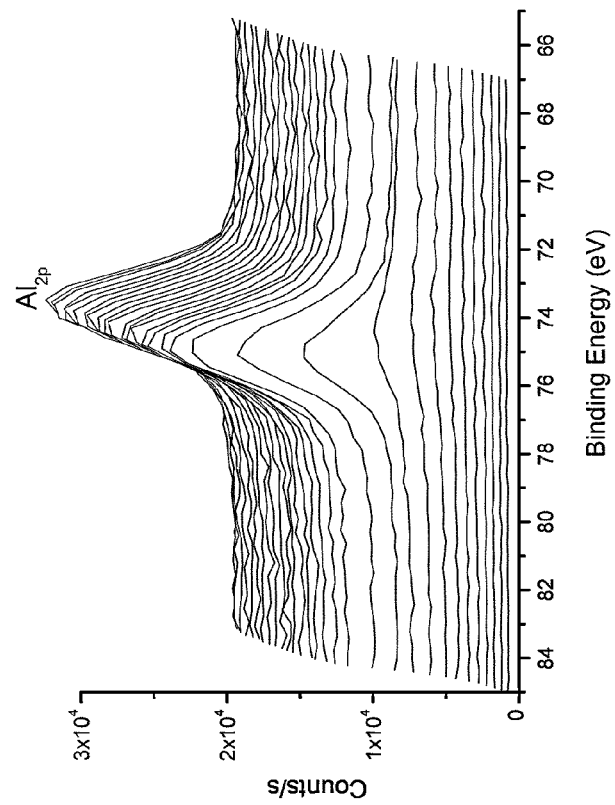
FIG. 12(a) shows sputter-XPS scans of (30% W:70% $Al_2O_3$) ALD cycles composite layer for Al 2p.
Figure 12B:
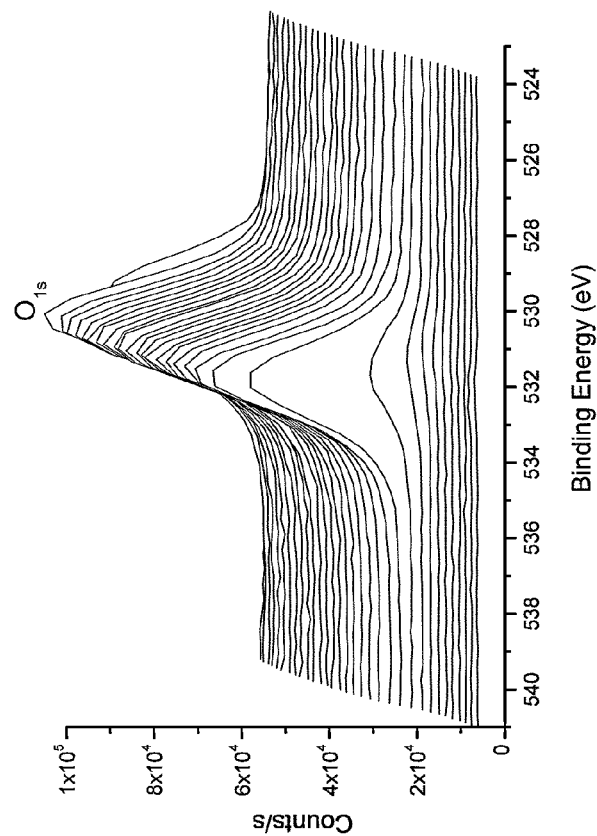
FIG. 12(b) shows O 1s.
Figures 12E, 12F:
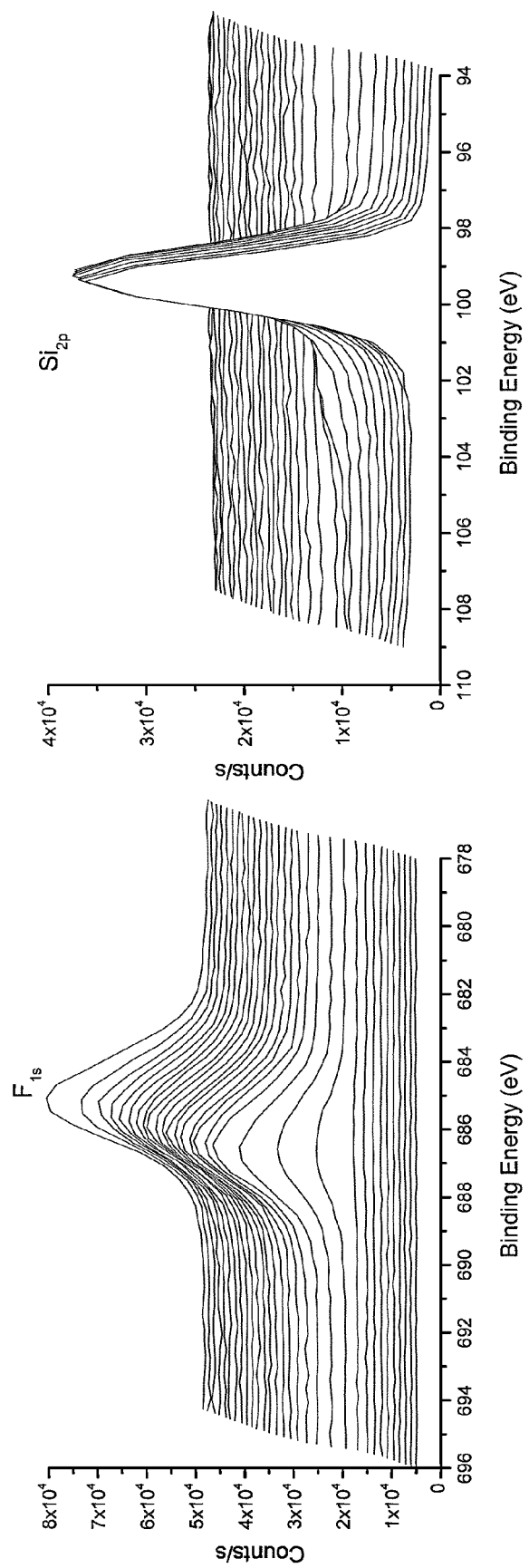
FIG. 12(e) shows F 1s.
FIG. 12(f) shows Si 2p.

XPS spectra of individual elements were taken with respect to their binding energies after removing a portion of the W:Al$_2$O$_3$ composite layer with a sputter rate of (~30 Å/min) and are shown in FIGS. 12(a)-12(f) and summarized in Table 2. The XPS spectral regions of Al 2p (FIG. 12a), O 1s (FIG. 12b), W4f (FIG. 12c), F 1s (FIG. 12d), C 1s (FIG. 12e) and Si 2p (FIG. 12f) signals collected across the sample. Spectral features of Al 2p with BE=75.8 eV and O 1s with BE=532.34 eV are very comparable across the films which confirms a uniform arrangement of Al$_2$O$_3$ surroundings for other elements within the film thickness. Amazingly, W 4f spectral region in FIG. 12(c) shows characteristically strong presence of metallic W throughout layer thickness. These XPS data supports the nanostructures observed in HAADF STEM and HRTEM images (FIG. 11) where 1-2 nm metallic W particles embedded homogeneously in Al$_2$O$_3$ amorphous matrix. The W 4f features of metallic W and tungsten carbides appear at 31.4 eV and 33.4 eV, while those of oxidized W are characterized by peaks at 35.5 and 37.7 eV. The W4f peaks show a small shoulder in between 36-38 ev range and can be associated with evidence of formation of small tungsten oxide that might have formed as a native oxide on W nanoparticles. The XPS spectra of C1s features has a peak position at 283.8 eV in FIG. 12(e) which shows a broadening with weak signal. The source of C signal is from the TMA ALD precursor. We believed that this C1s position at 283.8 eV is mostly due to carbide formation. In this case C may have bonded to the W which can contribute to the very small fraction of formation of WC in the W:Al$_2$O$_3$ composite layer.

TABLE 2

Summary of XPS binding energy regions for W:Al$_2$O$_3$

| Element | XPS reference peak position at BE (ev) taken from | XPS Peak positions form sample at BE (ev) | Possible elemental bonding |
| --- | --- | --- | --- |
| Al2p | 73 | 75.8 | Al in Al$_2$O$_3$ |
| O1s | 531 | 532.3 | O in Al$_2$O$_3$ |
| W4f | 31.4 | 31.6 | Metallic W or WC |
| F1s | 685 | 687.1 | AlF$_3$·3H$_2$O |
| C1s | 284.5 | 283.8 | Carbide, WC |
| Si2p | 99.3 | 99.4 | Si(100) substrate |

Figure 13A:
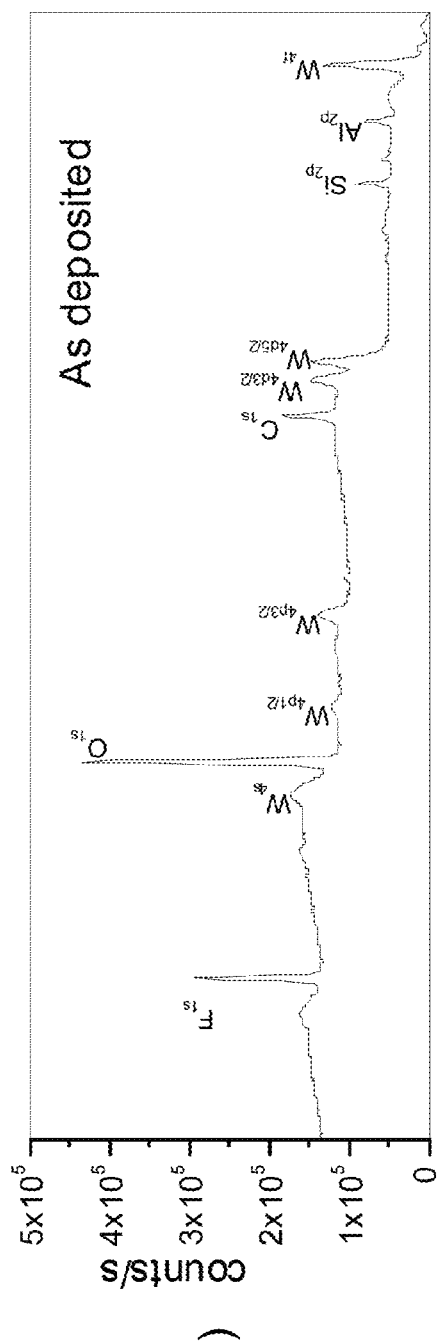
FIG. 13(a) shows an XPS scans of an as grown W:$Al_2O_3$ sample with of (30% W:70% $Al_2O_3$) ALD cycles and FIG. 13(b) after 400° C. annealing in 300 sccm Ar for 4 hours at pressure of 1 Torr.
Figure 13B:
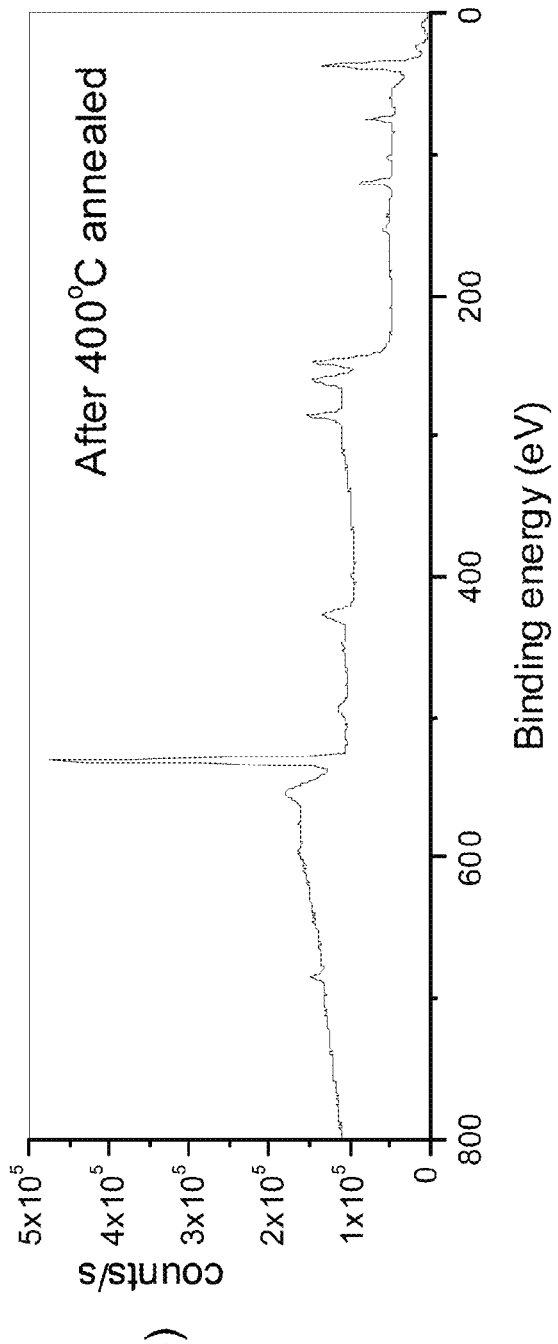
Figure 14A:
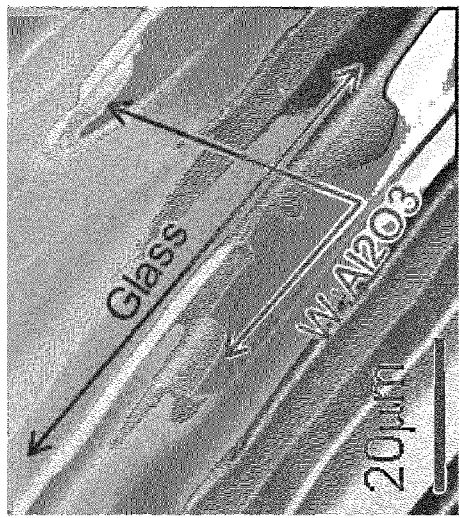
FIG. 14(a) shows microstructure and conformality of the W:$Al_2O_3$ system: scanning electron microscopy (SEM) image of W:$Al_2O_3$ on micro-capillary glass plate substrates.
Figure 14B:
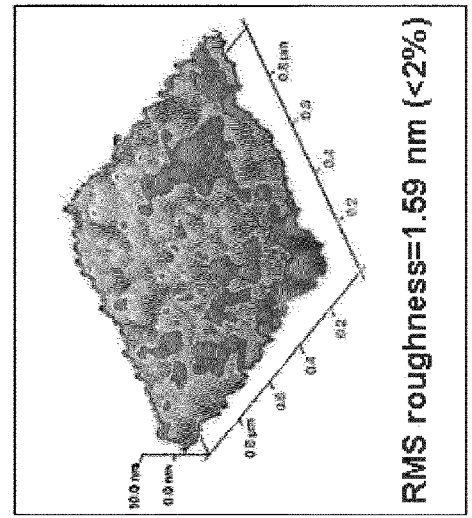
FIG. 14(b) shows a high magnification SEM image from the cross section of glass-capillary pores which shows the presence of a thin layer in the area where micro-capillary glass plate fractured unevenly.
Figure 14C:
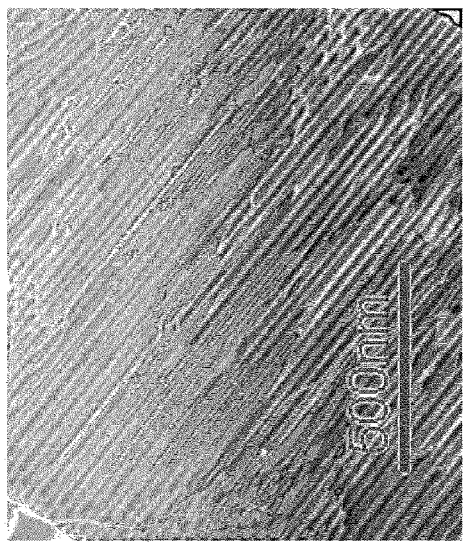
FIG. 14(c) shows a cross section of one of the micro capillary pore walls which show W:Al2O3 deposited uniformly.
Figure 14D:
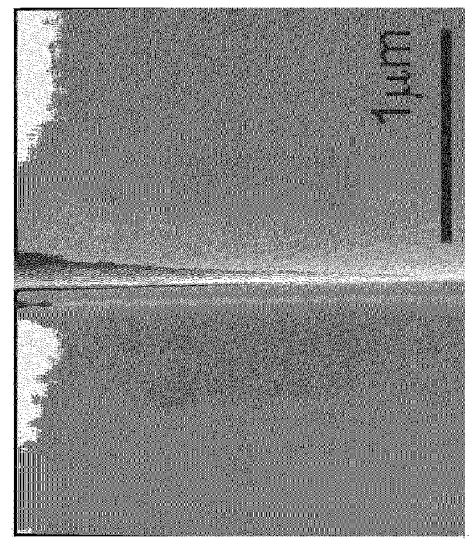
FIG. 14(d) shows an AFM scan on the collated inner surface of the one of the pores.

Evidently, F1s features in FIG. 12(d) are a strong signal and associated with AlF$_3$.3H$_2$O (aluminum fluoride trihydrate). Formation of AlF$_3$.3H$_2$O percentage might have a relationship to the ALD precursors, especially when the TMA and WF$_6$ precursors are pulsed in succession. This particular sample was prepared using (30% W:70% Al$_2$O$_3$) ALD cycle ratio using the ALD precursor cycle sequence of n[x(TMA-H$_2$O)-y(Si2H$_6$—WF$_6$)]. Note that for n[x(TMA-H$_2$O)-y (Si2H$_6$—WF$_6$)] ALD cycle, the WF$_6$ precursor dose will leave WF$_3$ species on the surface; and on top of this we introduced TMA which can produce AlF$_3$ as a reaction by-product which has a very low volatility. Furthermore this AlF$_3$ subsequently is hydrated as a result of a follow-up H$_2$O precursor dose. This could explain the formation of AlF$_3$.3H$_2$O in the film with respect to use of ALD precursors and their sequence. Formation of AlF$_3$.3H$_2$O could also cause different mass uptake when introduced TMA after a WF$_6$ precursor dose. This mass-add on is about twice the mass in comparison to TMA-H$_2$O as shown in FIG. 5. As the thickness of the layer is increased, AlF$_3$.3H$_2$O mass add-on could change. Nevertheless the AlF$_3$.3H$_2$O concentration will depend on n, x, y and the ALD precursor sequence n[x(TMA-H$_2$O)-y(Si2H$_6$—WF$_6$)] for any given ALD condition as a result of the nature of the precursor, especially TMA and WF$_6$ that is used for the W:Al$_2$O$_3$ ALD. After annealing this composite layer the F content reduced to 7.8% compared to the as grown sample F amount (16.5%) shown in FIGS. 13(a) and (b) which represent XPS scans of as grown samples and after 400° C. annealing in Ar for 4 hours at pressure of 1 Torr.

The conformality of the composite W:Al$_2$O$_3$ layer was studied by depositing this layer on the high aspect ratio (AR=60) micro-capillary borosilicate glass plate shown in FIGS. 14(a)-(d). Cross-section SEM analysis confirms the layer was deposited conformally on the wall of the glass pores. As deposited pure Al$_2$O$_3$ (600 A) and W (500 A) layers grown on Si(100) show an AFM root mean squared (RMS) roughness of 5.1 Å and 9.5 Å, respectively. This can be compared to a 650 Å (30% W-70% Al$_2$O$_3$) ALD condition composite sample which shows an RMS roughness of 14.1 Å on Si(100) substrate and 15.9 Å inside of glass capillary pore which is less than 2% of the actual thickness of composite W:Al$_2$O$_3$ layer.

Figure 15B:
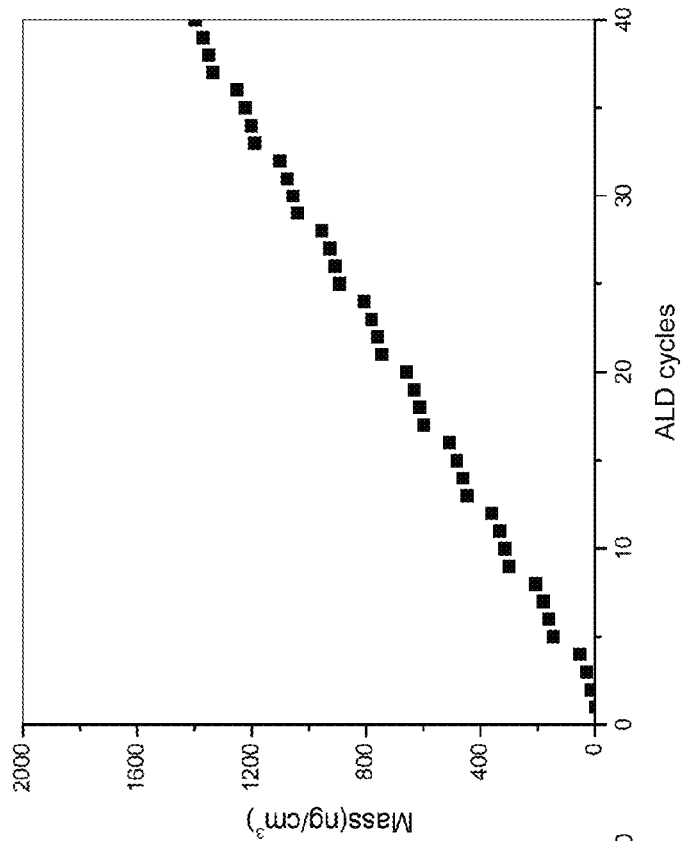
FIG. 15(b) shows calculated mass uptake after each completion of cycle vs. ALD cycle.
Figure 15A:
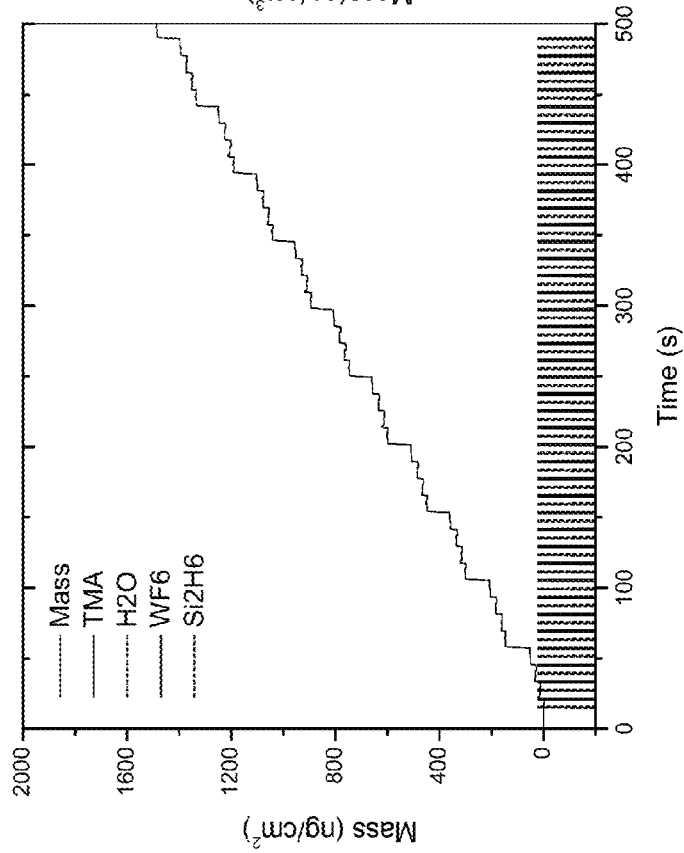
FIG. 15(a) shows mass uptakes on QCM during W:$Al_2O_3$ composite layer grown with (25% ALD W:75% ALD $Al_2O_3$)=3x($H_2O$-TMA)–1x($Si_2H_6$—$WF_6$) precursor exposures sequence; mass uptake versus time with precursor dose times indicated.
Figures 15C, 15D:
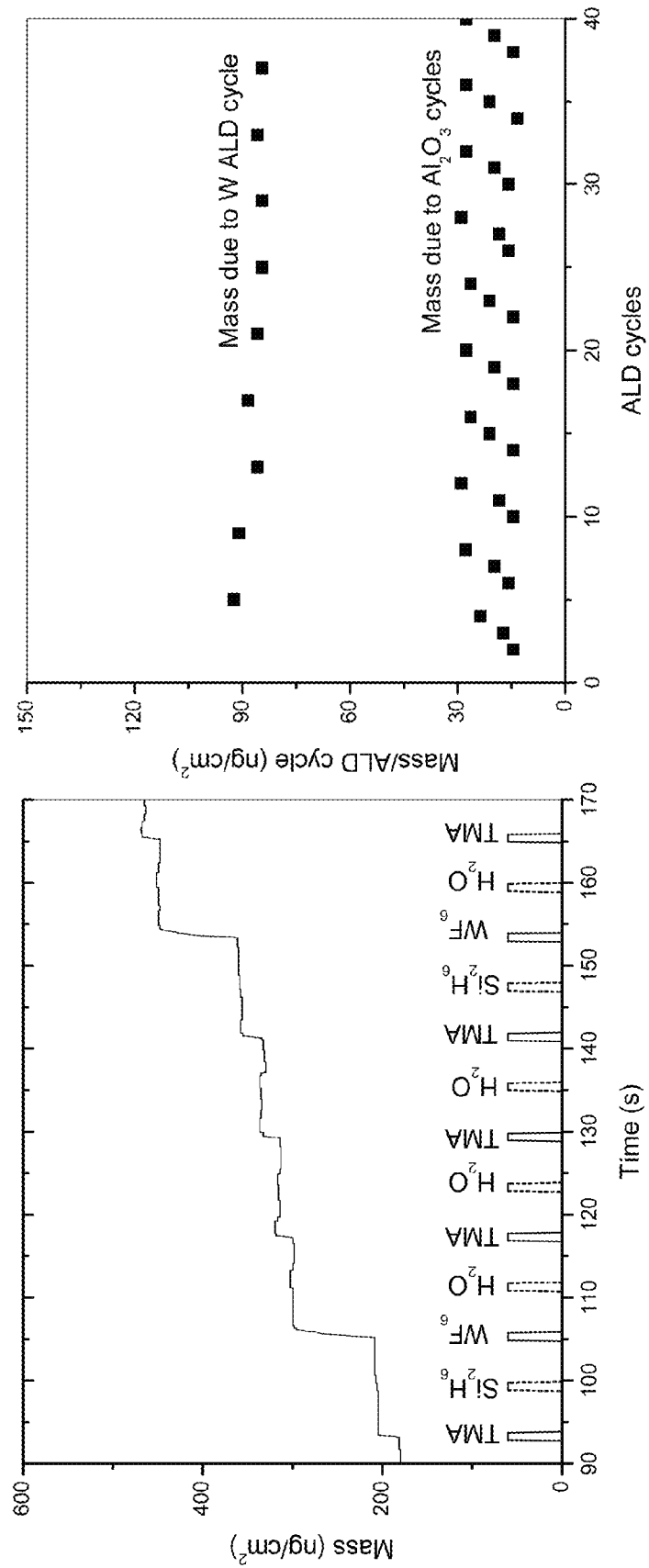
FIG. 15(c) shows one super cycle of 3x($H_2O$-TMA)–1x($Si_2H_6$—$WF_6$) vs. time.
FIG. 15(d) shows calculated mass per ALD cycle vs. ALD cycle.

The precursor sequence in ALD has an important role, and this will define the functional groups present during the subsequent precursor doses. FIGS. 15(a)-(d) display the data from the QCM study performed at 200° C. for (25% W:75% Al$_2$O$_3$) ALD cycle case. This is a simple repetition of an ALD super cycle which includes [3x(TMA-N$_2$—H$_2$O—N$_2$)+1x (Si$_2$H$_6$—N$_2$—WF$_6$—N$_2$)]cycles up to the desired thickness. All precursors were dosed for 1 s and 10 s purge after every precursor dose shown in FIG. 15(a). A linear mass add-on behavior was observed for an ALD super cycle and within the super cycle. Magnification or zoom-in data of one of such a super cycle is shown in FIG. 15(b) which shows the actually mass add-on from each ALD cycle within one super ALD cycle. The calculated mass add-on/ALD cycle from the FIG. 15(a) is plotted as per the ALD cycles shown in FIG. 15(c). This shows liner mass add-on/ALD cycle. Mass uptake for every single ALD cycles is plotted against the number of ALD cycles. FIG. 15(d) shows four distinct mass add-on regions, with the bottom three being masses add-on due to 3x(TMA-N$_2$—H$_2$O—N$_2$) ALD cycles. Top mass add-on was due to 1x(Si$_2$H$_6$—N$_2$—WF$_6$—N$_2$) ALD cycles.

This mass add-on for one super ALD cycle or within the super cycle is significantly lower than the steady state mass uptakes for W and Al$_2$O$_3$ shown in FIGS. 2(a)-2(d) and 3(a)-3(d). The sum of mass uptakes for 3x(TMA-N$_2$—H$_2$O—N$_2$) ~63 nm/cm$^2$ give an average of ~21 nm/cm$^2$ that is ~45% lower than the steady state mass uptakes (37 ng/cm$^2$/ALD cycle) for Al$_2$O$_3$. From the total mass of 3x(TMA-N$_2$—

H$_2$O—N$_2$) ~63 nm/cm$^2$ this corresponds to the ~2 Å of Al$_2$O$_3$ thickness that corresponds to formation of ~¾$^{th}$ monolayer of AlO$_x$ based on the physical thickness of AlO$_x$ monolayer=~2.7 Å. For this particular ALD cycle condition the average mass adds-on/per W ALD cycles after every 3xAl$_2$O$_3$ cycles is ~130 nm/cm$^2$ which is ~7 times lower than the W mass uptake for a steady state ~930 ng/cm$^2$/ALD cycle and gives a growth rate for W ~5 Å. This is an equivalent thickness of W for mass ~130 ng/cm$^2$=~0.7 Å which =⅕$^{th}$ of monolayer thickness of W, based on the physical thickness of monolayer of W ~4 Å with equivalent mass ~745 ng/cm$^2$. It is clear that the W layer will not be continuous and will not form even a monolayer up to 95% of W ALD cycles condition and is supported by mass update data from FIG. 7(a). Nevertheless, this ~0.7 Å layer could deposit clusters of W which may be sub-nanoparticles in size. We believe these QCM mass add-on calculations and the existence of nano size W particles that we observed in HRTEM micrographs support each other. On the other hand, the mass uptakes are very linear and reproducible for each ALD super cycle.

Figure 16:
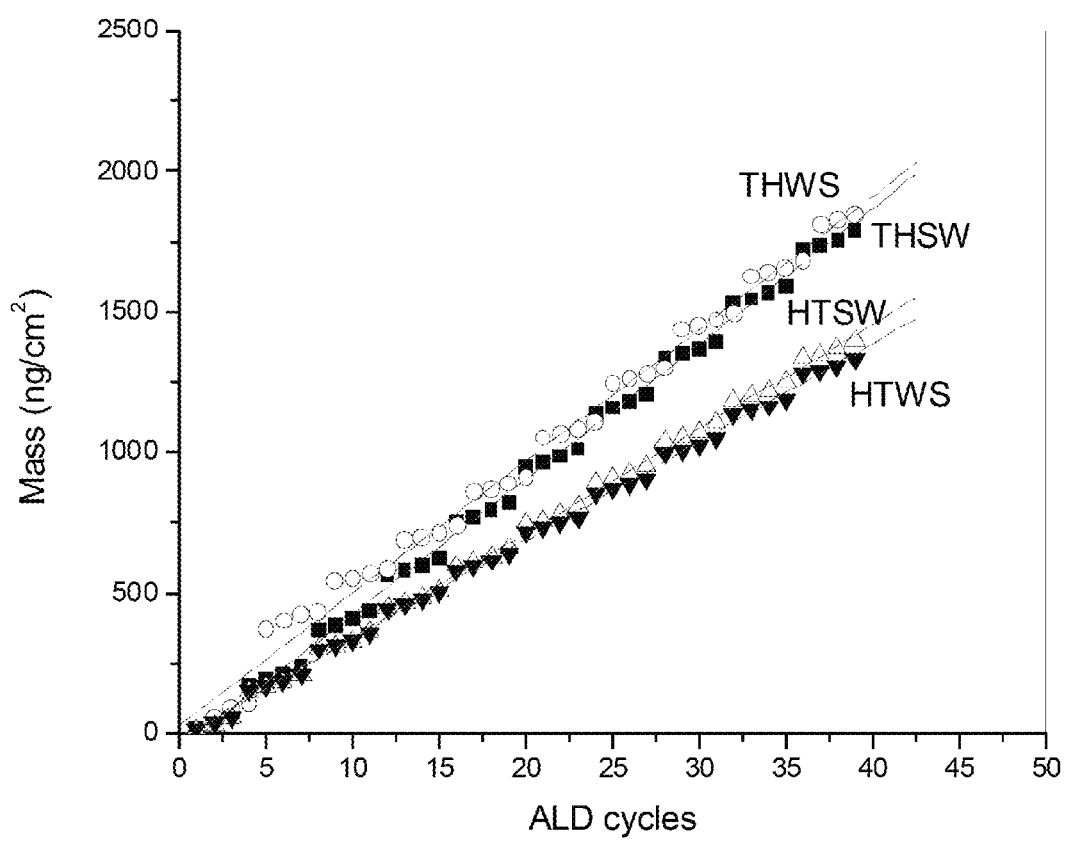
FIG. 16 shows mass add on QCM during W:$Al_2O_3$ composite layer grown with (25% W:75% $Al_2O_3$) ALD cycle condition with variation in the precursor dose sequence in ALD reactor where T=TMA, H=$H_2O$, W=$WF_6$, and S=$Si_2H_6$.

Similar to the FIG. 15(a) data, the add-on for the various ALD precursors sequence for 25% W:75% Al$_2$O$_3$ ALD cycles growth were recorded and summarized as all-in-one in FIG. 16. The mass/per ALD for super ALD cycle are extracted for all the conditions and are summarized in Table 3. The major mass add-on occurs during exposure of TMA and WF$_6$ precursors. Si$_2$H$_6$ exposure on H$_2$O or H$_2$O exposure on Si$_2$H$_6$ has shown very little effect on the mass add-on.

TABLE 3

Mass uptakes on QCM during various ALD cycle precursor sequence

| Layer | Precursors sequence | Notation | Average Mass uptake (ng/cm$^2$/ALD cycle) | | |
|---|---|---|---|---|---|
| Al$_2$O$_3$ | 1x(TMA-H$_2$O) | | 37 | | |
| W | 1x(Si$_2$H$_6$—WF$_6$) | | 930 | | |
| | | | 3xAl$_2$O$_3$ | 1xW | Total |
| W:Al$_2$O$_3$ | 3x(TMA-H$_2$O)-1x(Si2H$_6$—WF$_6$) | THSW | 63 | 129 | 192 |
| W:Al$_2$O$_3$ | 3x(TMA-H$_2$O)-1x(WF$_6$—Si$_2$H$_6$) | THWS | 52 | 136 | 188 |
| W:Al$_2$O$_3$ | 3x(H$_2$O-TMA)-1x(Si$_2$H$_6$—WF$_6$) | HTSW | 62 | 87 | 149 |
| W:Al$_2$O$_3$ | 3x(H$_2$O-TMA)-1x(WF$_6$—Si$_2$H$_6$) | HTWS | 53 | 89 | 142 |

Figure 17A:
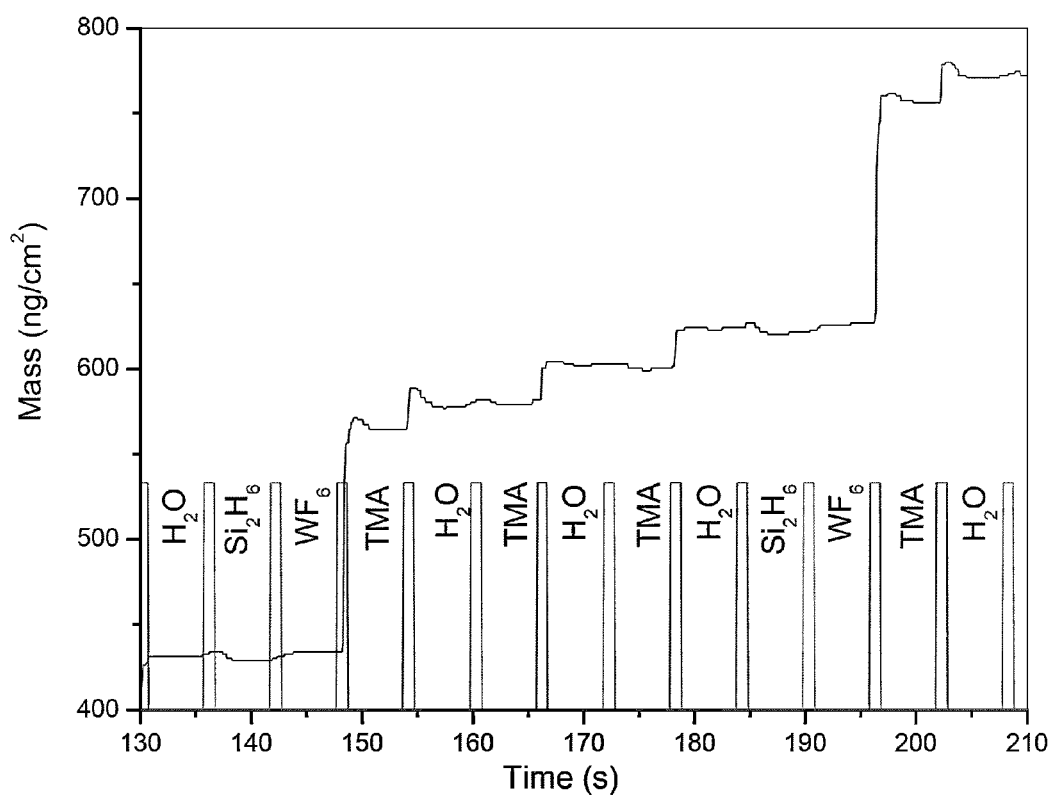
FIG. 17(a) shows QCM mass for one super cycle (25% W:75% $Al_2O_3$) ALD cycle condition for various ALD precursor sequence: THSW.
Figure 17B:
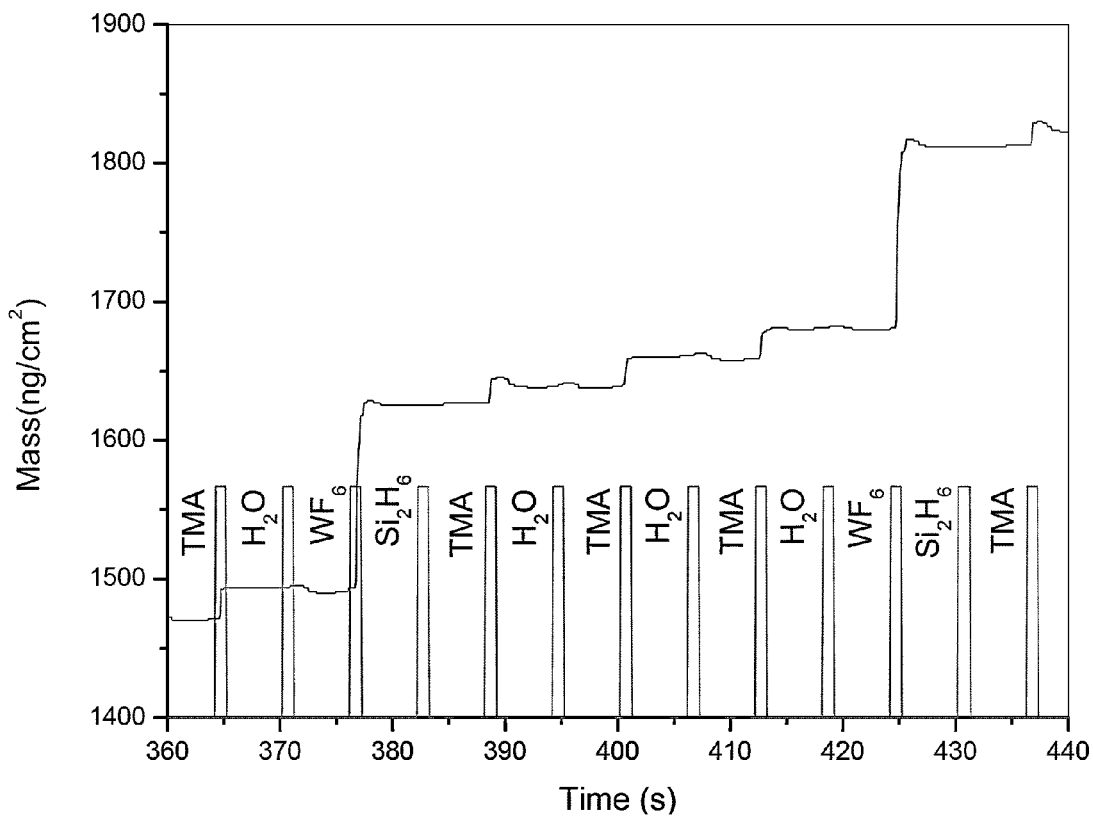
FIG. 17(b) shows THWS.
Figure 17C:
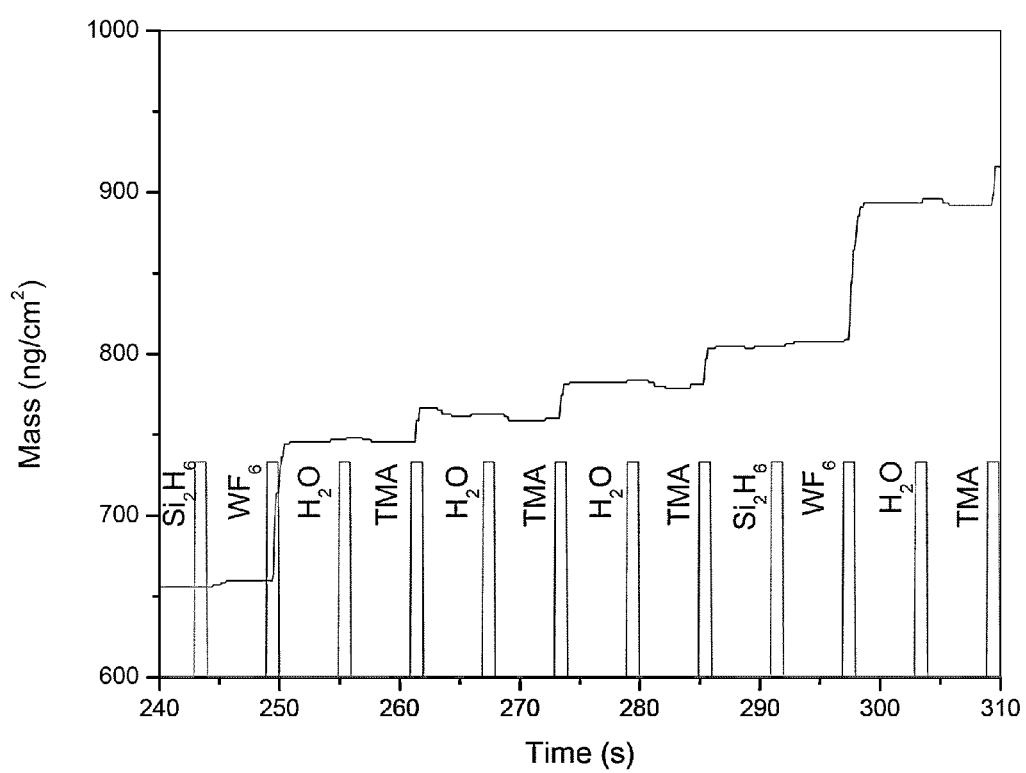
FIG. 17(c) shows HTSW.
Figure 17D:
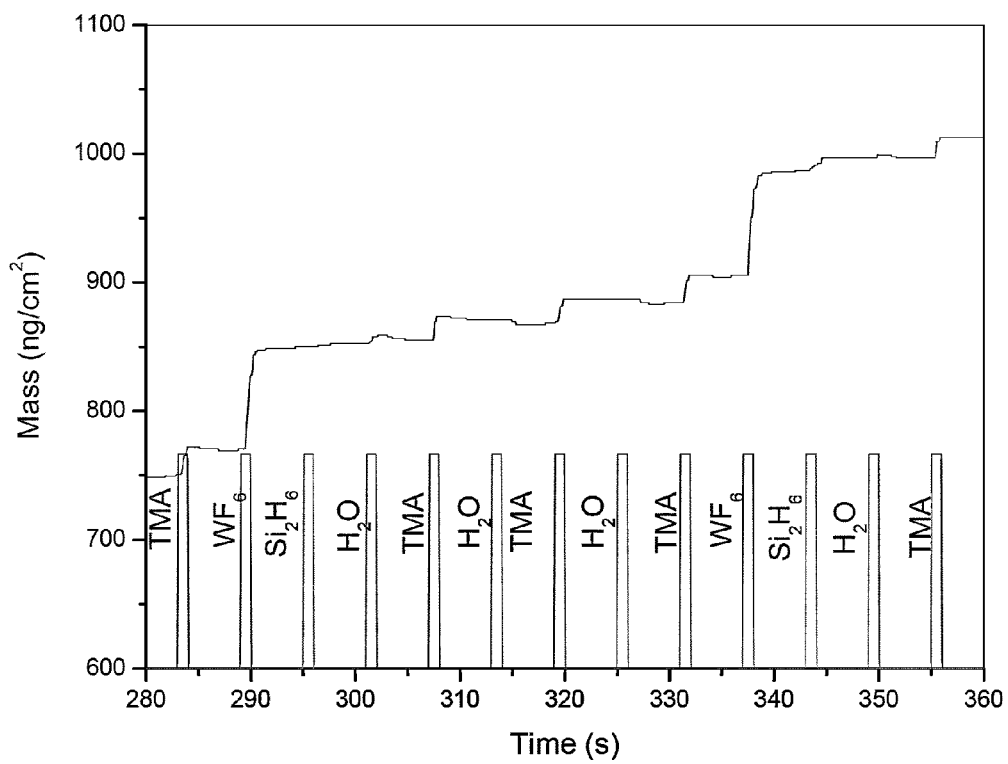
FIG. 17(d) shows HTWS.

A similar mass uptake was noticed for the ALD precursor sequence THWS and THSW and can relate to W growth on —OH rich surface. AlF$_3$.3H$_2$O can cause exposure of TMA on W which actually adds the mass shown in FIGS. 17(a) and (b). In contrast to ALD with THWS and THSW precursor sequence ~25% less mass uptake rate was recorded when ALD was performed with a HTWS and HTSW precursor sequence in ALD cycle. This lesser mass uptake can be linked to the W growth on —Al(CH$_3$) rich surface and to after W exposure of H$_2$O precursor which did not add any mass in both HTWS and HTSW as shown in FIGS. 17(c) and (d).

Figure 18:
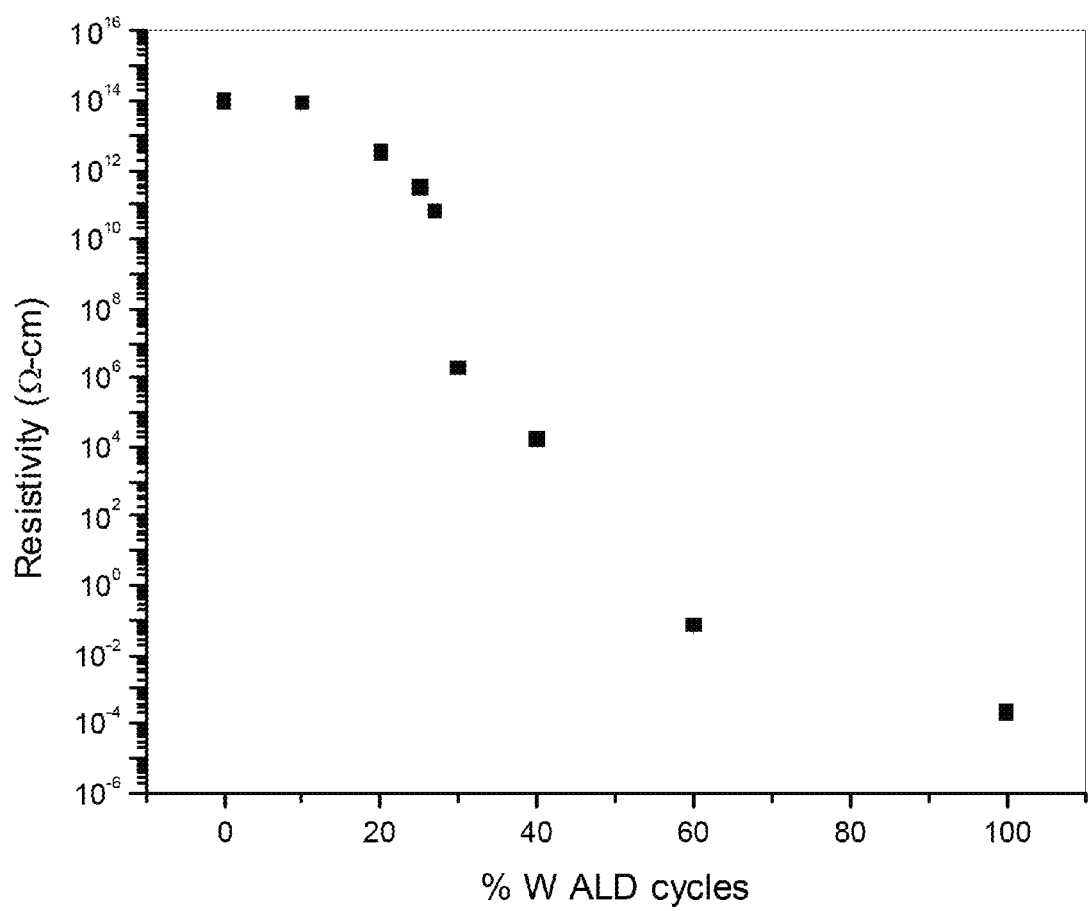
FIG. 18 shows resistivity of W:$Al_2O_3$ composite layers as a function of % W ALD cycles with all the other parameters kept identical and the sequence of precursor=[x(TMA-$H_2O$):y($Si_2H_6$—$WF_6$)] where y/(x+y)*100 is varied between 0-100.

Current-Voltage (I-V) characteristics of the W:Al$_2$O$_3$ with various compositions were measured. FIG. 18 represents the measured resistivity from an I-V analysis vs. % of W ALD cycles in W:Al$_2$O$_3$ composites. A wide span of resistivity was observed and resistivity decreases rapidly when % W ALD cycles increased in W:Al$_2$O$_3$ composite growth. This type of controlled tunable resistive coating was applied as a resistive layer for a microchannel plate and can be used in photodetection applications, as well as in other applications previously cited herein.

Transverse ($\perp$) characteristics were determined by appropriate contacts where the electric field is perpendicular and longitudinal ($\parallel$) characteristics where the electric field is parallel to the W:Al$_2$O$_3$ composite layers I-V. In the longitudinal measurement the high surface area microchannel plate was used as well as a lithographically patterned, interdigitated comb structure comprised of gold lines contained 80000 sq and 2 μm spacing. For transverse measurements a TiN deposited Si substrate was used which makes bottom contact; and a top contact was made with a Hg drop set-up with dot size of about 812 μm.

Figure 19:
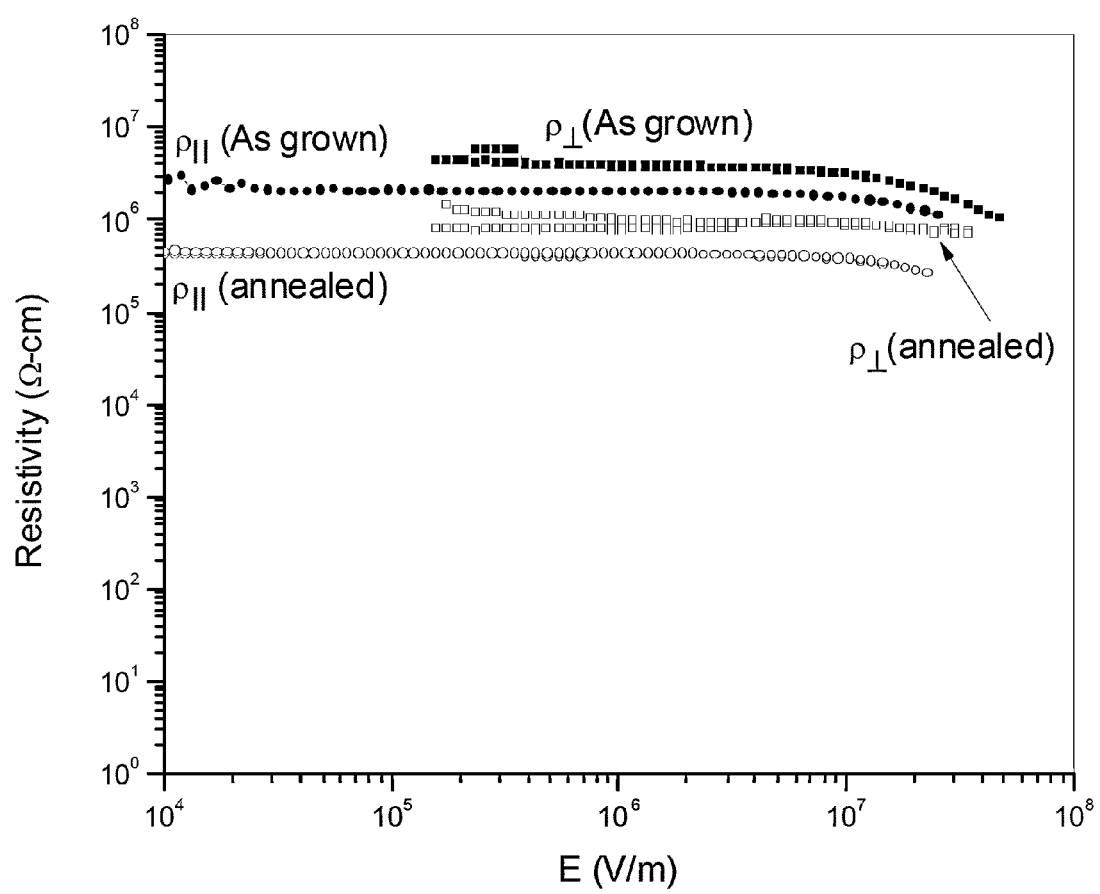
FIG. 19 shows transverse (⊥) and longitudinal (∥) resistivity data for the as deposited and 400° C. annealed in Ar samples of W:$Al_2O_3$ composite layer deposited with (30% ALD W:70% ALD $Al_2O_3$)

In FIG. 19 the transverse and longitudinal resistivities were plotted against the electric field for W:Al$_2$O$_3$ layer deposited with the 30% W ALD cycle condition sample from FIG. 18. Both transverse and longitudinal resistivity show slight differences. Annealing this sample at 400° C. in 300 sccm argon at 1 Torr for 4 hours resulted in both transverse and longitudinal resistivity decreasing by nearly one order of magnitude. In both the as-grown and annealed condition measurements transverse resistivity is slightly higher than the longitudinal resistivity. Resistive values vs. field shows more or less a flat response up to electric field ~10$^7$V/m and follows the rapid decrease in resistivity as field increases which can correlate to a conduction mechanism in the layer.

The possibility of Fowler-Nordheim tunneling mechanism here is low because it normally requires very high electric field (E) for reasonable conduction which is about ~1 GV/m. Instead of this conduction for the W:Al$_2$O$_3$ composite it is likely to occur through one of the two predominant conduction mechanisms for insulators, Frankel-Poole (FP) emission, which has the following form, $$J \propto E \exp(-q(\phi_b-(qE/\pi\epsilon)^{1/2}/k_BT)) \quad (1)$$

or Space-Charge Limited (SCL) emission, which at high field is $$J \sim \epsilon\mu(V^2/L^3) \quad (2)$$

These two mechanisms have different IV behavior. At lower field the IV curve follows linear ohm's law (V=IR) whereas the I-V curve of FP emission is characterized by a straight line at large E on a semi-log plot of J/E vs. E$^{1/2}$. In contrast to this the IV curve of SCL emission has a second order dependence on E. In addition to this only FP emission will show the temperature dependence, whereas both SCL and FN tunneling will not.

Figure 20A:
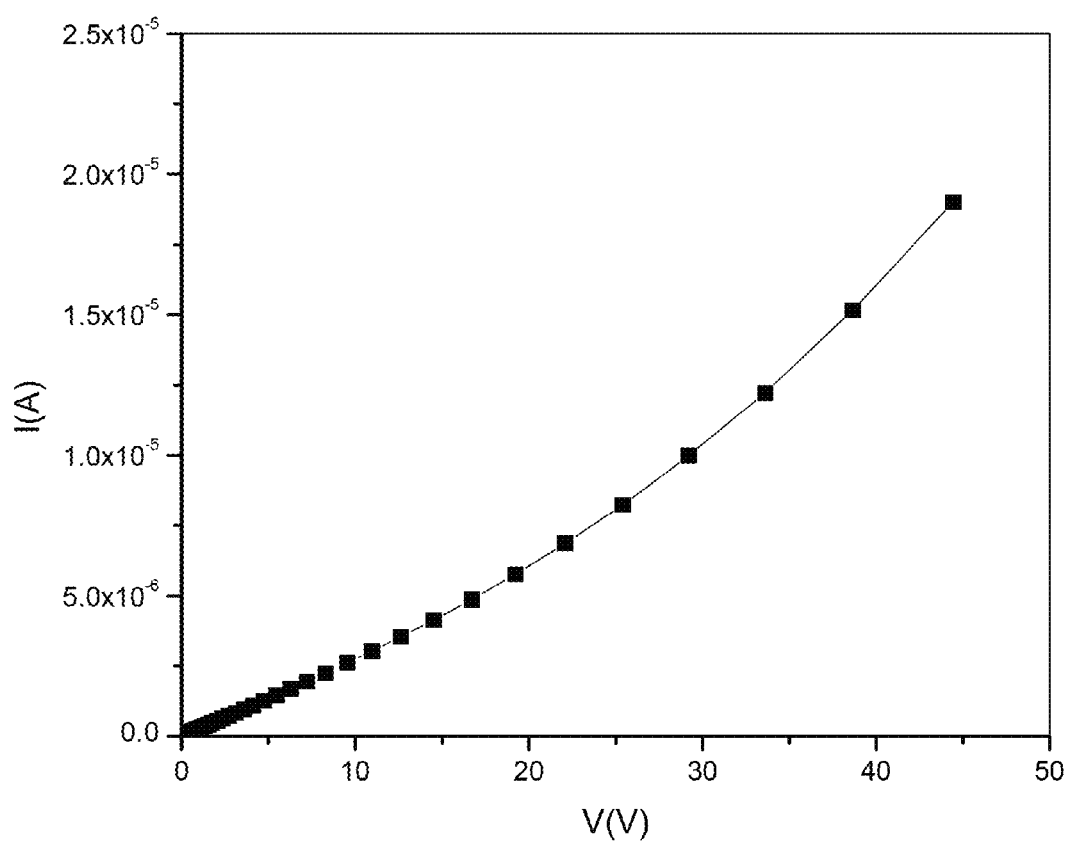
FIG. 20(a) shows a current-voltage (IV) curve of a film.
Figure 20B:
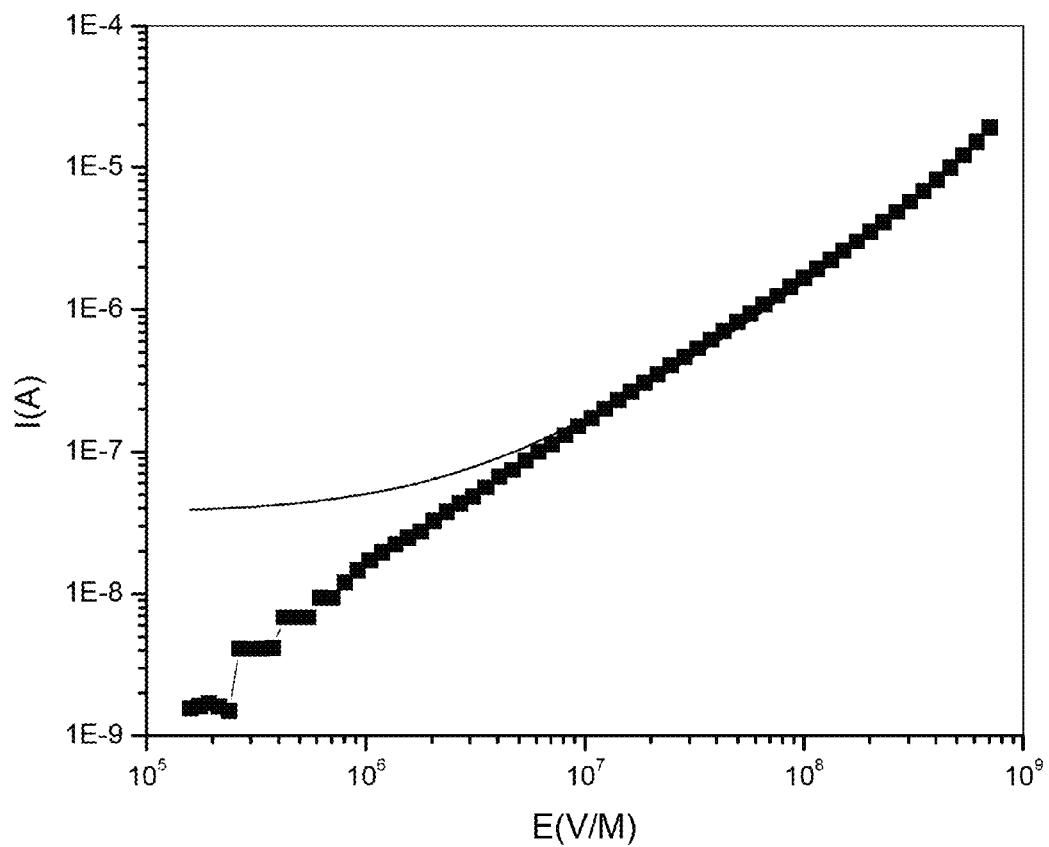
FIG. 20(b) shows log(I/E) vs. log(E)
Figure 20C:
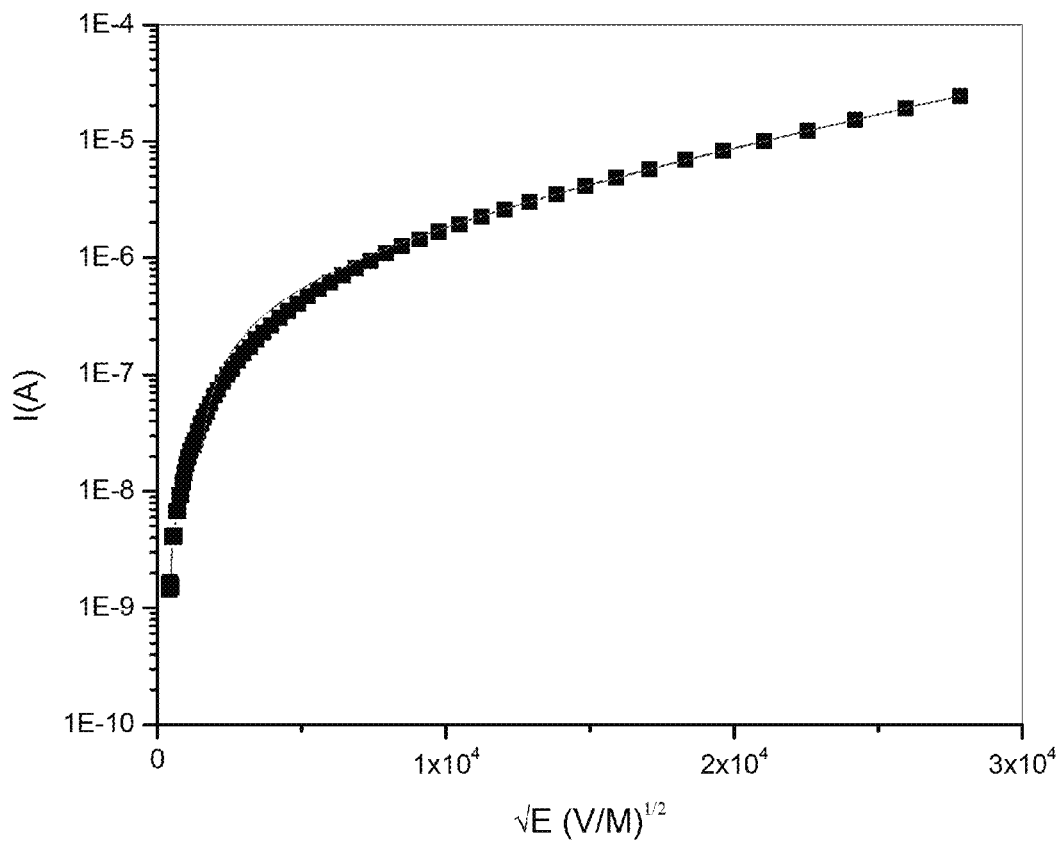
FIG. 20(c) shows on a semi-log scale TIE vs. $E^{1/2}$ where E=V/M and M is film thickness.

FIGS. 20(a)-20(d)(2) represent electrical measurements for a W:Al$_2$O$_3$ layer grown with a 30% W ALD cycle condition, IV curve of a film in FIG. 20(a) for log(J/E) vs. log(E) 20(b), on a semi-log scale J/E vs. E$^{1/2}$ in FIGS. 20(c), and in 20(d) data fitting at low and high field with two different fits (at low field a linear least-square fit and exponential fit).

Lower field data follows Ohm's law for J vs. E. At high electric fields the data forms a line which is consistent with the FP emission mechanism.

To establish straight SCL emission characteristics, the data is plotted on a log-log scale FIG. 20(b) and J/E did not show $2^{nd}$ order dependence on E. Also we noticed that the electrical behavior of the film was dependent on temperature (discussed later and shown in FIGS. 21(a) and (b)). As a result it is likely that the electron transport in W:$Al_2O_3$ composite layer is FP emission, and not SCL emission.

Figure 21A:
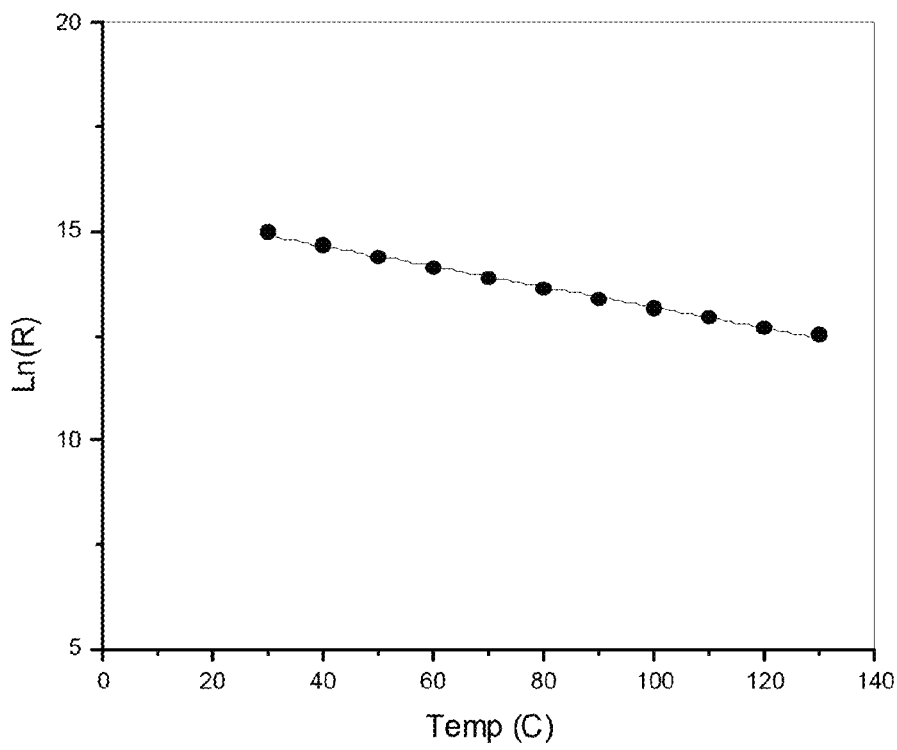
FIG. 21(a) shows ln(R) vs. Temperature where R is resistance

I-V behavior in the temperature range 30-130° C. were measured for (30% W:70% $Al_2O_3$) ALD cycle case sample. The resistance at different temperatures are shown in FIG. 21(a) and plotted per the known Steinhart-Hart equation. A linear fit to this data give a negative slop which is a temperature coefficient of resistance=–0.024 for The W:$Al_2O_3$.

Figure 21B:
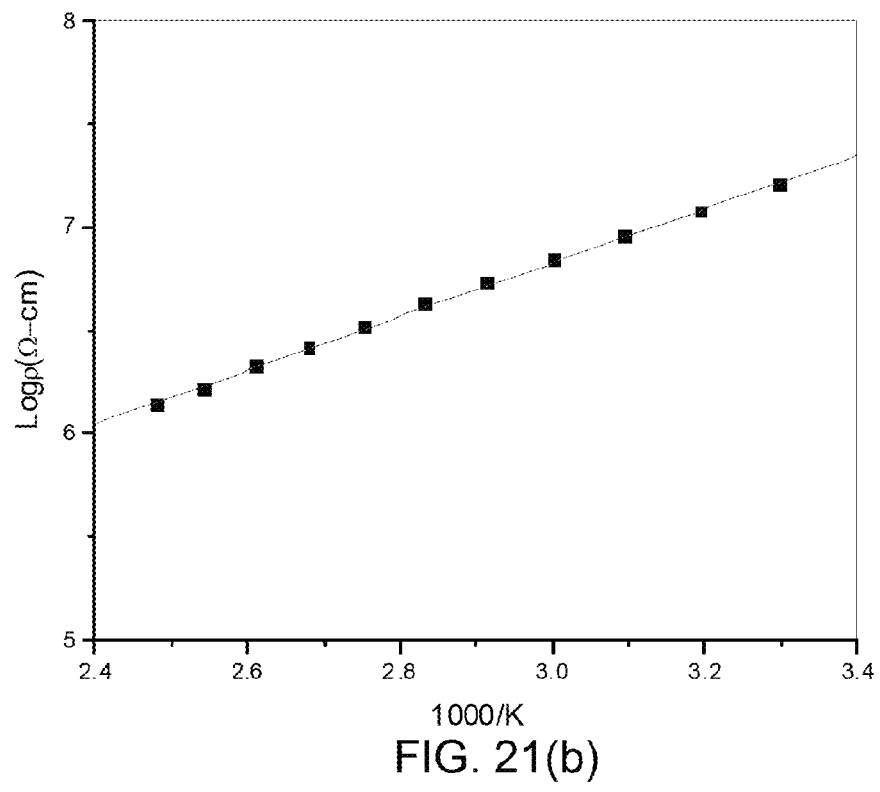
FIG. 21(b) shows log(resistivity) vs. 1/temperature for W:$Al_2O_3$ composite layer deposited with (30% ALD W:70% ALD $Al_2O_3$)

The W:$Al_2O_3$ composite layer shows a negative temperature coefficient of resistance (PTCR) effect from 30° C. to 130° C. The PTCR effect is a very common phenomenon observed in semiconducting layers. FIG. 21(b) shows log(R) vs. 1/T plots for the W:$Al_2O_3$ composite layer films on comb structure wafer substrates. The IV data were collected from room temperature (300 K) to 403K. The films show resistivities of the order of 3.2 to 0.27 MΩ-cm over this temperature range. The straight-line nature of the Arrhenius plots indicates thermally activated conduction, as often found in semiconductors. From the slope of the curves the values of the activation energy (Ea) are obtained, which correspond to the minimum energy required to transfer electrons from the donor level to the conduction band. Values of $E_a$ obtained are 110 meV. This thermal coefficient and activation energy data are useful in for thermistor and MEMS devices.

In another embodiment of the invention involving Mo:$Al_2O_3$ (or MoAlO$_x$) the Mo:$Al_2O_3$ composite layer depositions were preferably carried out in a hot wall viscous flow reactor ALD reactor. The Mo:$Al_2O_3$ composite films were deposited on n-type Si(100), fused quartz, glass substrates and high aspect ratio (60:1) borosilicate glass micro-capillary plates. Prior to ALD processing all the substrates were degreased using a 10 min dip ultrasonic acetone cleaning. For $Al_2O_3$ growth, Al(CH$_3$)$_3$ [TMA] was obtained from Sigma-Aldrich with a 97% purity and deionized (DI) H$_2$O vapor was used as a precursors. For Mo ALD, molybdenum hexafluoride (MoF$_6$, Alfa Aser, 99.9%) and disilane (Si$_2$H$_6$, Sigma-Aldrich, electronic grade 99.995%) were used as precursors. All precursors were maintained at room temperature at ~20° C. The background N$_2$ flow was set to 300 sccm which gives base pressure of 1.0 Torr in the ALD reaction chamber was measured by a heated MKS Baratron 629B model. The precursors TMA and H$_2$O were alternately pulsed in the continuously flowing N$_2$ carrier flow using high speed computer controlled pneumatics valves in a desire ALD sequence. During TMA and H$_2$O dosing, pressure transient increases of 0.2 Torr for TMA and 0.3 Torr for H$_2$O when the reactants were introduced into N$_2$ carrier flow nitrogen carrier flow. Similarly, MoF$_6$ and Si$_2$H$_6$ precursors were alternately injected into N$_2$ carrier flow. During the Si$_2$H$_6$ and MoF$_6$ dosing, pressure transient increases of 0.25 Torr for Si$_2$H$_6$ and 50 mTorr for MoF$_6$. The main experimental conditions for ALD are summarized in Table 4.

TABLE 4

Experimental conditions for Mo:$Al_2O_3$

| No. | Parameters | Values |
|---|---|---|
| 1 | Precursors for $Al_2O_3$ | TMA and H$_2$O |
| 2 | Precursors for Mo | Si$_2$H$_6$ and MoF$_6$ |
| 3 | Number of ALD cycles for Mo:$Al_2O_3$ | Varied depend on desired thickness |
| 4 | Deposition temperature | 100-400° C. |
| 5 | Ratio of Mo:$Al_2O_3$ | Varied depend on the desired resistivity |
| 6 | Monitor Substrates | Quartz, Si(100), MCP, comb structures, Mo, Au TiN |
| 7 | ALD cycles | The purge and dose time adjusted according to desired resistivity |

The thicknesses of MoAlO$_x$ layers were determined using spectroscopic ellipsometry measurements on the Si monitor coupons. Annealing of MoAlO$_x$ composite layers were performed at 400° C. in 500 sccm flowing Ar condition for 4 hrs. at pressure of 1 Torr. The film thicknesses were measured using ex-situ ellipsometry and supported by cross-section scanning electron microscopy (SEM) analysis and transmission electron microscopy (TEM). The microstructure and conformality of MoAlO$_x$ layer coatings on Si substrates and high aspect ratio glass micro-capillary plates were examined by cross-sectional scanning electron microscopy (SEM) model Hitachi 4700. The electrical I-V characteristics and thermal coefficient of resistance (TCR) of MoAlO$_x$ layers were measured using a Keithley Model 6487 pA/V source. Electrical measurements were done using either micro probes or Hg-probe contact method. The resistance stability test was performed for several days under constant applied potential in vacuum.

Figure 22:
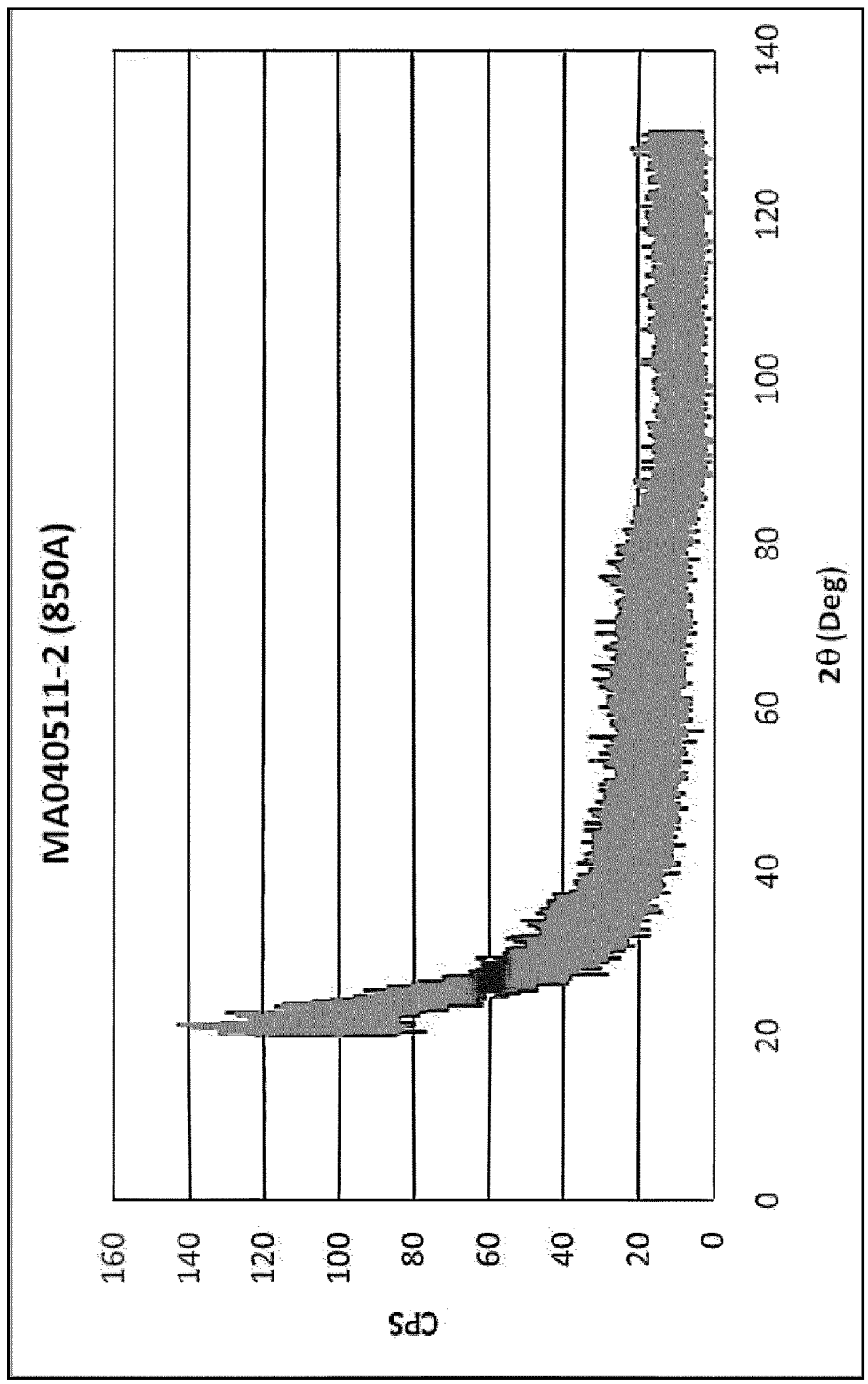
FIG. 22 shows an X-ray diffraction scan of an as-deposited Mo:$Al_2O_3$ composite layer deposited with (8% ALD Mo:92% ALD $Al_2O_3$)

X-ray diffraction (XRD) analysis was performed to test deposited materials crystallinity or preferred any crystallographic phase. X-ray diffraction of as deposited MoAlO$_x$ layers deposited with 8% Mo ALD cycles shows an amorphous structure (see FIG. 22).

Figure 23B:
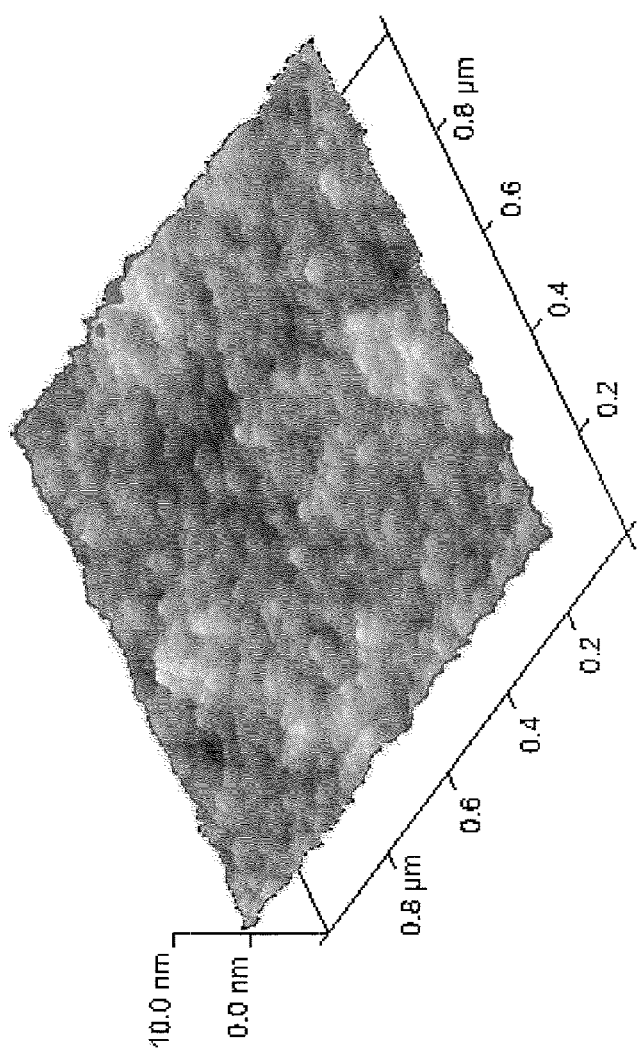
FIG. 23(b) shows a surface view of the AFM image.
Figure 23A:
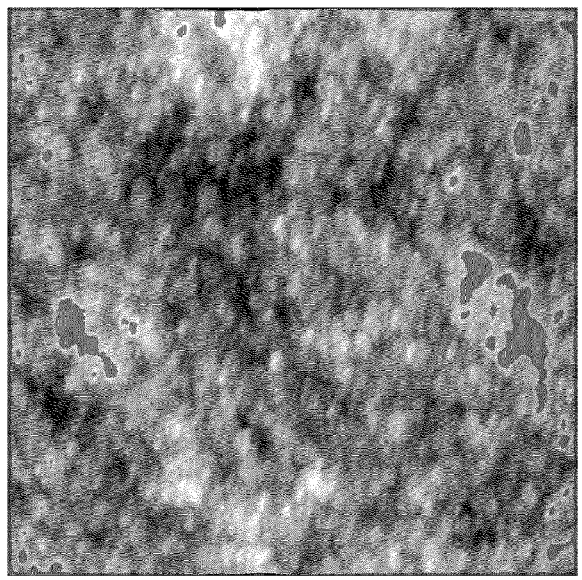
FIG. 23(a) shows AFM images of an ALD Mo:$Al_2O_3$ tunable resistance composite layer deposited with (8% ALD Mo:92% ALD $Al_2O_3$)

To evaluated the microstructure, surface roughness and uniformity of the deposited MoAlOx materials. AFM analysis (shown in FIGS. 23(a) and (b)) of ALD MoAlO$_x$ tunable resistance coating prepared using 8% Mo cycles. with a thickness of 910 Angstroms on borosilicate substrate. The film surface is very smooth and shows only fine, nanoscale features. The RMS roughness is 0.634 nm for 91 nm film.

Figure 24B:
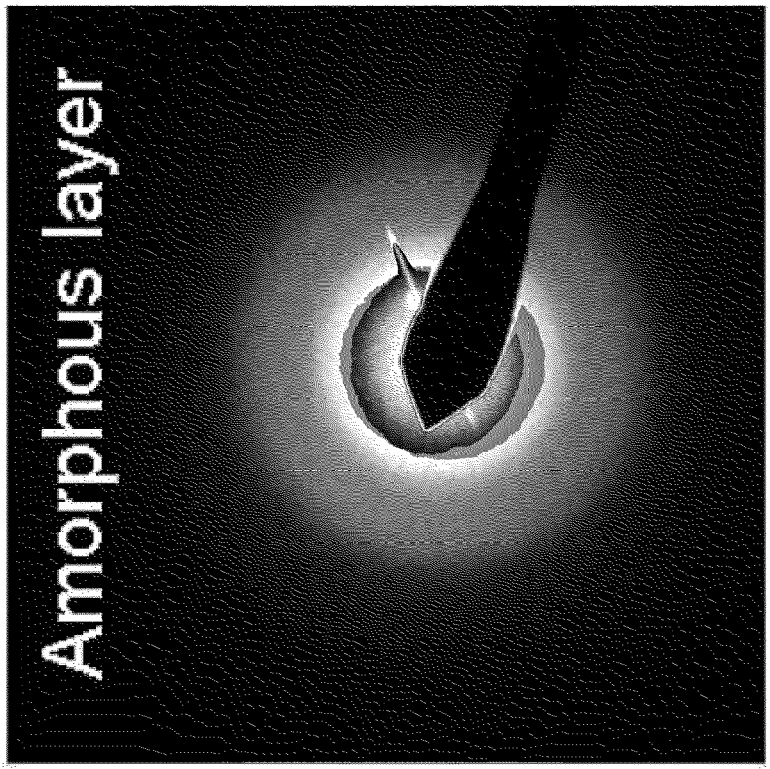
FIG. 24(b) shows a corresponding nano-beam diffraction pattern.
Figure 24A:
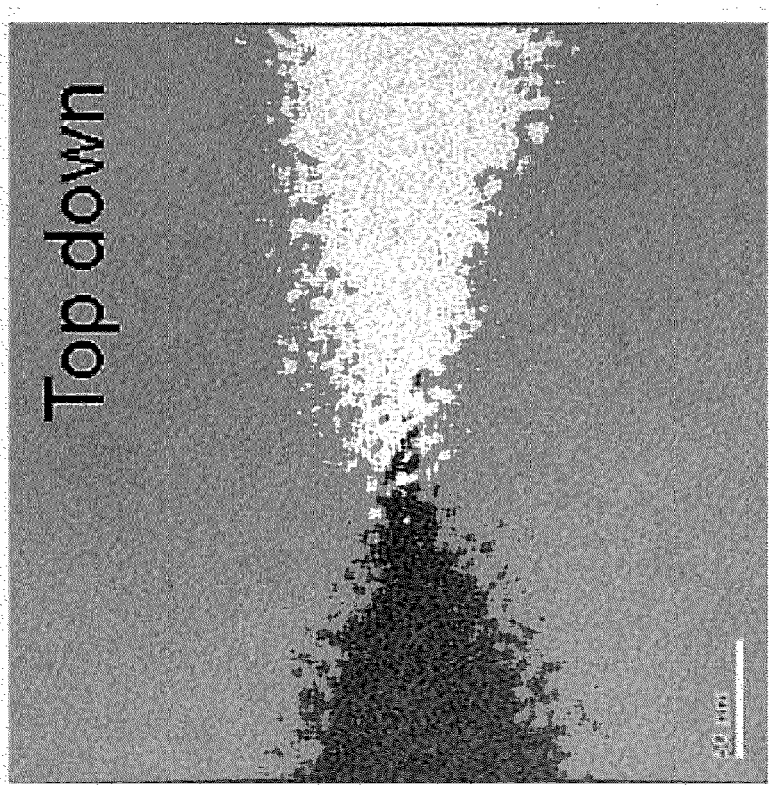
FIG. 24(a) shows a top down TEM image of an ALD Mo:$Al_2O_3$ tunable resistance composite layer deposited with (8% ALD Mo:92% ALD $Al_2O_3$) with a thickness of 760 Angstrom on a Si substrate.

To evaluated the across the layer microstructure, uniformity and crystallinity of the deposited materials MoAlOx films were analyzed with TEM. Top down transmission electron microscopy (TEM) image FIG. 24(a) was performed on an ALD MoAlO$_x$ tunable resistance coating prepared using 8% Mo cycles with a thickness of 760 Angstroms on Si substrate. This image shows a uniform film and the TEM bright field image FIG. 24(b) confirms an amorphous layer deposited under these conditions which is desirable for the many microelectronics applications.

The cross section transmission electron microscopy (XTEM) images of FIGS. 25(a)-(c) show an ALD MoAlO$_x$ unable resistance coatings prepared using 8% Mo cycles with a thickness of 760 Angstroms on Si substrate. These images illustrate the pinhole free film on Si substrate which contains nanoparticles of Mo embed in amorphous $Al_2O_3$ matrix.

Figure 27A:
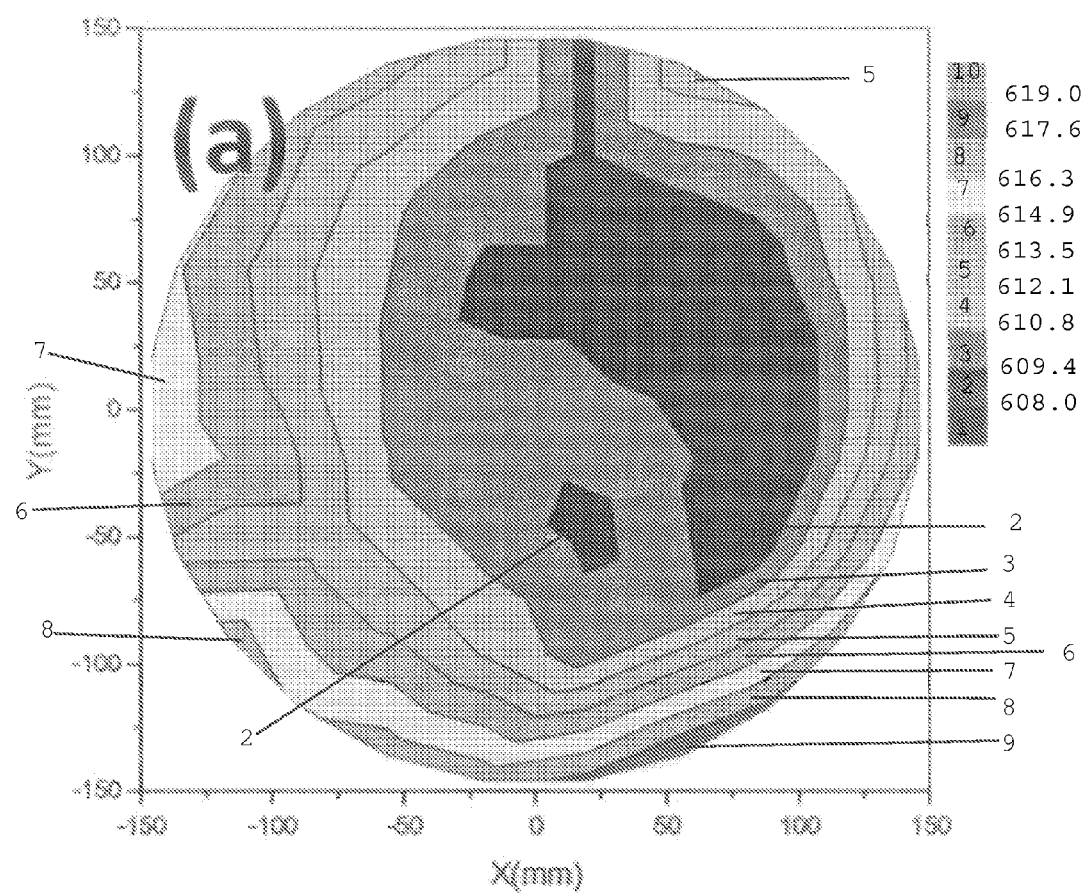
FIG. 27(a) shows a thickness contour map for 400 cycles with 5% Mo.
Figure 27B:
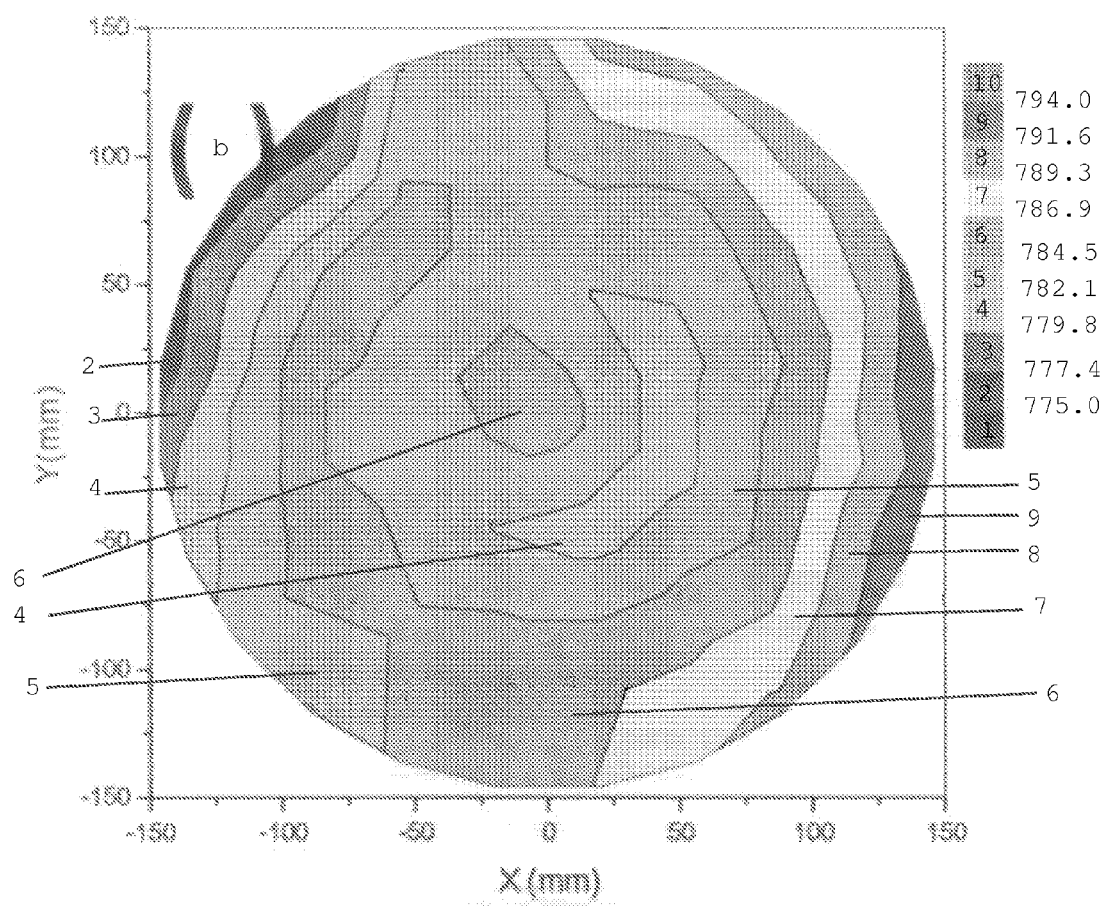
FIG. 27(b) shows refractive index for FIG. 27(a)
Figure 27C:
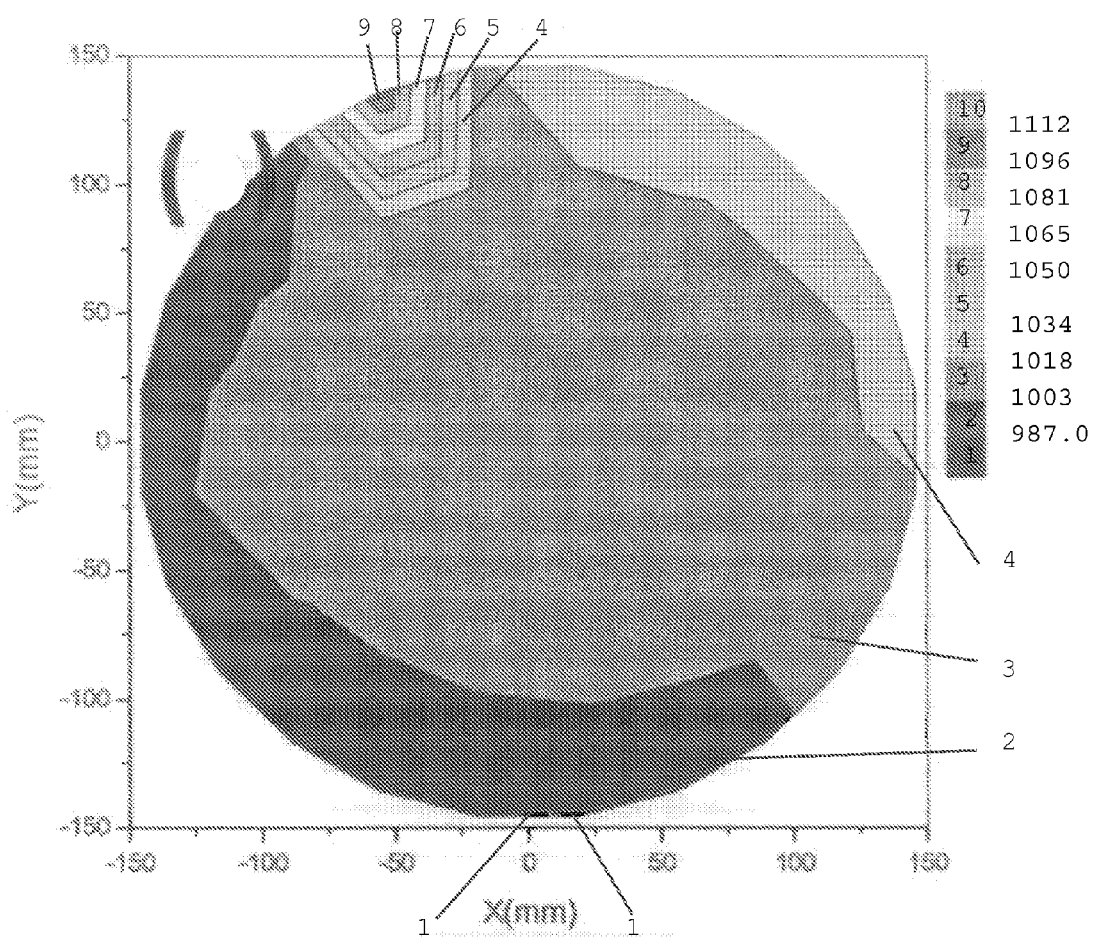
FIG. 27(c) shows contours for 8% Mo.
Figure 27D:
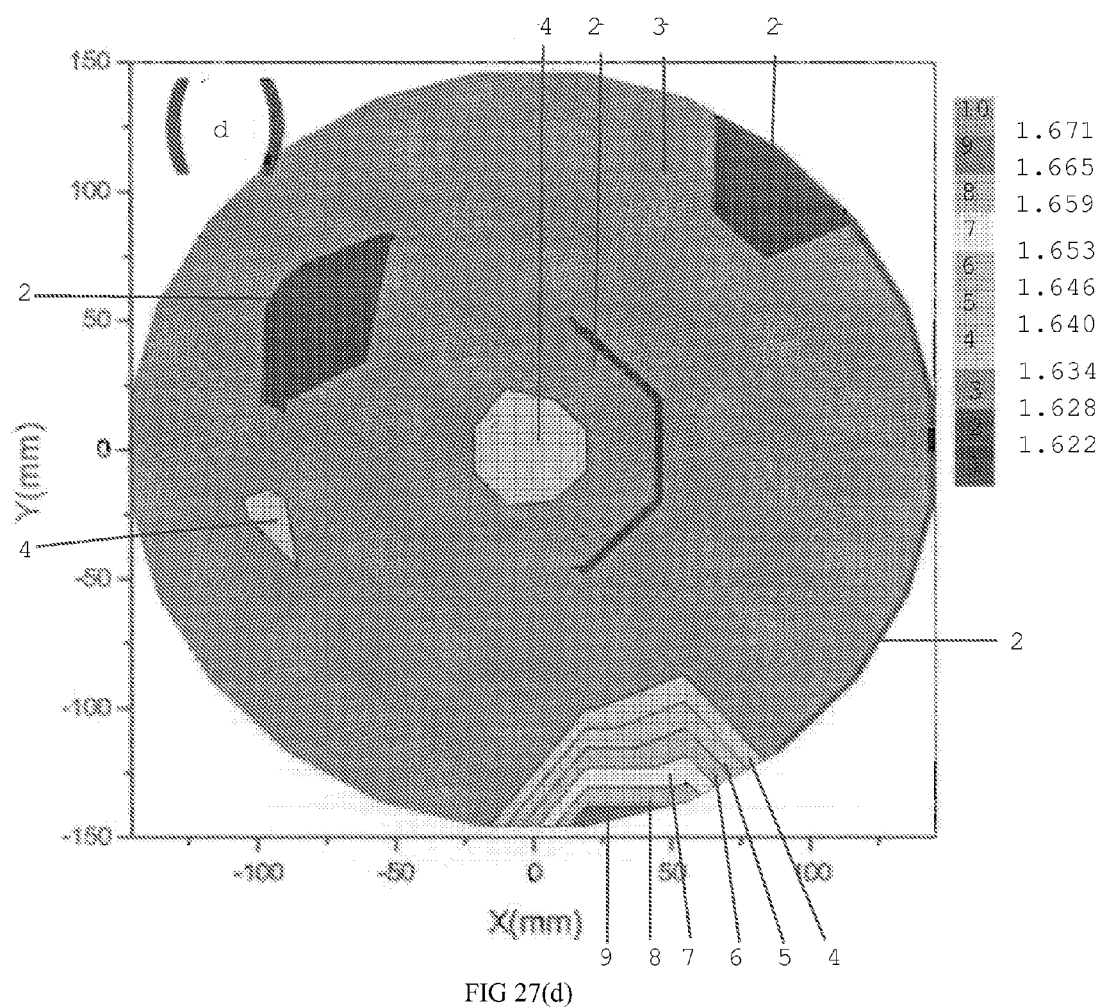
FIG. 27(d) shows refractive index for 27(c)
Figure 27E:
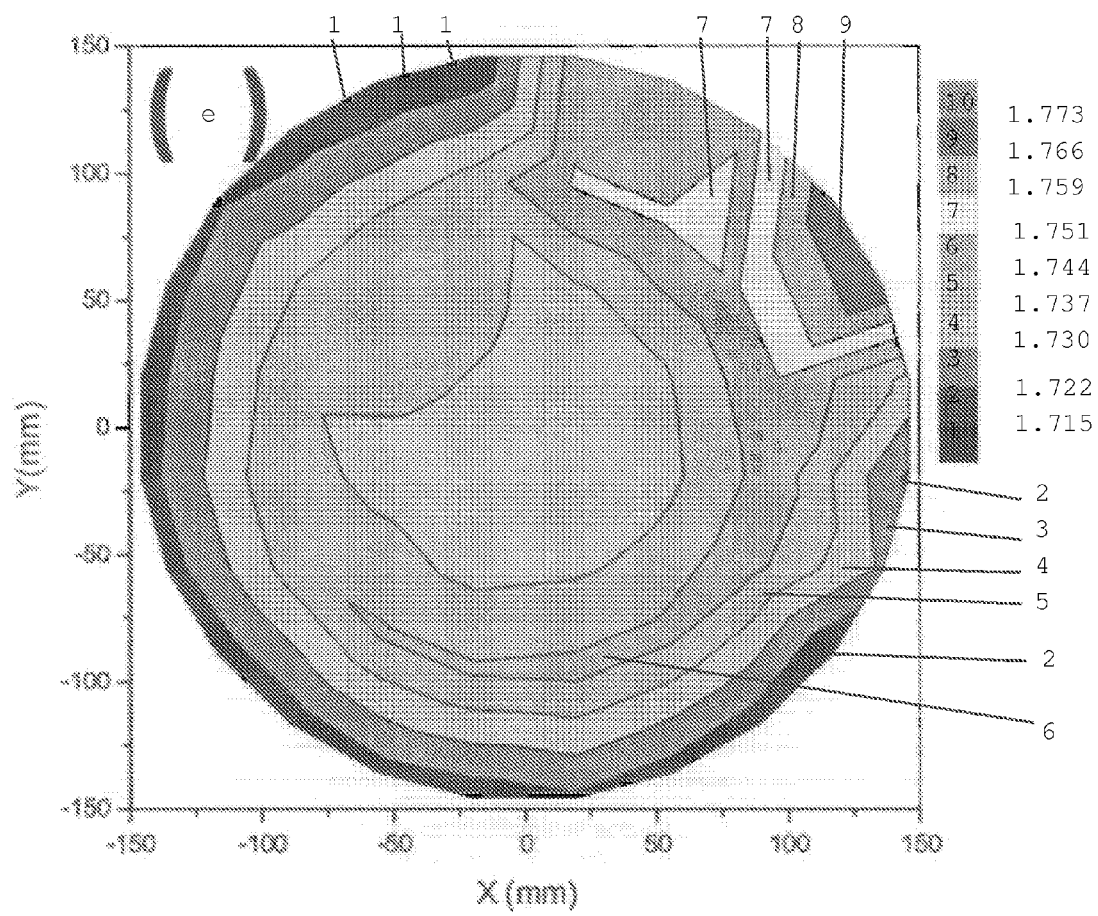
FIG. 27(e) contours for 12% Mo and FIG. 27(f) refractive index for 27(e)
Figure 27F:
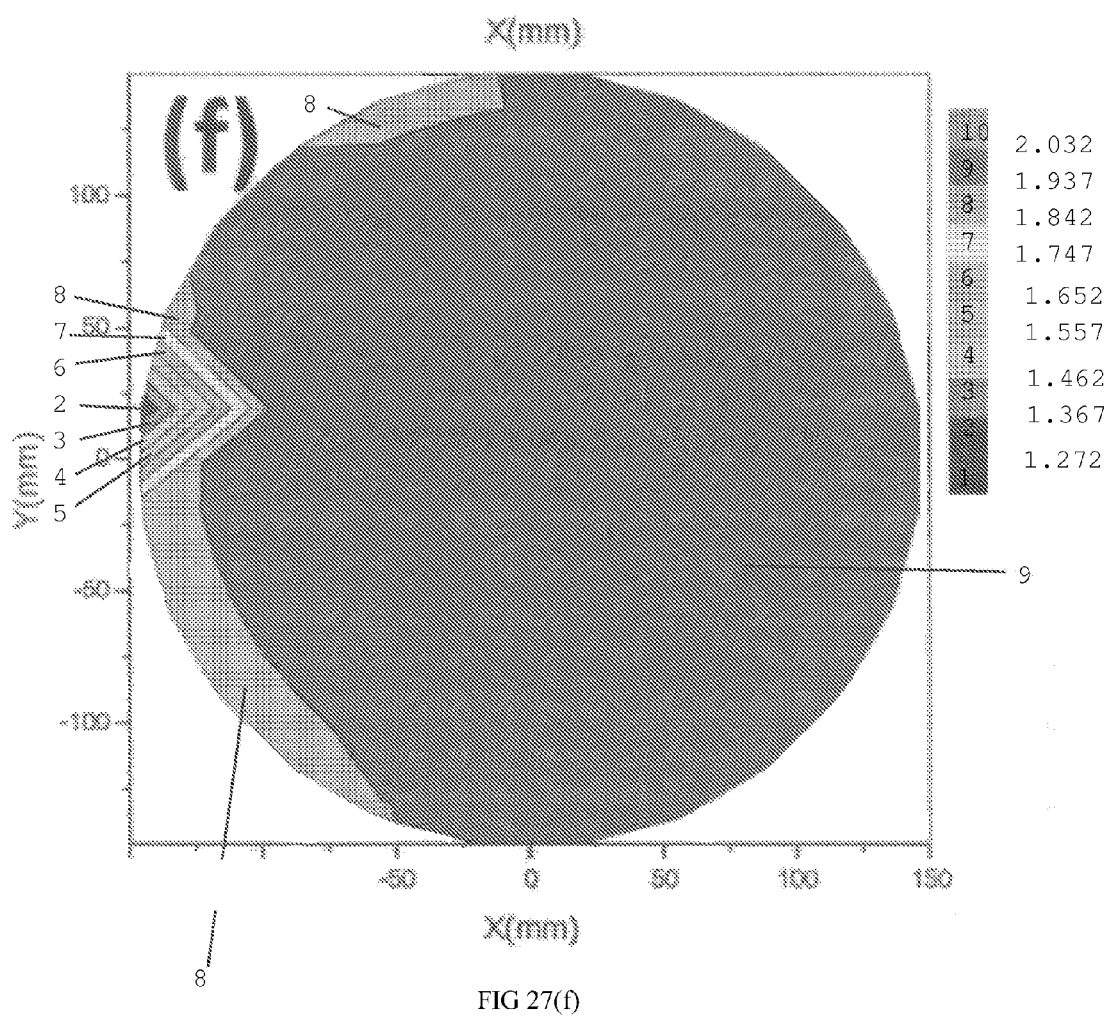

The Mo:$Al_2O_3$ processes were tested on the 300 mm Si wafer as well as 12"×12" glass substrate shown in FIG. 26(a); and it shows excellent thickness uniformity across the wafer shown in FIG. 27(b) and details are given in Table 5. Thickness contour maps are shown in FIGS. 27(a)-27(f) for MoAl$_2$O$_3$ films prepared using 500 cycles with various % Mo and also shown are associated refractive index maps for each % Mo example.

TABLE 5

Summary of data shown in FIGS. 27(a) and 27(b) giving minimum, maximum, average, and % standard deviation values for the thickness and refractive index data in these plots.

| | Thickenss [A] | | | Index of refraction | | |
|---|---|---|---|---|---|---|
| | \multicolumn{6}{c}{Mo %} | | | | | |
| | 5 | 8 | 12 | 5 | 8 | 12 |
| Minimum | 608 | 775 | 987 | 1.62 | 1.72 | 1.92 |
| Maximum | 619 | 794 | 1112 | 1.67 | 1.77 | 2.03 |
| Average | 613 | 785 | 1010 | 1.63 | 1.73 | 1.96 |
| % STDV (1σ) | 0.52 | 0.57 | 1.82 | 0.48 | 0.84 | 1.35 |

Figure 28:
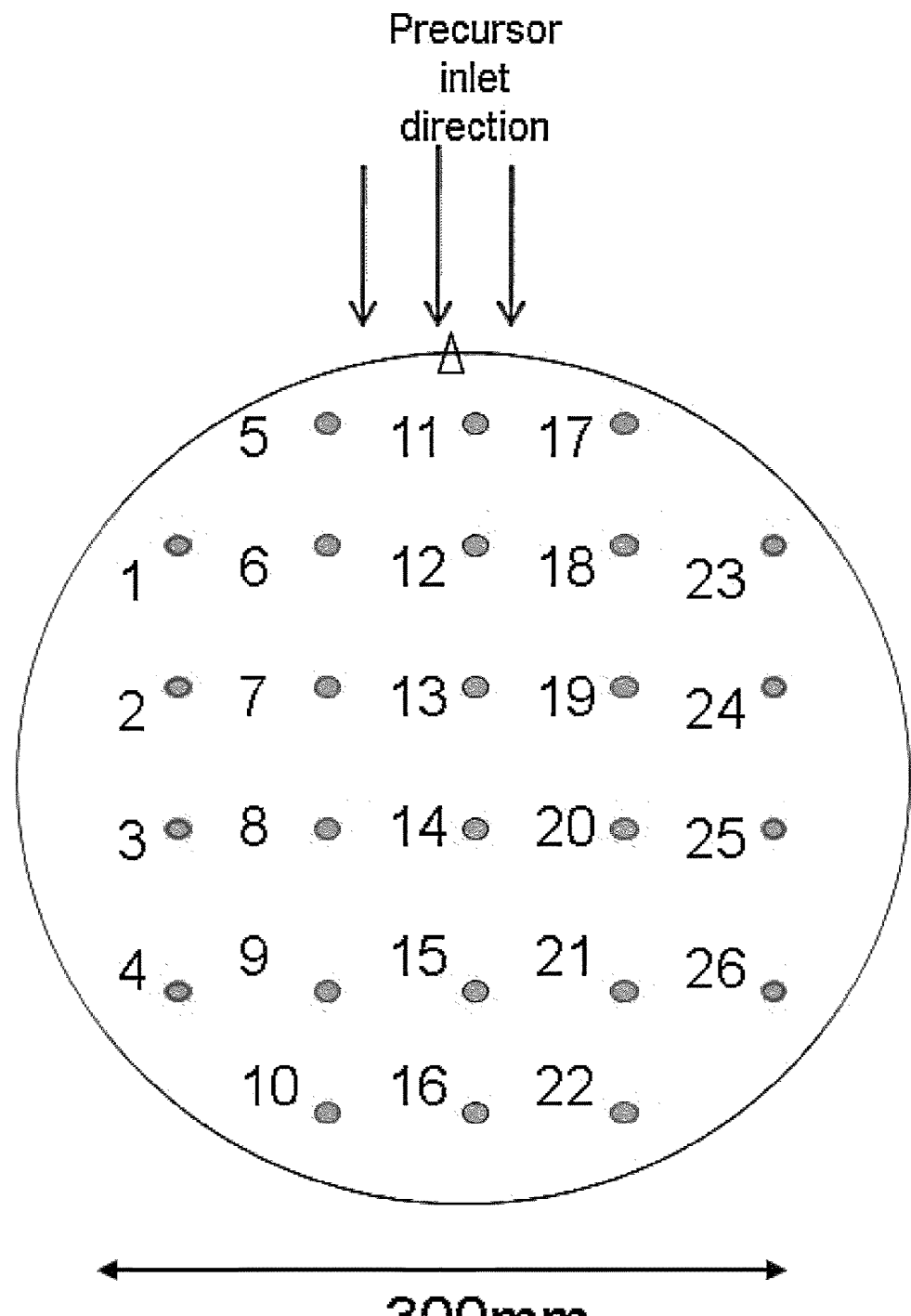
FIG. 28 is a schematic diagram of location of 26 kapton discs (masks to cover back face electrodes) affixed to a Mo-coated 300 mm Si wafer prior to ALD Mo:$Al_2O_3$ tunable resistance composite layer deposited with (8% ALD Mo:92% ALD $Al_2O_3$)
Figure 29A:
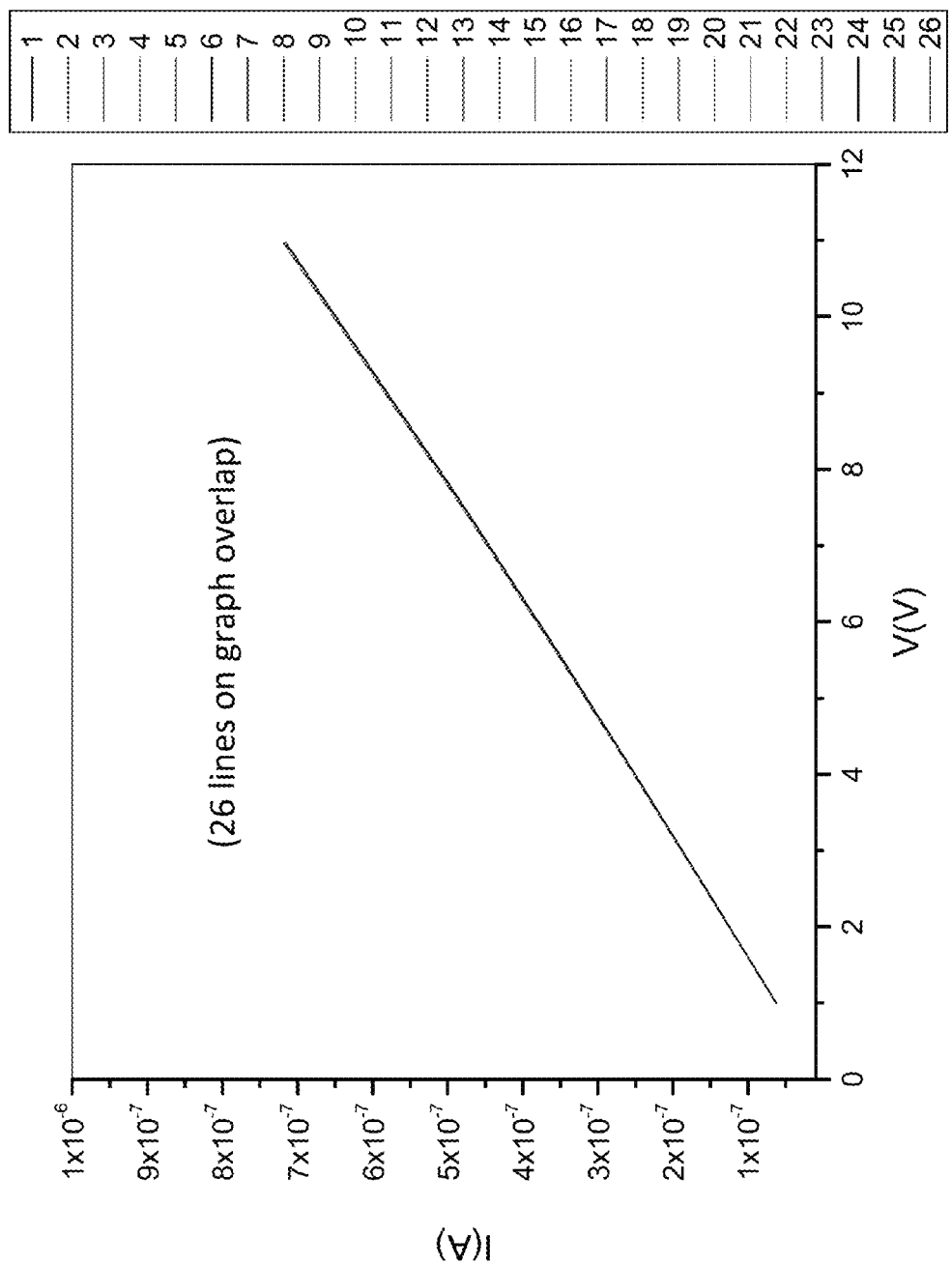
FIG. 29(a) shows a longitudinal (through the film) current/voltage plot of ALD Mo:$Al_2O_3$ tunable resistance composite layer deposited with (8% ALD Mo:92% ALD $Al_2O_3$) with measurements performed at 26 locations on a 300 nm wafer (see FIG. 28)
Figure 29B:
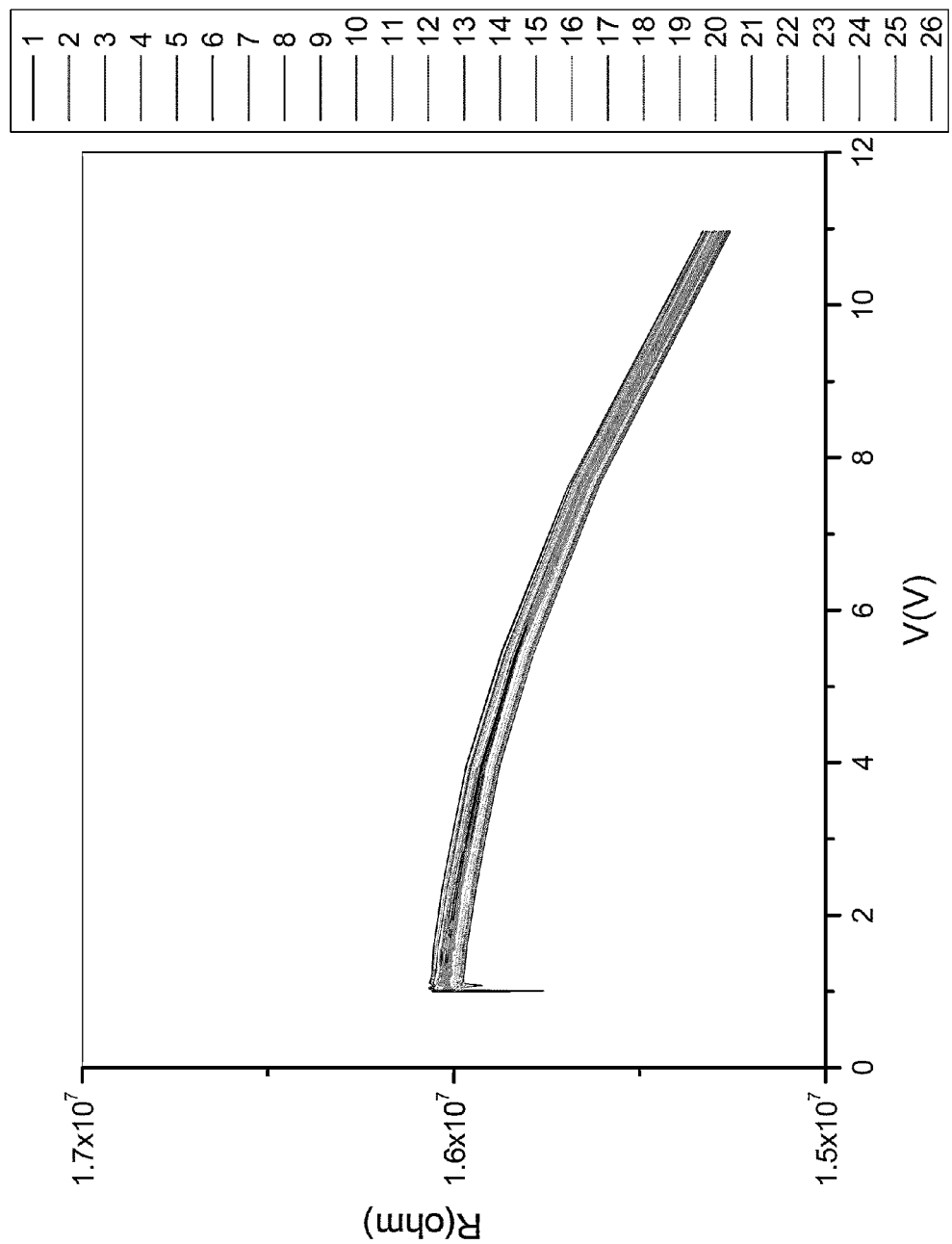
FIG. 29(b) shows a magnified portion of FIG. 29(a)
Figure 30:
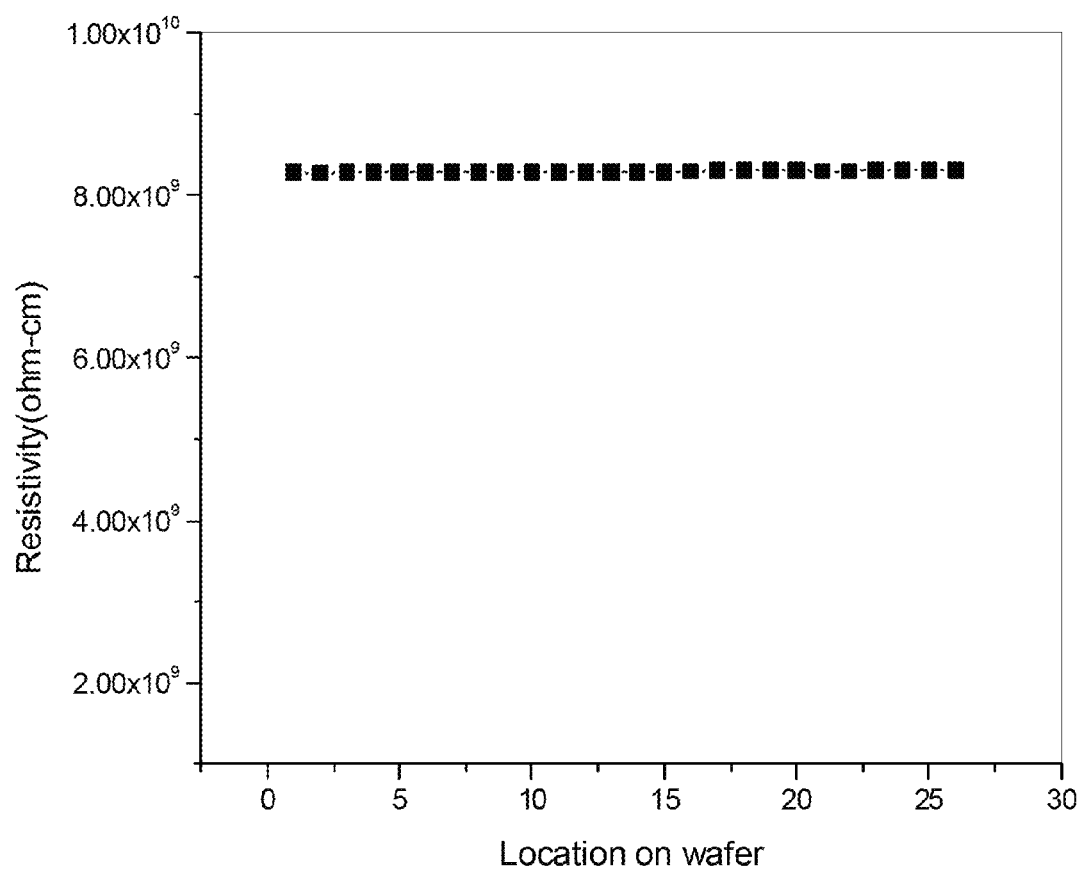
FIG. 30 shows transverse (across the film) resistivity of a Mo:$Al_2O_3$ tunable resistance composite layer deposited with (8% ALD Mo:92% ALD $Al_2O_3$) with resistivity obtained from UV measurements at 26 locations on a 300 mm Si wafer (see FIG. 29(a)) with mean value of 8.29×$10^9$ ohm-cm and standard deviation 1.30×$10^7$ ohm-cm.
Figure 31A:
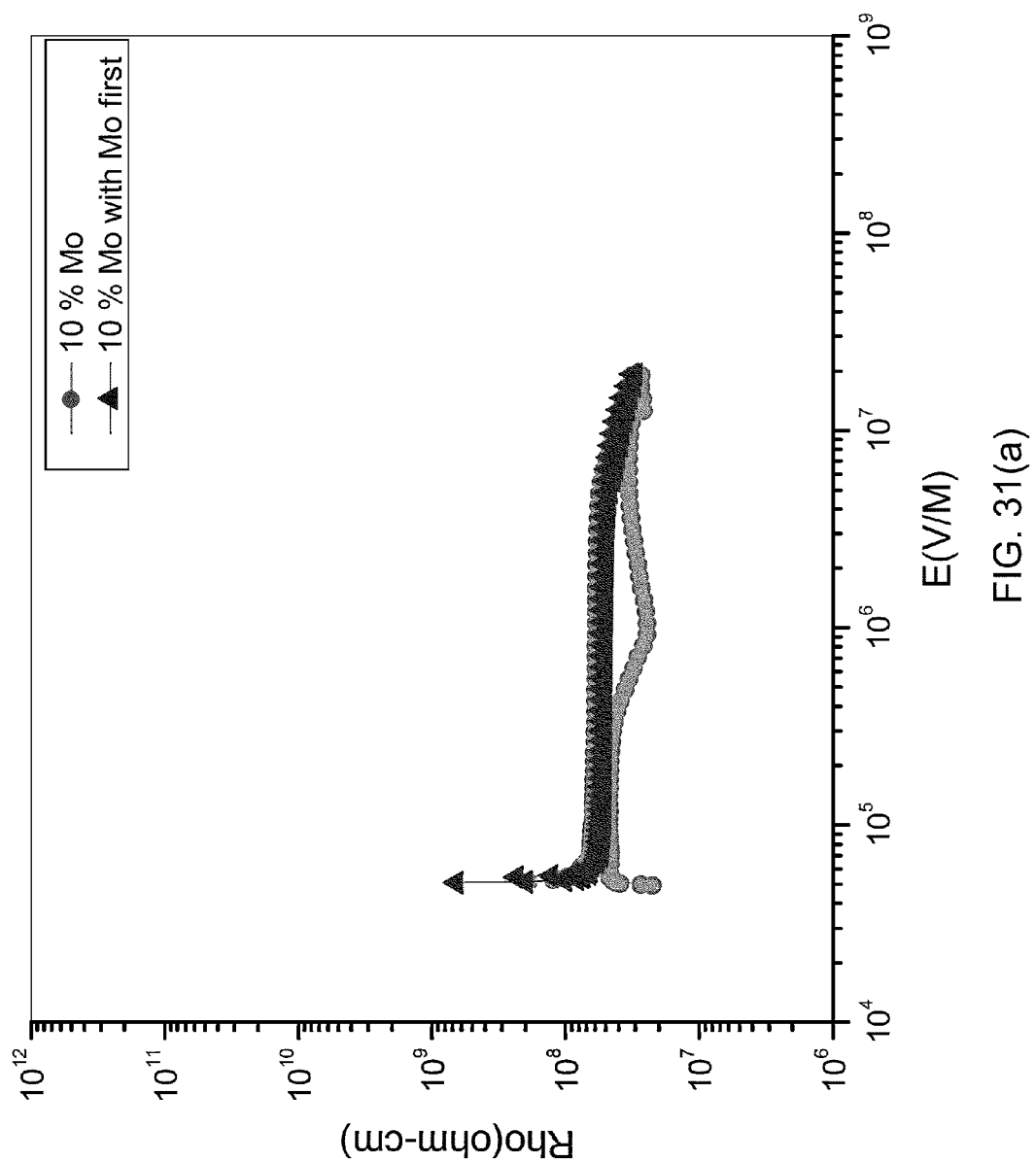
FIG. 31(a) shows transverse resistivity from a Mo:$Al_2O_3$ tunable resistance composite layer deposited with (10% ALD Mo:90% ALD $Al_2O_3$) beginning with Mo and $Al_2O_3$.
Figure 31B:
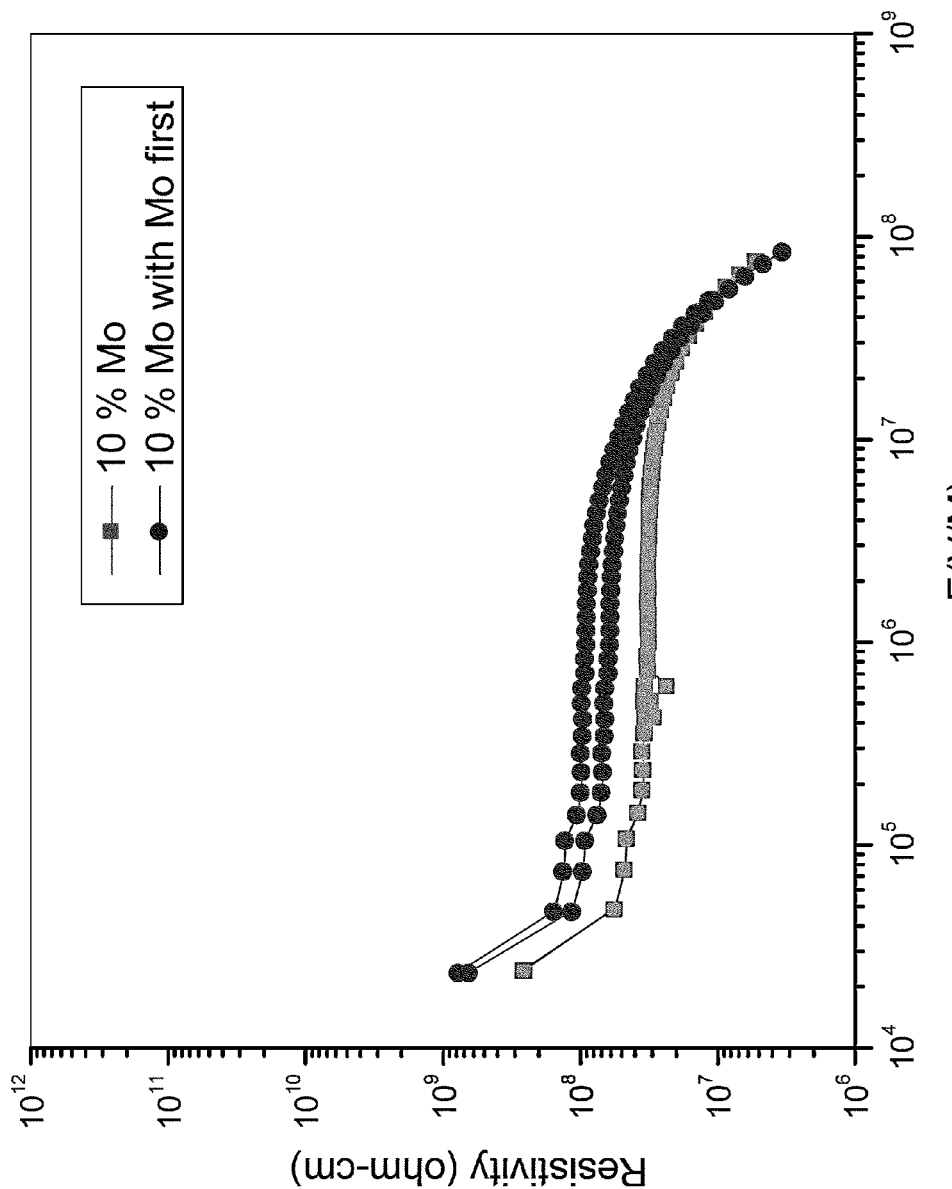
FIG. 31(b) shows longitudinal resistivity.
Figure 32:
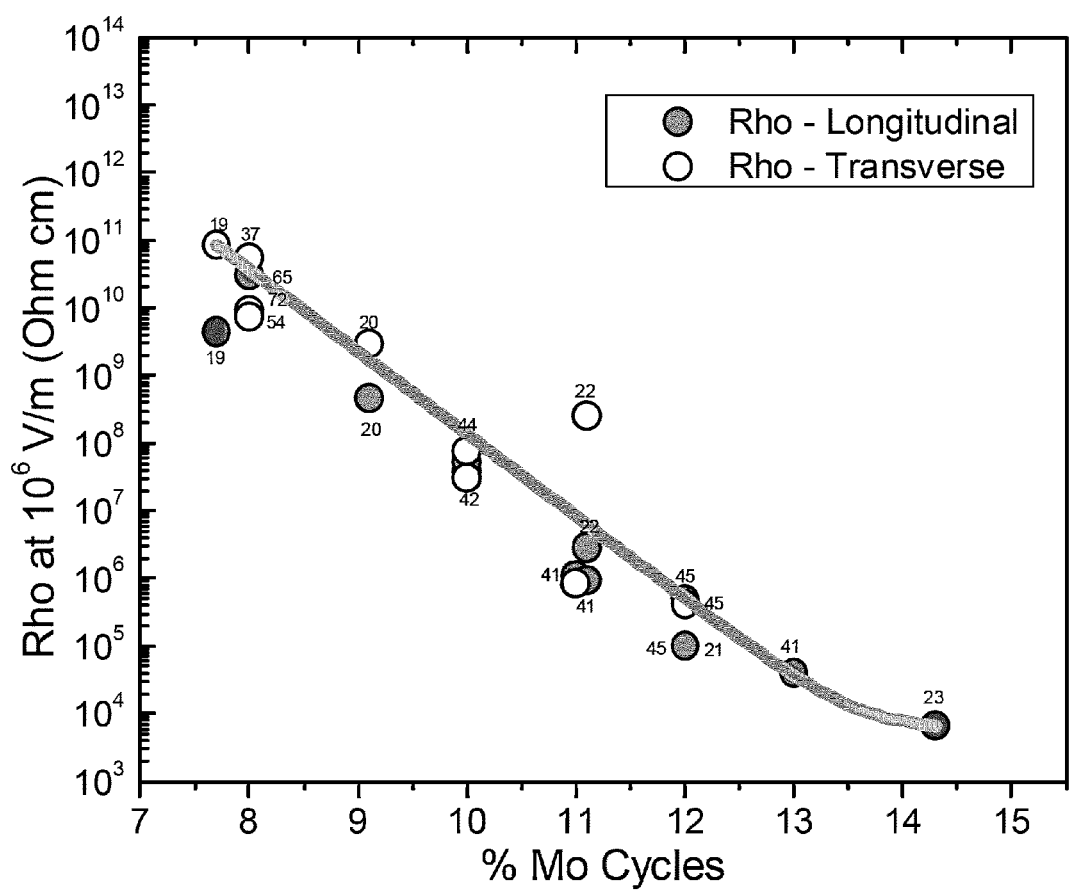
FIG. 32 shows longitudinal and transverse resistivities for ALD of Mo:$Al_2O_3$ tunable resistance composite layers measured at a field of $10^6$ V/m versus % Mo cycles with film thickness in nanometers indicated at each data point.

Transverse electrical measurements of the MoAlOx layer were performed on the 300 mm Si wafer deposited first with Mo (served as bottom contact). The schematic of the test structures on 300 mm Si wafer is shown in FIG. 28. FIGS. 29-32 illustrate resulting data for these examples.

The Mo:Al$_2$O$_3$ layers were deposited with various thicknesses and compositions. The longitudinal and transverse resistivities were measured for several samples and plotted against the % of Mo ALD cycles in Al$_2$O$_3$ and shown in FIG. 32. Both transverse and longitudinal resistivities are more or less same within the experimental error limits.

Figure 33:
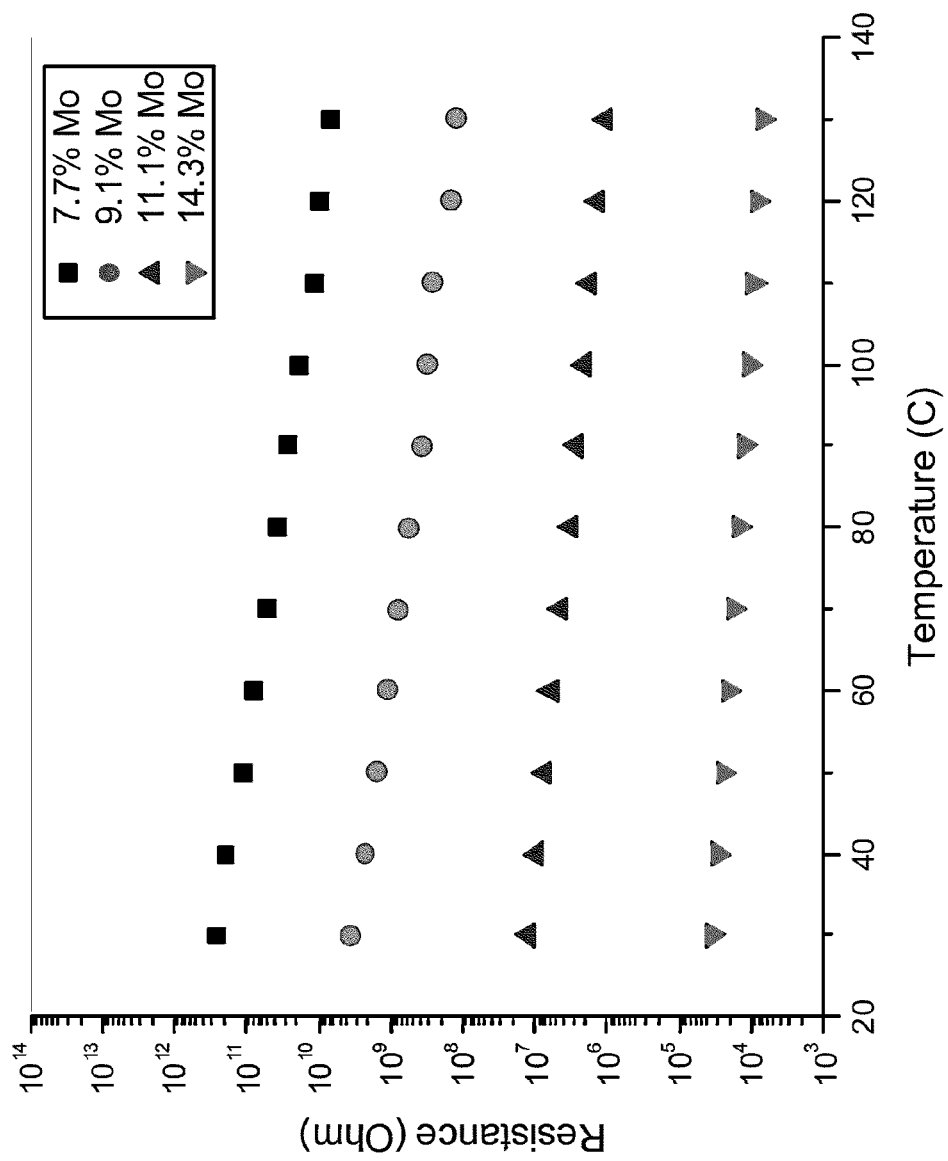
FIG. 33 shows temperature dependence of resistance of Mo:$Al_2O_3$ tunable resistance composite layers of various % Mo.

I-V behavior in the temperature range 30-130° C. was measured for various Mo:Al$_2$O$_3$ layers The resistance at different temperatures are shown in FIG. 33 and plotted per [R=Roe$^{-(\beta T(T-T_o))}$] A linear fit to this data give a negative slope which is a temperature coefficient of resistance. From these data we can extract the activation energy (E$_a$), which corresponds to the minimum energy required to transfer electrons from the donor level to the conduction band. Values of Ea obtained are given in last column of Table 6. This thermal coefficient and activation energy data are useful for thermistor and MEMS devices.

The temperature dependence of resistance was fit to:

$$R = Roe^{-(\beta T(T-To))}$$

Where R is resistance, T is temperature and R$_o$ is initial resistance at initial temperature and β$_T$ is the thermal coefficient of resistance.
For reference:
Commercial lead-glass MCP: β$_T$=-0.02
Micro-machined silicon MCP: β$_T$=-0.036
Aluminum zinc oxide coated MCP: β$_T$=-0.06

The growth of ALD MoAlO$_x$ layer on high aspect ratio 3D structures was also evaluated. ALD MoAlO$_x$ tunable resistance coatings were prepared using 8% Mo ALD cycles on the inside surface of a porous borosilicate capillary glass array showing excellent thickness uniformity, conformality, and smoothness of the films SEM images of ALD MoAlO$_x$ tunable resistance coating prepared using 8% Mo ALD cycles in Al$_2$O$_3$ on inside surface of porous borosilicate capillary glass array showing excellent thickness uniformity, conformality, and smoothness of the films.

Figure 35B:
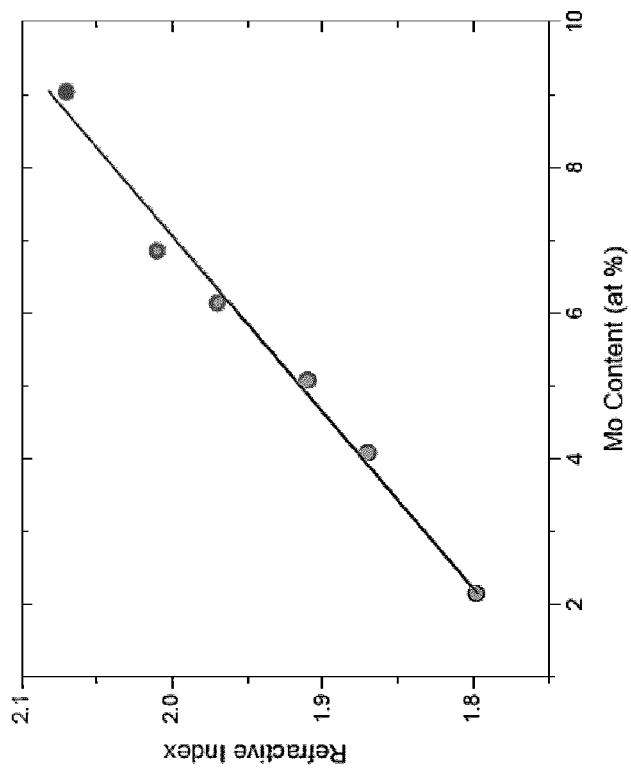
Figure 35A:
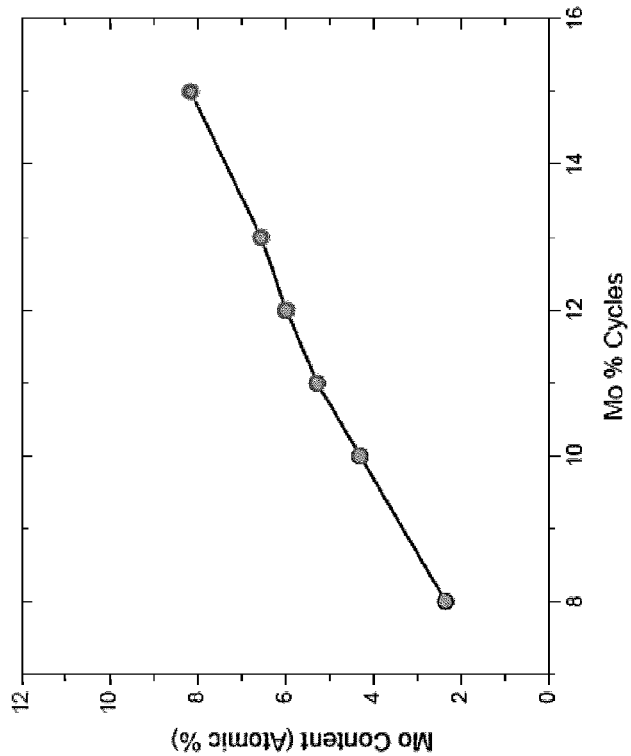
FIG. 35(a) shows Mo atomic % versus Mo % of cycles for a Mo:$Al_2O_3$ tunable resistance film coating from X-ray fluorescence.

In yet another embodiment tunable resistance coatings of Mo—Al$_2$O$_3$ can be deposited and the Mo content can be controlled by adjusting the percentage of Mo ALD cycles, the number of ALD Mo cycles executed consecutively, the Mo ALD precursor exposure times, and the order in which the precursors are supplied. By controlling the Mo content, the composition and structure of the films can be tailored to yield the desired resistivity. FIG. 35a shows the Mo content for Mo—Al$_2$O$_3$ tunable resistance coatings as determined from X-ray fluorescence measurements of films prepared with varying values for the percentage of Mo ALD cycles used during growth. This figure demonstrates that the atomic % of Mo in the films can be controlled precisely by adjusting the percentage of Mo cycles. Moreover, the Mo content varies approximately linearly between 2 and 8 atomic % as the percentage of Mo cycles is changed from 8 to 15%. FIG. 35b shows that the real part of the refractive index of the resulting films at a wavelength of 632 nm, as determined using spectroscopic ellipsometry, varies linearly with the Mo content of the films from approximately 1.80 at 2% Mo to approximately 2.07 at 9% Mo cycles. This demonstrates that spectroscopic ellipsometry can be used as a simple and nondestructive means for determining the Mo content of the Mo:Al$_2$O$_3$ tunable resistance coatings.

Figure 36:
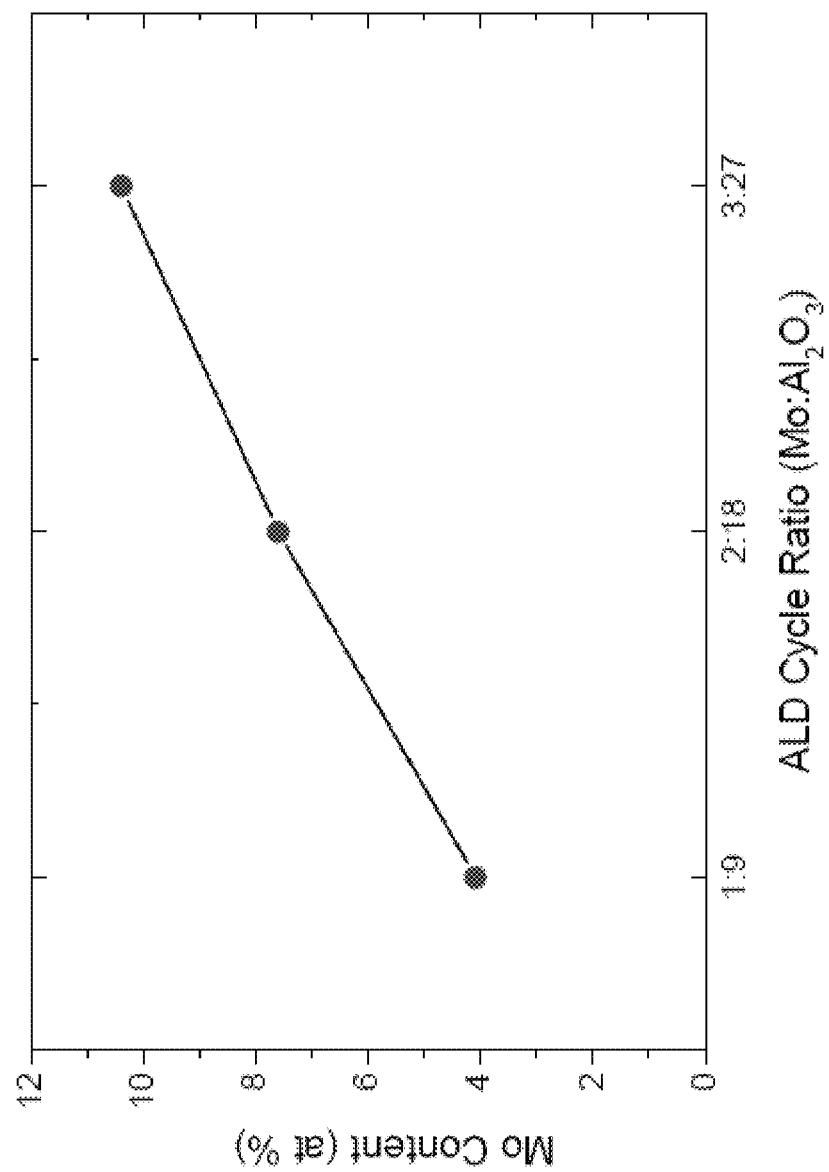
FIG. 36 shows Mo atomic % content versus ALD cycle ratio of Mo:$Al_2O_3$ for Mo:$Al_2O_3$ tunable resistance composite layers deposited with (10% ALD Mo:90% ALD $Al_2O_3$)

Another method for adjusting the Mo content of the Mo:Al$_2$O$_3$ tunable resistance coatings is to execute multiple, consecutive Mo ALD cycles comprised of alternating exposures to Si$_2$H$_6$ and MoF$_6$. For instance, FIG. 36 demonstrates that when 1 Mo ALD cycle is followed by 9 Al$_2$O$_3$ ALD cycles yielding 10% Mo cycles, and this 1:9 sequence is repeated over a total of approximately 500 ALD cycles, the resulting film has a composition of approximately 4 at % Mo. In contrast, if 2 Mo ALD cycles are followed by 18 Al$_2$O$_3$ ALD cycles which also produces 10% Mo cycles, and this 2:18 sequence is repeated over a total of approximately 500 ALD cycles, the resulting film has a composition of approximately 7.5 at % Mo. Similarly, the 3:27 sequence which also produces 10% Mo cycles repeated for approximately 500 ALD cycles yields a composition of approximately 10.5 at %

TABLE 6

Summary of measurements of resistance of MoAlO$_x$ films for different % Mo. Column 6 lists the β$_T$ value, the thermal coefficient of resistance. β$_T$ decreases with increasing % Mo. Slope and Ea are described in FIG. 33.

| Sample | # cycles | Mo % | Comments | Thickness (A) | β$_T$ | Slope | Ea (eV) |
|---|---|---|---|---|---|---|---|
| D20 | 130 | 7.7 | 10:120 = Mo:AlO | 193 | -0.03683 | 4509 | 0.39 |
| D21 | 132 | 9.1 | 12:120 = Mo:AlO | 201 | -0.02800 | 4056 | 0.35 |
| D22 | 135 | 11.1 | 15:120 = Mo:AlO | 215 | -0.00962 | 2987 | 0.26 |
| D37 | 140 | 14.3 | 20:120 = Mo:AlO | 230 | -0.00112 | 1940 | 0.17 |

Mo. Consequently, the same % Mo can produce different Mo contents if multiple Mo ALD cycles are executed consecutively.

Figure 37B:
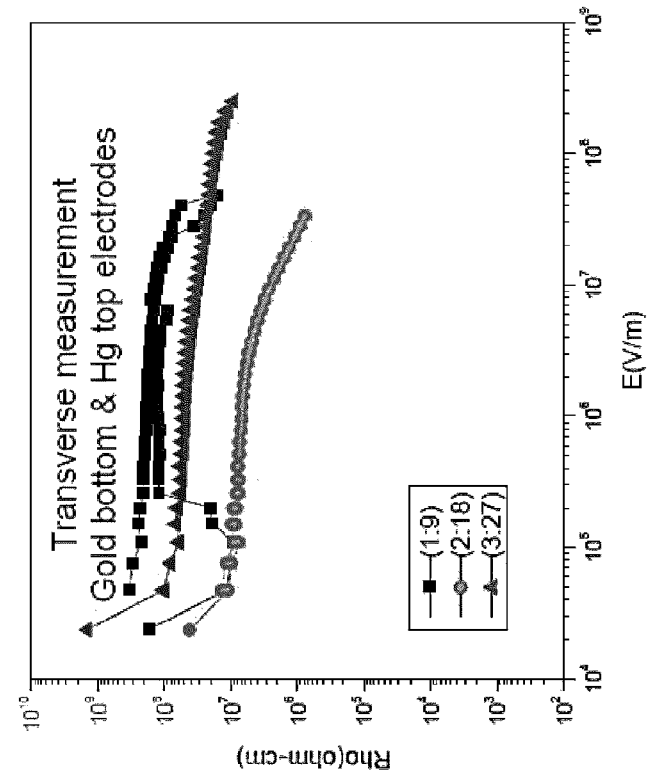
FIG. 37a shows longitudinal resistivity and FIG. 37(b) shows transverse resistivity for Mo:$Al_2O_3$ tunable resistance film coatings prepared using the same percentage of Mo cycles (10%), but using repeated sequences of either 1, 2, or 3 Mo ALD cycles which show broad tunability of resistivity; all films are in the range of 39-43 nm and the transverse resistivity is relatively unaffected by the number of Mo cycles in sequence, but the longitudinal resistivity drops dramatically between 1 and 2 cycle.
Figure 37A:
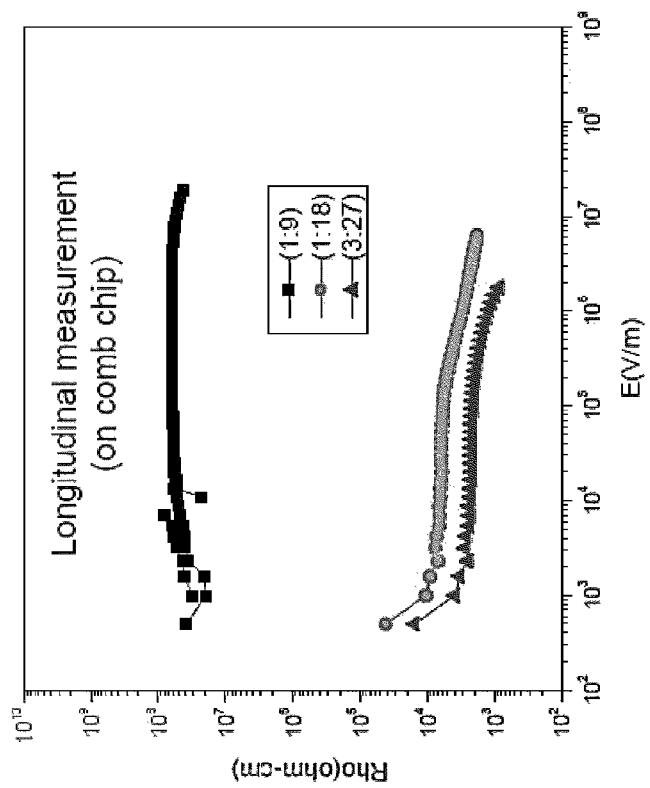

One effect of adjusting the Mo content in the Mo:Al$_2$O$_3$ tunable resistance coatings by controlling the number of Mo ALD cycles executed consecutively is shown in FIG. 37a and 37b. FIG. 37a shows the longitudinal resistivity (resistivity measured across the film surface) for a series of Mo:Al$_2$O$_3$ tunable resistance coatings prepared using 10% Mo cycles with a thickness of approximately 40 nm deposited on comb chips with an interdigitated electrode structure designed to enhance the current by 80,000× to facilitate sheet resistance measurements of highly resistive films. These figures show that while the 1:9 film gives a very high longitudinal resistivity of approximately $10^8$ Ohm cm, the 2:18 and 3:27 films have drastically lower resistivities of approximately $10^4$ Ohm-cm. In contrast, FIG. 37b shows the transverse resistivity (resistivity measured through the thickness of the film) as determined using mercury probe measurements for films deposited on gold substrates using the same procedures as the films in FIG. 37a. FIG. 37b thus demonstrates that the transverse resistivity is relatively insensitive to the number of Mo ALD cycles executed consecutively, showing transverse resistivities of approximately $10^8$, $10^8$, and $10^7$ for the 1:9, 2:18, and 3:27 films, respectively. Because of this behavior, the number of Mo cycles executed consecutively can be utilized to impart anisotropy to the resistivity such that the film conducts up to $10^4 \times$ higher in the longitudinal direction compared to the transverse direction for a given Mo atomic percentage.

Figure 38:
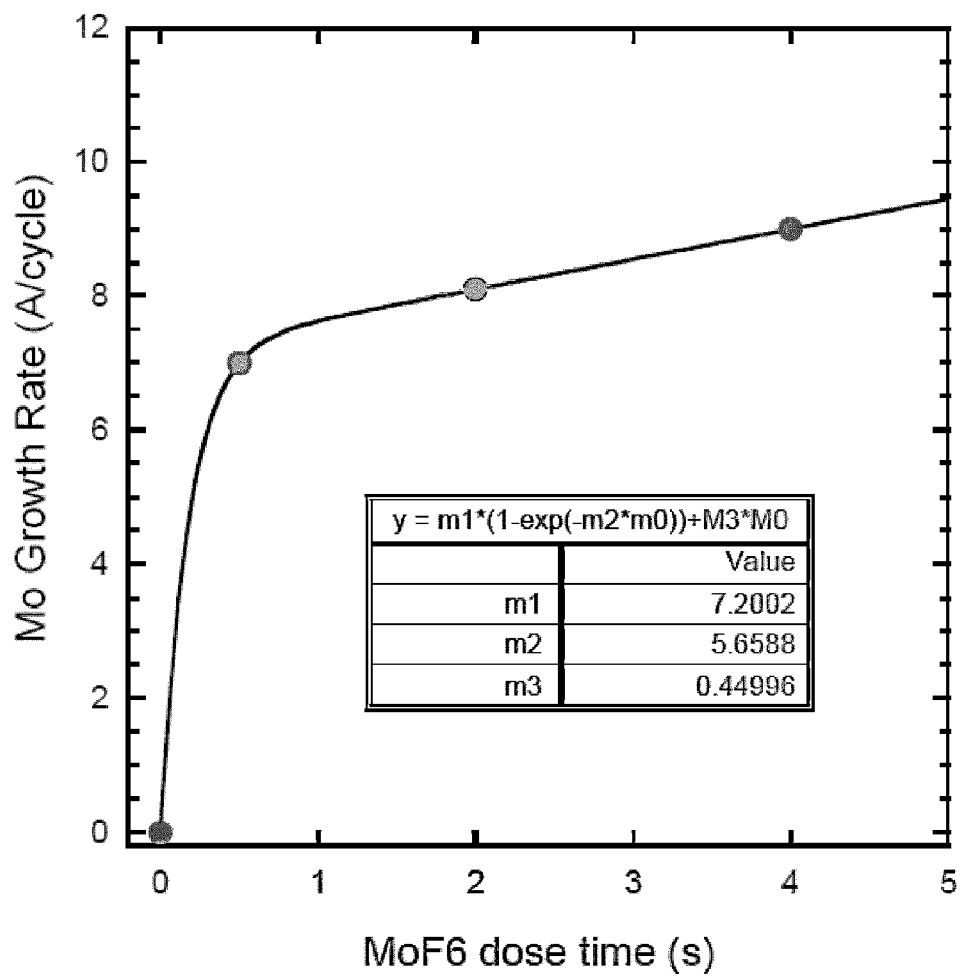
FIG. 38 shows Mo growth rate versus $MoF_6$ dose time.
Figure 39:
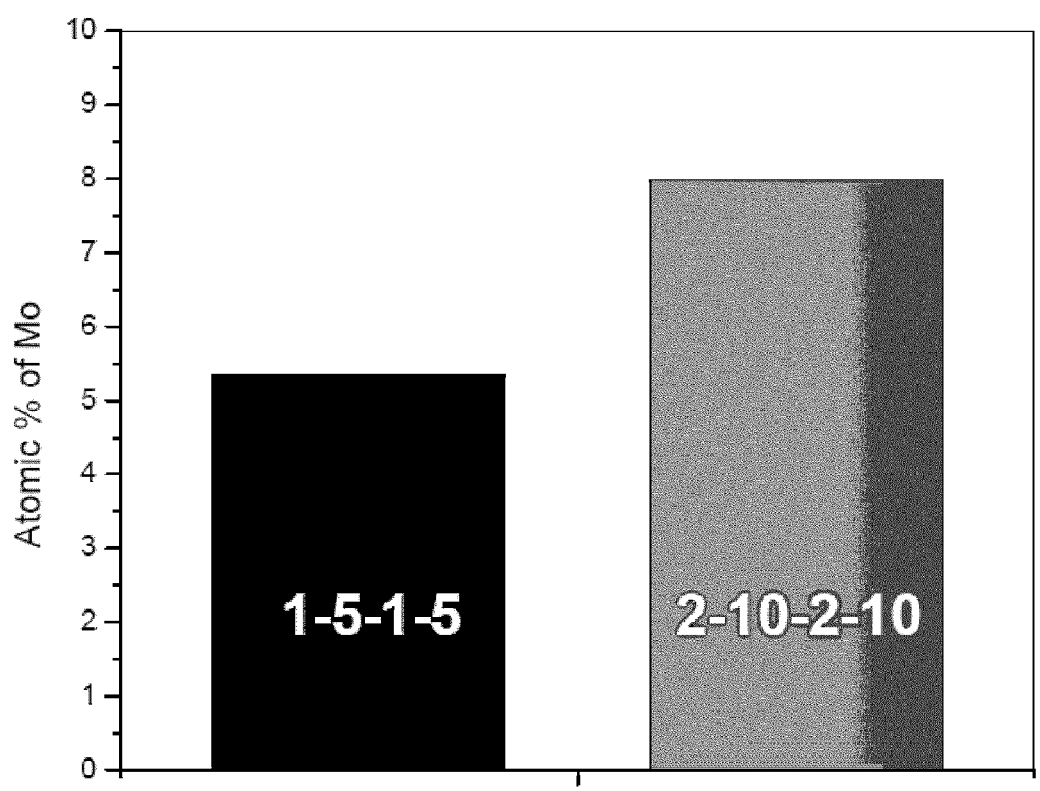
FIG. 39 shows atomic % Mo for two different dosing schemes of 1-5-1-5 and 2-10-2-10 where the numbers correspond to $Si_2H_6$ dose time—$Si_2H_6$ purge time—$MoF_6$ dose time—$MoF_6$ purge time (all times in seconds)

A third method for controlling the Mo content in the Mo:Al$_2$O$_3$ tunable resistance coatings is by adjusting the MoF$_6$ precursor exposure. The MoF$_6$ precursor exposure can be adjusted by changing the dose time, the partial pressure of the MoF$_6$ during the exposure, or both. FIG. 38 shows that as the MoF$_6$ dose times varied from 0 to 4 seconds, the Mo growth rate first increases sharply at 0.5 s to a growth rate of approximately 7 Å/cycle and then continues to increase slowly to a value of 9 Å/cycle after a MoF$_6$ dose time of 4 s. Because the Mo growth rate can be controlled by the MoF$_6$ dose time, the Mo content in the Mo:Al$_2$O$_3$ tunable resistance coatings can similarly be controlled. For instance, FIG. 39 shows that for Mo:Al$_2$O$_3$ tunable resistance coatings prepared using 8% Mo cycles, as the dosing sequence for the Mo ALD is 1-5-1-5 s (where these timings refer to the disilane exposure time, and the disilane purge time, the MoF$_6$ dose time, and the MoF$_6$ purge time, respectively), the resulting Mo content is approximately 5.5 at %. However, when the dosing sequence for the Mo ALD is adjusted to be 2-10-2-10 s, the resulting Mo content is increased to approximately 8 at %.

Figure 40:
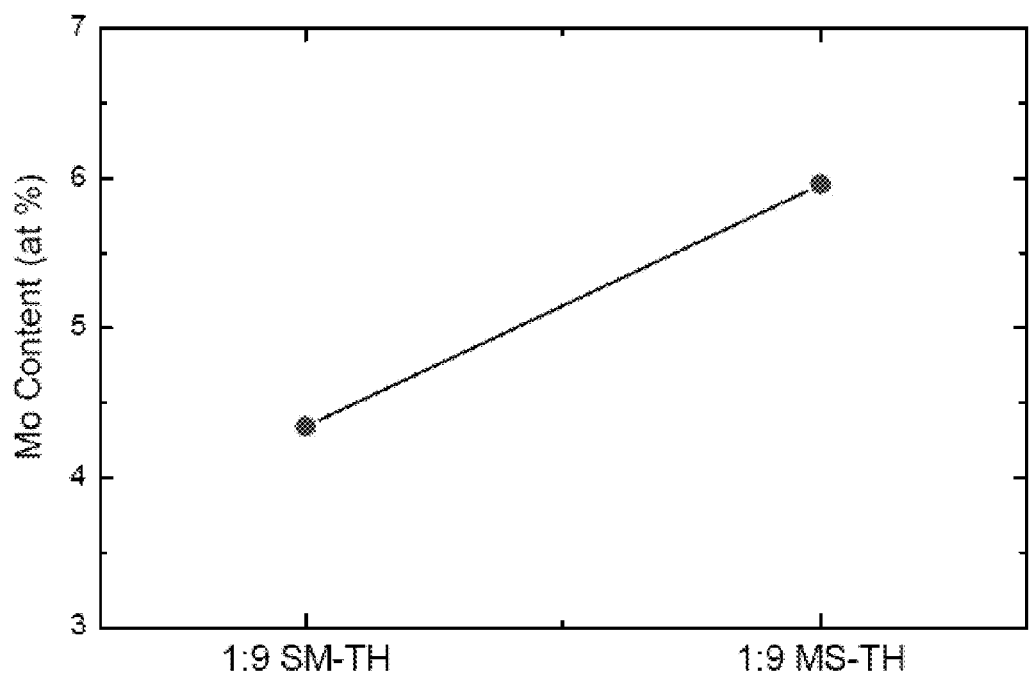
FIG. 40 shows atomic % of Mo in Mo:$Al_2O_3$ tunable resistance composite layers deposited with (10% ALD Mo:90% ALD $Al_2O_3$), where the Mo ALD precursor order is varied between $Si_2H_6$/$MoF_6$ (SM-TH) and $MoF_6$/$Si_2H_6$ (MS-TH)

Yet another method for controlling the Mo content in the Mo—Al$_2$O$_3$ tunable resistance coatings is by adjusting the order for the ALD Mo precursors. FIG. 40 shows that for 10% Mo films prepared using Mo ALD cycles in which the disilane precursor (S) is pulsed prior to the MoF$_6$ precursor (M), and then the Al$_2$O$_3$ ALD cycle is executed with the TMA precursor (T) pulsed prior to the H$_2$O precursor (H) so that the overall sequence is SM-TH, the Mo content of the resulting film is approximately 4.3% Mo. In contrast, if the same film is prepared with the MoF$_6$ precursor pulsed before the disilane precursor so that the overall sequence is MS-TH, the Mo content of the resulting film is higher at a value of approximately 6.0%. The thickness and resistivity of these films are also affected by the order in which the precursors are supplied. Table 7 summarizes a series of 4 films prepared using 500 ALD cycles and 10% Mo cycles with the precursor sequences TH-SM, TH-MS, HT-SM, and HT-MS. The thicknesses for these films vary from 702 Å to 1030 Å, and the resistivities span the range from $5.03 \times 10^5$ to $1.32 \times 10^7$.

TABLE 7

Summary of MoAlOx films prepared using 500 cycles of 10% Mo cycles using different orderings for the chemical precursors TMA (T), H$_2$0 (H), disilane (S), and MoF$_6$ (M) as described in the first column. The thicknesses were determined using ellipsometry and the resistances were determined using mercury probe measurements.

| ALD Sequence | Thickness (Å) | Resistivity (Ohm-cm) |
|---|---|---|
| TH-SM | 702 | 5.63e6 |
| TH-MS | 970 | 5.03e5 |
| HT-SM | 707 | 5.95e6 |
| HT-MS | 1030 | 1.32e7 |

Figure 41:
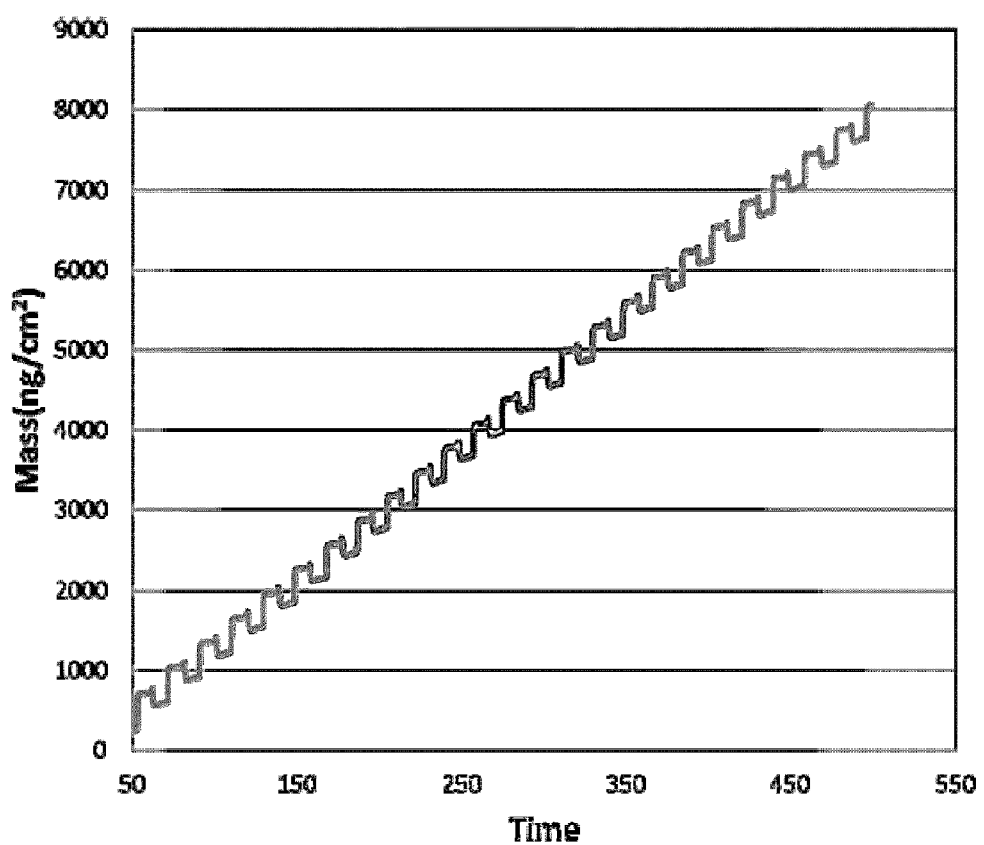
FIG. 41 shows QCM data showing linear growth of material using alternating TMA and $MoF_6$ exposures at 305 ng/$cm^2$/cycle.
Figure 42:
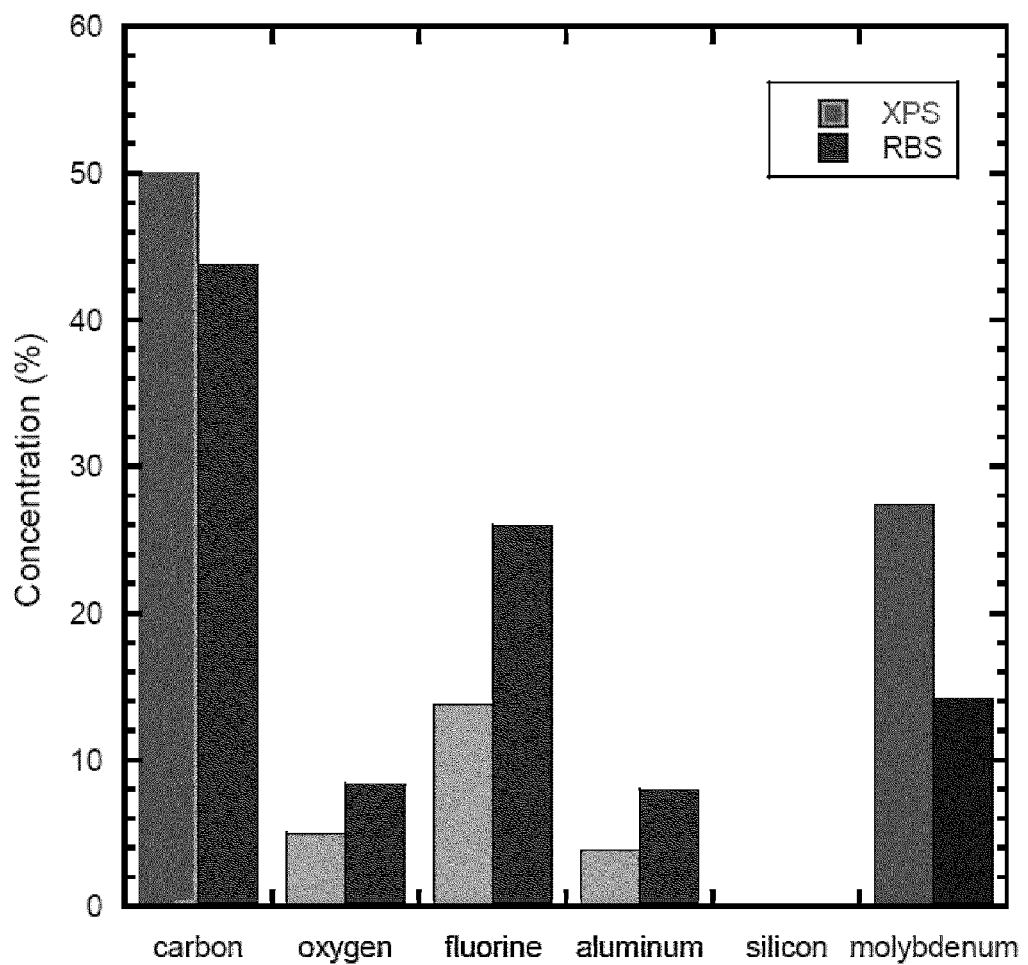
FIG. 42 shows results of Rutherford back scattering and XPS for elemental components of the resulting film.

Another formulation for the tunable resistance coatings containing Mo is MoC$_x$—Al$_2$O$_3$ where MoC$_x$ represents a material containing both Mo and carbon that results from alternating exposures to molybdenum hexafluoride (MoF$_6$) and trimethyl aluminum (TMA). To demonstrate the viability of this precursor pair for atomic layer deposition, FIG. 41 shows the results of quartz crystal microbalance measurements monitoring the mass changes resulting from alternating MoF$_6$/TMA pulses with a duration of 1 s using 10 s purges between exposures. FIG. 41 demonstrates linear growth versus time (or equivalently, ALD cycles), and the staircase structure results from a mass increase during each MoF$_6$ exposure followed by a smaller mass decrease during the subsequent TMA exposure. The net mass change is approximately 305 ng/cm$^2$/cycle. Next, a film of MoC$_x$ was prepared using the conditions listed in Table 8. 50 ALD cycles of MoC$_x$ yielded a thickness of 228 Å as determined by ellipsometry, and the film was highly conductive with a resistivity of 30 Ohm cm as determined using a four point probe. The composition of the film was evaluated using both Rutherford backscattering (RBS) and X-ray photoelectron spectroscopy (XPS) and the results are show in FIG. 42. The major components of the MoC$_x$ films are Mo and C, but they also contain X, F, and Al.

TABLE 8

Summary of conditions and measurements for film preparing conducting film using alternating TMA/MoF6 exposures.

| | |
|---|---|
| ALD cycles | 50 |
| TMA dose time | 1 |
| MoF6 dose time | 1 |
| Deposition temperature | 200 C. |
| Thickness (A) | 228 |
| Resistivity (Ohm cm) | 30 |

Figure 43:
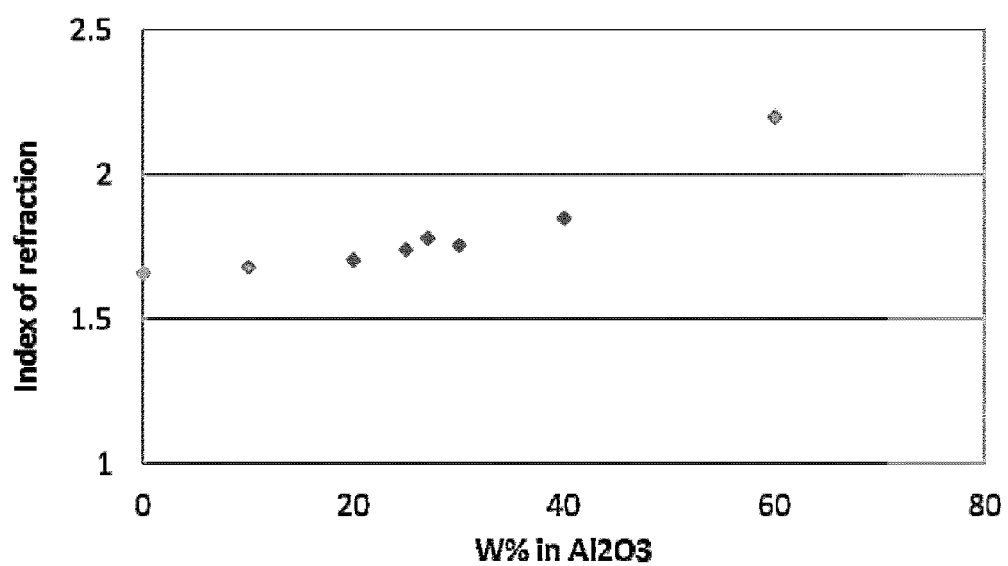
FIG. 43 shows index of refraction at $\lambda$=632 nm as determined using spectroscopic ellipsometry for ALD W:$Al_2O_3$ tunable resistance coatings versus % W cycles; the consistent changes imply that the refractive index can be used to gauge the relative amount of W in the films.

In a further embodiment, tunable resistance coatings of W:Al$_2$O$_3$ can be deposited using alternating exposures to disilane and tungsten hexafluoride (WF$_6$) for W ALD, and alternating exposures to trimethyl aluminum (TMA) and H$_2$O for the Al$_2$O$_3$ ALD. By varying the deposition process conditions such as the percentage of W ALD cycles, the composition and structure of the films can be tailored to yield the desired resistivity. FIG. 43 shows the relationship between the index of refraction of the W:Al$_2$O$_3$ films at 632 nm as determined by spectroscopic ellipsometry versus the percentage of W cycles used to prepare the films. The refractive index increases with increasing W percent cycles, indicating that spectroscopic ellipsometry is a viable non-destructive technique for evaluating the composition of these films.

Figure 44:
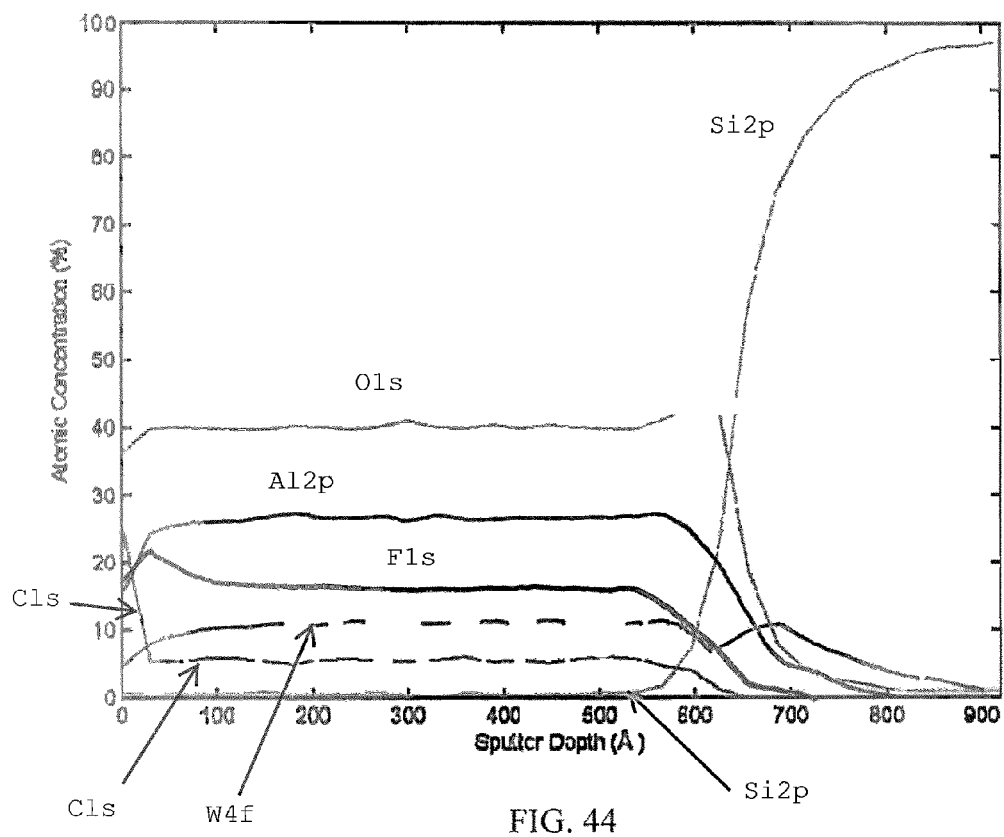
FIG. 44 shows cross sectional elemental analysis using XPS depth profiling for a W:$Al_2O_3$ tunable resistance film.
Figure 45:
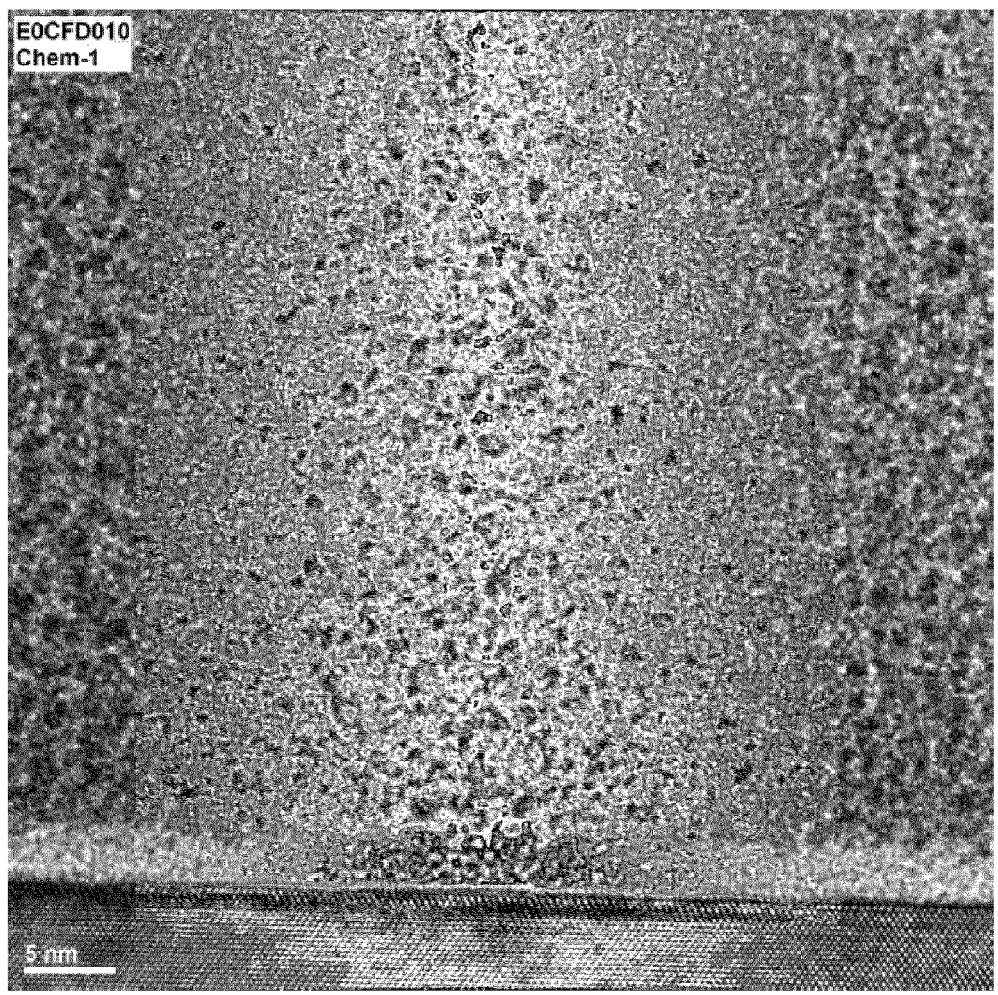
FIG. 45 shows a cross sectional TEM micrograph of the film of FIG. 44.

FIG. 44 shows a cross-sectional elemental analysis performed using XPS depth profiling for a W:Al$_2$O$_3$ tunable resistance film prepared using 500 ALD cycles with 33% W cycle percentage at 200° C. on a silicon substrate. As shown in FIG. 44, the film is comprised of O, Al, F, W, and C. The enhanced C on the surface is from atmospheric exposure prior to the XPS analysis. FIG. 45 shows a cross-sectional transmission electron micrograph (TEM) of the same W:Al$_2$O$_3$ tunable resistance film. The bottom of the image shows the crystalline silicon substrate with the native SiO$_2$ layer intact. Above this is seen the W:Al$_2$O$_3$ tunable resistance coating which is comprised of discrete nanoparticles of ~1-2 nm in size (the dark spots in the film) surrounded by an amorphous matrix. Lattice fringes observed using higher magnification confirm that the nanoparticles are crystalline. The resistivity for this W:Al$_2$O$_3$ tunable resistance film was measured to be approximately 10$^9$ Ohm cm.

Figure 46A:
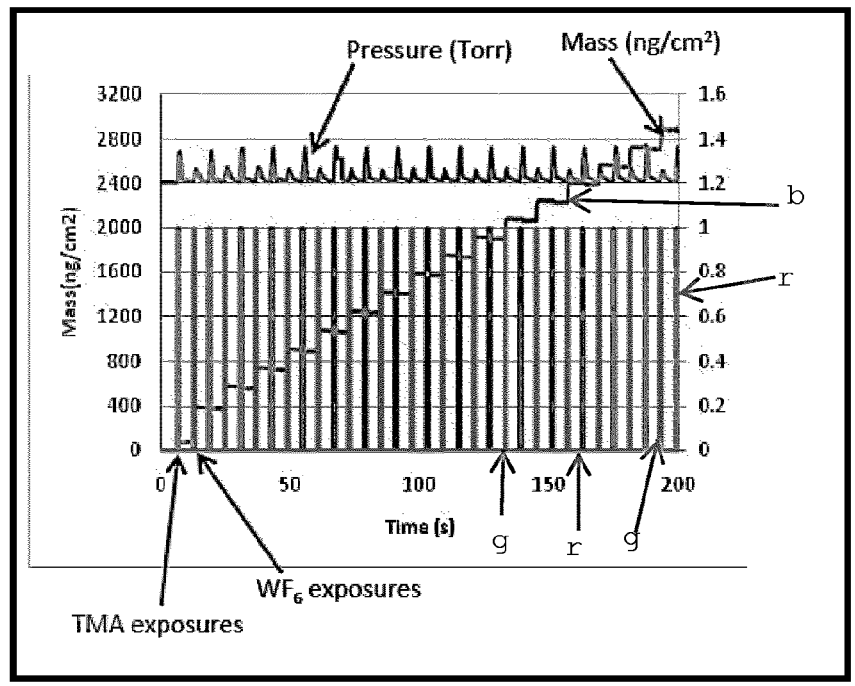
FIG. 46a shows QCM data showing linear growth of material using alternating TMA and $WF_6$ exposures at a mass deposition rate of 295 ng/$cm^2$/cycle; Red lines ("r") indicate TMA exposures, green lines ("g") indicate $WF_6$ exposures, blue lines ("b") indicate mass, and purple line ("p") shows reactor pressure.
Figure 46B:
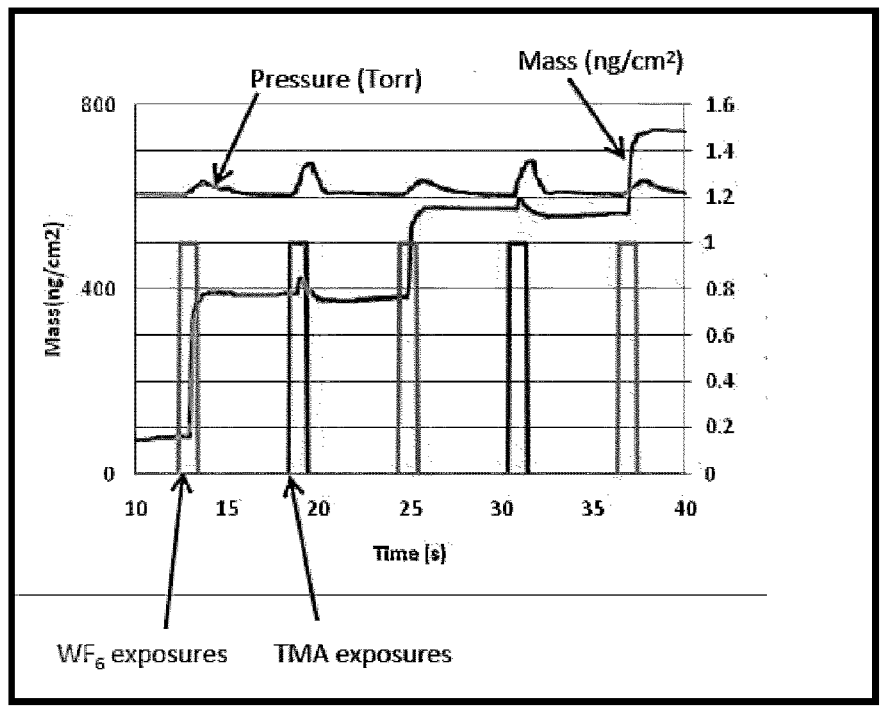
FIG. 46b shows a detailed view of a step structure showing mass increases during $WF_6$ and mass decreases during TMA.

Another formulation for the tunable resistance coatings containing W is WC$_x$—Al$_2$O$_3$ where WC$_x$ represents a material containing both W and carbon that results from alternating exposures to tungsten hexafluoride (WF$_6$) and trimethyl aluminum (TMA). To demonstrate the viability of this precursor pair for atomic layer deposition, FIGS. 46a and 46b show the results of QCM measurements monitoring the mass changes resulting from alternating WF$_6$/TMA pulses with a duration of 1 s using 5 s purges between exposures. FIG. 36a demonstrates linear growth versus time (or equivalently, ALD cycles). The upper trace in FIG. 36a shows the reactor pressure, the trace indicated on the far right shows the quartz crystal microbalance mass signal. The lower traces designate when the WF$_6$ and TMA precursors are supplied. FIG. 36b shows an expanded view of the early times in FIG. 36a and reveals the staircase structure results from a mass increase during each WF$_6$ exposure followed by a smaller mass decrease during the subsequent TMA exposure. The net mass change is approximately 295 ng/cm$^2$/cycle.

A film of WCx was prepared using the conditions listed in Table 9. 50 ALD cycles of WC$_x$ yielded a thickness of 400 Å as determined by ellipsometry, and the film was highly conductive with a resistivity of 3.5e-2 Ohm cm as determined using a four point probe, and was amorphous as determined using X-ray diffraction (XRD).

TABLE 9 summary of conditions and measurements for film preparing conducting film using alternative TMA/WF$_6$ exposures.

| | |
|---|---|
| ALD cycles | 50 |
| TMA dose time | 1 |
| MoF6 dose time | 1 |
| Deposition temperature | 200 C. |
| Thickness (A) | 228 |
| Resistivity (Ohm cm) | 30 |

Figure 47:
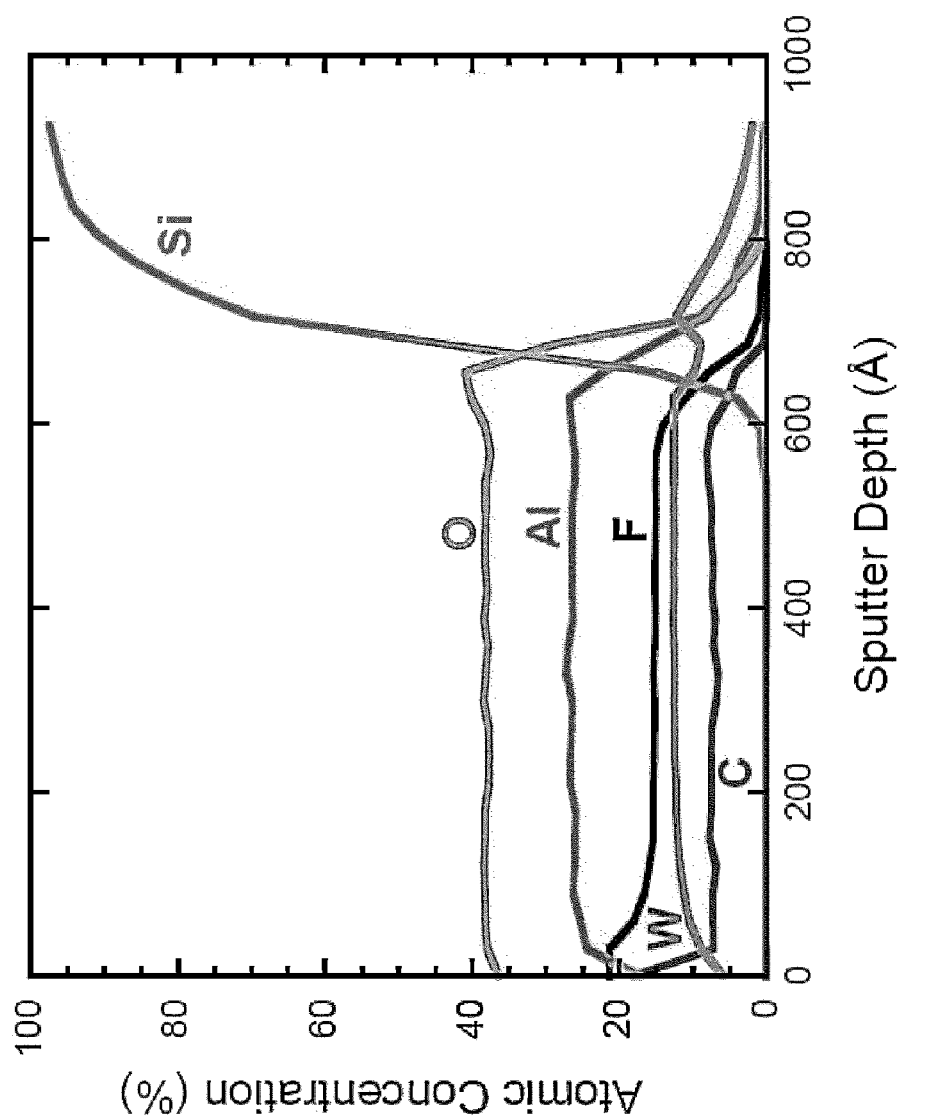
FIG. 47 shows a WCx-$Al_2O_3$ tunable resistance film and XPS depth profiling of the illustrated elements.
Figure 48:
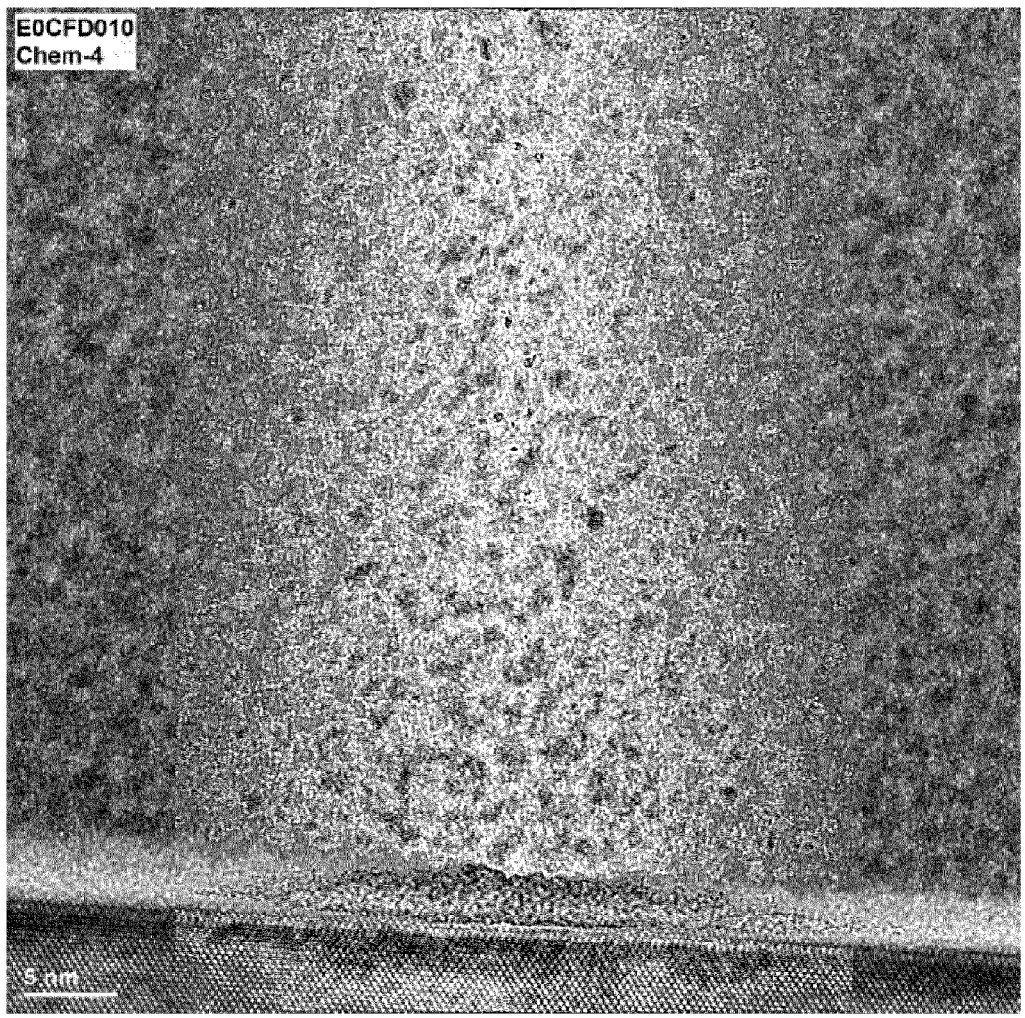
FIG. 48 shows a cross-sectional TEM micrograph of the film of FIG. 47.

A WCx:Al$_2$O$_3$ tunable resistance film was prepared using 500 ALD cycles with 33% WCx cycle percentage at 200° C. on a silicon substrate. As shown by the XPS depth profiling measurement in FIG. 47, the film is comprised of O, Al, F, W, and C. The enhanced C on the surface is from atmospheric exposure prior to the XPS analysis. FIG. 48 shows a cross-sectional transmission electron micrograph (TEM) of the same WCx:Al$_2$O$_3$ tunable resistance film. The bottom of the image shows the crystalline silicon substrate with the native SiO$_2$ layer intact. Above this is seen the WCx:Al$_2$O$_3$ tunable resistance coating which is comprised of discrete nanoparticles of ~1-2 nm in size (the dark spots in the film) surrounded by an amorphous matrix. Lattice fringes observed using higher magnification confirm that the nanoparticles are crystalline. The resistivity for this WCx:Al$_2$O$_3$ tunable resistance film was measured to be approximately 10$^{13}$ Ohm cm.

Yet another formulation for the tunable resistance coatings containing W is WN:Al$_2$O$_3$ where WN represents a material containing both W and nitrogen that results from alternating exposures to tungsten hexafluoride (WF$_6$) and ammonia (NH$_3$). Both W:Al$_2$O$_3$ films and WN:Al$_2$O$_3$ films were prepared under identical conditions on silicon and glass substrates using 500 ALD cycles with a W or WN cycle percentage of 33% at a deposition temperature of 200° C. using reactant exposure times of 1 s and purge times of 5 s. In both cases, the films were found to be uniform over the ~30 cm length of the ALD reactor. The thicknesses, refractive indices, and resistivities for these films are presented in Table 10.

TABLE 10

Al$_2$O$_3$ and WN:Al$_2$O$_3$ parameters

| | W:Al$_2$O$_3$ | WN:Al$_2$O$_3$ |
|---|---|---|
| Thickness (A) | 550 | 517 |
| Refractive index | 1.76 | 1.8 |
| Resistivity (Ωcm) | 2.1e7 | 1.3e7 |

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of tunably forming a film of selected resistance and thickness comprising:

performing at least one supercycle depositing a starting conducting material selected from the group of W, Mo, and their conducting compounds, and a starting insulating material, the supercycle comprising:

performing at least one starting conducting material deposition cycle with a first starting conducting material precursor;

performing a plurality of starting insulating material deposition cycles with a first starting insulating material precursor;

repeating the supercycle a prescribed number of times to achieve a film with the selected resistance and thickness for an end product;

controlling the film's electrical properties by varying an aspect selected from the group consisting of: (1) a ratio of starting conducting material deposition cycles to starting insulating material deposition cycles, (2) a number of consecutive starting conducting material deposition cycles within the supercycle, (3) an exposure time of the first starting conducting material precursor, (4) a partial pressure of the first starting conducting material precursor, (5) an order within the starting conducting material deposition cycle of deposition of the first starting conducting material precursor and a second starting conducting material precursor;

wherein the film of selected resistance and thickness is comprised of nano-sized particulates of the conducting material dispersed within a matrix of the insulating material.

2. The method as defined in claim 1 wherein the starting conducting material deposition cycle and the starting insulating material deposition cycle comprise using a deposition method selected from the group of ALD, CVD, MOCVD, OMCVD, PECVD, PVD, MBE, reactive sputtering, PLD and evaporation, or combinations thereof.

3. The method as defined in claim 1 wherein the starting conducting material deposition cycle and the starting insulating material deposition cycle comprise using ALD with (a) alternating exposures of $MoF_6$ as the first starting conducting material precursor and at least one of disilane, ammonia, or TMA for the film containing Mo as the conducting material; or alternating exposures of $WF_6$ as the first starting conducting material precursor and either disilane, ammonia, or TMA for the film containing W as the conducting material; and (b) the starting insulating material deposition cycle comprises alternating exposures of TMA as the first starting insulating material precursor and $H_2O$ for films containing $Al_2O_3$ as the insulating material.

4. The method as defined in claim 1 wherein the starting conducting material has a resistivity of about $10^{-5}$ to 10 Ωcm.

5. The method as defined in claim 1 wherein the starting insulating material has a resistivity of about $10^{-2}$ to $10^{14}$ Ωcm.

6. The method as defined in claim 1 wherein the number of consecutive starting conducting material deposition cycles is 1, 2, or 3.

7. The method as defined in claim 1 wherein the selected conducting material consists of conducting compounds of W or Mo that are substantially the nitrides or carbides of these metals.

8. The method as defined in claim 1 further including the step of forming a microchannel plate from the film of selected resistance.

9. The method of claim 1, wherein the aspect is an exposure time of the first starting conducting material precursor.

10. The method of claim 1, wherein the aspect is a partial pressure of the first starting conducting material precursor.

11. The method of claim 1, wherein the aspect is the order within the starting conducting material deposition cycle of deposition of the first starting conducting material precursor and a second starting conducting material precursor.

12. An article of manufacture, comprising;
a film of composite materials including at least two materials selected from the group of an insulating material and a conducting material selected from the group of Mo, W and their conducting compounds, and with a pre-selected tuned electrical resistance associated with a percentage of depositions of each of the insulating and the conducting materials and a pre-selected thickness associated with the total number of depositions, the film comprised of nano-sized particulates of the conducting material dispersed within a matrix of the insulating material.

13. The article of manufacture as defined in claim 12, wherein the anisotrophic film comprises consecutive layers of conducting material and consecutive layers of insulating material.

14. The article as defined in claim 13 wherein the consecutive composite material layers include nano-sized particulates of the conducting material disposed between a first set and a second set of consecutive layers of the insulating material.

15. The article as defined in claim 14 wherein the nano-sized particulates of conducting material consist essentially of at least one of W, Mo, and their conducting compounds.

16. The article of manufacture as defined in claim 12 wherein layers of the insulating and the conducting material are intermixed to form a structure unlike a bulk form for each of the materials.

17. The article of manufacture as defined in claim 16 wherein the intermixed structure comprises an amorphous structure.

18. A method of tunably forming a film of selected resistance and thickness comprising:
performing at least one cycle of conducting material deposition comprising:
depositing a fluoride precursor having a metallic element; and
depositing trimethyl aluminum;
performing at least one cycle of insulating material deposition; and
forming a plurality of discrete nanoparticles of the metallic element dispersed within a matrix of the insulating material.

19. The method of claim 18, wherein the fluoride precursor is a hexafluoride and the metallic element is selected from tungsten and molybdenum.

20. The method of claim 19, wherein the film comprises a conductive material consisting essentially of the metallic element and carbon.

21. The method of claim 18, further comprising, prior to depositing trimethyl aluminum ammonia is deposited and reacts with the fluoride precursor to form a metallic element and nitrogen layer in the film.

* * * * *